United States Patent
Nakamura et al.

(10) Patent No.: US 11,953,831 B2
(45) Date of Patent: Apr. 9, 2024

(54) PHOTOSENSITIVE COMPOSITION

(71) Applicant: FUJIFILM Corporation, Tokyo (JP)

(72) Inventors: Shoichi Nakamura, Shizuoka (JP);
Takahiro Okawara, Shizuoka (JP);
Yuki Nara, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 897 days.

(21) Appl. No.: 17/003,487

(22) Filed: Aug. 26, 2020

(65) Prior Publication Data

US 2020/0393759 A1 Dec. 17, 2020

Related U.S. Application Data

(63) Continuation of application No. PCT/JP2019/007157, filed on Feb. 26, 2019.

(30) Foreign Application Priority Data

Mar. 5, 2018 (JP) ................. 2018-038622

(51) Int. Cl.
| | |
|---|---|
| *G03F 7/031* | (2006.01) |
| *C08K 5/00* | (2006.01) |
| *C08K 5/3475* | (2006.01) |
| *C08L 33/14* | (2006.01) |
| *G03F 7/00* | (2006.01) |
| *G03F 7/008* | (2006.01) |

(52) U.S. Cl.
CPC ............ *G03F 7/031* (2013.01); *C08K 5/0041* (2013.01); *C08K 5/3475* (2013.01); *C08L 33/14* (2013.01); *G03F 7/0007* (2013.01); *G03F 7/0085* (2013.01); *G03F 7/70041* (2013.01); *C08L 2203/16* (2013.01)

(58) Field of Classification Search
CPC ....... G03F 7/031; G03F 7/0007; G03F 7/0085; G03F 7/70041; G03F 7/027; G03F 7/0388; G03F 7/0045; G03F 7/038; C08K 5/0041; C08K 5/3475; C08L 33/14; C08L 2203/16
See application file for complete search history.

(56) References Cited

U.S. PATENT DOCUMENTS

| | | | |
|---|---|---|---|
| 2012/0099214 A1 | 4/2012 | Lee et al. | |
| 2012/0202145 A1* | 8/2012 | Arayama | ............... G03F 7/027 430/7 |
| 2013/0028587 A1 | 1/2013 | Kaneko et al. | |
| 2017/0146904 A1 | 5/2017 | Samejima et al. | |
| 2019/0369497 A1 | 12/2019 | Mori et al. | |
| 2020/0239694 A1 | 7/2020 | Mizuno et al. | |

FOREIGN PATENT DOCUMENTS

| | | |
|---|---|---|
| CN | 102073216 A | 5/2011 |
| CN | 102236256 A | 11/2011 |
| CN | 110226129 A | 9/2019 |
| JP | 2008-165020 A | 7/2008 |
| JP | 2011-203506 A | 10/2011 |
| JP | 2012-181502 A | 9/2012 |
| JP | 2012-194516 A | 10/2012 |
| JP | 2012-532334 A | 12/2012 |
| JP | 2018-120028 A | 8/2018 |
| KR | 10-2012-0099347 A | 9/2012 |
| KR | 10-2013-0012951 A | 2/2013 |
| TW | 201222143 A1 | 6/2012 |
| WO | 2016035565 A1 | 3/2016 |
| WO | 2019/059075 A1 | 3/2019 |

OTHER PUBLICATIONS

International Search Report dated May 7, 2019 in International Application No. PCT/JP2019/007157.
Written Opinion of the International Searching Authority dated May 7, 2019 in International Application No. PCT/JP2019/007157.
International Preliminary Report on Patentability dated Sep. 8, 2020 in International Application No. PCT/JP2019/007157.
Office Action dated Jan. 20, 2023 in Chinese Application No. 201980015630.7.
Office Action dated Oct. 31, 2022 issued by the Taiwanese Patent Office in Taiwanese Application No. 108106599.
Office Action dated May 3, 2022, issued in Korean Application No. 10-2020-7024439.
Office Action dated Oct. 26, 2021 from the Japanese Patent Office in Japanese Application No. 2020-504935.

* cited by examiner

*Primary Examiner* — Stewart A Fraser
(74) *Attorney, Agent, or Firm* — Sughrue Mion, PLLC

(57) ABSTRACT

Provided are a photosensitive composition for pulse exposure including: a coloring material A; a photoradical polymerization initiator B; and a radically polymerizable compound C, in which a content of a radically polymerizable compound C1 having a weight-average molecular weight of 3000 or higher is 70 mass % or higher with respect to a total mass of the radically polymerizable compound C.

16 Claims, No Drawings

PHOTOSENSITIVE COMPOSITION

CROSS-REFERENCE TO RELATED APPLICATIONS

This application is a Continuation of PCT International Application No. PCT/JP2019/007157 filed on Feb. 26, 2019, which claims priority under 35 U.S.C § 119(a) to Japanese Patent Application No. 2018-038622 filed on Mar. 5, 2018. Each of the above application(s) is hereby expressly incorporated by reference, in its entirety, into the present application.

BACKGROUND OF THE INVENTION

1. Field of the Invention

The present invention relates to a photosensitive composition including a coloring material. More specifically, the present invention relates to a photosensitive composition used for a solid-state imaging element, a color filter, or the like.

2. Description of the Related Art

A digital camera, a mobile phone equipped with a camera, or the like has been widely used, and a demand for a solid-state imaging element such as a charge coupled device (CCD) image sensor has increased significantly. As a key device of a display or an optical element, a color filter is used. Typically, the color filter includes pixels (colored patterns) of three primary colors including red, green, and blue and has a function of separating transmitted light into three primary colors.

The color filter can be formed using a photosensitive composition including a coloring material. For example, JP2012-532334A describes a photosensitive composition for manufacturing a color filter for a solid-state imaging element using an ultra-short wavelength exposing device of 300 nm or less. In addition, JP2008-165020A describes that a color filter is manufactured using a photosensitive composition including at least a dispersion resin having an unsaturated double bond, a pigment, a photopolymerization initiator, and a solvent, in which a mass of the pigment is higher than 50 mass % and 95 mass % or lower with respect to a total mass of the solid content.

SUMMARY OF THE INVENTION

For a film that is formed using a photosensitive composition including a coloring material, it is desired that solvent resistance, moisture resistance, and thermal diffusivity resistance are excellent.

In addition, recently, in a color filter, the refinement of a pattern size has progressed. Therefore, in a photosensitive composition used for forming a color filter or the like, further improvement of photolithographic properties is desired.

Accordingly, an object of the present invention is to provide a photosensitive composition having excellent photolithographic properties with which a film having excellent solvent resistance, moisture resistance, and thermal diffusivity resistance can be formed.

As a result of thorough investigation on a photosensitive composition, the present inventors found that the above-described object can be achieved using a photosensitive composition described below, thereby completing the present invention. Accordingly, the present invention provides the following.

<1> A photosensitive composition for pulse exposure comprising:
a coloring material A;
a photoradical polymerization initiator B; and
a radically polymerizable compound C,
in which a content of a radically polymerizable compound C1 having a weight-average molecular weight of 3000 or higher is 70 mass % or higher with respect to a total mass of the radically polymerizable compound C.

<2> The photosensitive composition according to <1>, in which the coloring material A is a pigment.

<3> The photosensitive composition according to <1> or <2>, in which a content of the coloring material A is 50 mass % or higher with respect to a total solid content of the photosensitive composition.

<4> The photosensitive composition according to any one of <1> to <3>, in which a content of the photoradical polymerization initiator B is 2% to 10 mass % with respect to a total solid content of the photosensitive composition.

<5> The photosensitive composition according to any one of <1> to <4>, in which a total content of the coloring material A and the radically polymerizable compound C1 is 80 mass % or higher with respect to a total solid content of the photosensitive composition.

<6> The photosensitive composition according to any one of <1> to <5>, in which a content of the radically polymerizable compound C1 is 60 mass % or higher with respect to a total mass of compounds having a weight-average molecular weight of 3000 or higher in the photosensitive composition, the compounds excluding the coloring material A and the photoradical polymerization initiator B.

<7> The photosensitive composition according to any one of <1> to <6>, in which the radically polymerizable compound C1 has an acid group.

<8> The photosensitive composition according to <7>, in which an acid value of the radically polymerizable compound C1 is 30 to 150 mgKOH/g.

<9> The photosensitive composition according to any one of <1> to <8>, in which the radically polymerizable compound C1 includes a repeating unit having an ethylenically unsaturated bond group at a side chain.

<10> The photosensitive composition according to any one of <1> to <9>, in which the radically polymerizable compound C1 includes a repeating unit having an ethylenically unsaturated bond group at a side chain and a repeating unit having a graft chain.

<11> The photosensitive composition according to any one of <1> to <10>, in which an amount of an ethylenically unsaturated bond group in the radically polymerizable compound C1 is 0.2 to 3.0 mmol/g.

<12> The photosensitive composition according to any one of <1> to <11>, in which a weight-average molecular weight of the radically polymerizable compound C1 is 5000 to 40000.

<13> The photosensitive composition according to any one of <1> to <12>, in which the radically polymerizable compound C1 is a dispersant.

<14> The photosensitive composition according to any one of <1> to <13>,
in which the radically polymerizable compound C includes the radically polymerizable compound C1 and a radically polymerizable compound C2 having a molecular weight of lower than 3000, and
a content of the radically polymerizable compound C1 is 93% to 99.5 mass % with respect to a total content of the radically polymerizable compound C1 and the radically polymerizable compound C2.

<15> The photosensitive composition according to any one of <1> to <14>, which is a photosensitive composition for pulse exposure to light having a wavelength of 300 nm or shorter.

<16> The photosensitive composition according to any one of <1> to <15>, which is a photosensitive composition for pulse exposure under a condition of a maximum instantaneous illuminance of 50000000 $W/m^2$ or higher.

<17> The photosensitive composition according to any one of <1> to <16>, which is a photosensitive composition for a solid-state imaging element.

<18> The photosensitive composition according to any one of <1> to <17>, which is a photosensitive composition for a color filter.

According to an aspect of the present invention, it is possible to provide a photosensitive composition having excellent photolithographic properties with which a film having excellent solvent resistance, moisture resistance, and thermal diffusivity resistance can be formed.

DESCRIPTION OF THE PREFERRED EMBODIMENTS

Hereinafter, the details of the present invention will be described.

In this specification, numerical ranges represented by "to" include numerical values before and after "to" as lower limit values and upper limit values.

In this specification, unless specified as a substituted group or as an unsubstituted group, a group (atomic group) denotes not only a group (atomic group) having no substituent but also a group (atomic group) having a substituent. For example, "alkyl group" denotes not only an alkyl group having no substituent (unsubstituted alkyl group) but also an alkyl group having a substituent (substituted alkyl group).

In this specification, "(meth)allyl group" denotes either or both of allyl and methallyl, "(meth)acrylate" denotes either or both of acrylate or methacrylate, "(meth)acryl" denotes either or both of acryl and methacryl, and "(meth)acryloyl" denotes either or both of acryloyl and methacryloyl.

In this specification, a weight-average molecular weight and a number-average molecular weight denote values in terms of polystyrene measured by gel permeation chromatography (GPC).

In this specification, infrared light denotes light in a wavelength range of 700 to 2500 nm.

In this specification, a pigment denotes a compound that is insoluble in a solvent. For example, the pigment has a solubility of preferably 0.1 g or less and more preferably 0.01 g or less in 100 g of water at 23° C. and 100 g of propylene glycol monomethyl ether acetate at 23° C.

In this specification, a total solid content denotes the total mass of all the components of the composition excluding a solvent.

In this specification, the term "step" denotes not only an individual step but also a step which is not clearly distinguishable from another step as long as an effect expected from the step can be achieved.

<Photosensitive Composition>

A photosensitive composition for pulse exposure according to an embodiment of the present invention comprises: a coloring material A; a photoradical polymerization initiator B; and a radically polymerizable compound C, in which a content of a radically polymerizable compound C1 having a weight-average molecular weight of 3000 or higher is 70 mass % or higher with respect to a total mass of the radically polymerizable compound C.

By exposing the photosensitive composition according to the embodiment of the present invention to pulses of light, a large amount of a radical is instantaneously generated from the photoradical polymerization initiator B or the like in the exposed portion. A large amount of a radical is generated in the exposed portion such that a curable compound can be efficiently cured due to an effect of, for example, suppressing deactivation caused by oxygen. Therefore, only the exposed portion can be selectively cured, and a pattern can be formed in a mask shape. Therefore, in a case where the photosensitive composition according to the embodiment of the present invention is a photosensitive composition for pulse exposure, excellent photolithographic properties are exhibited. In addition, by instantaneously generating a large amount of a radical in the exposed portion, a polymerization reaction between the radically polymerizable compounds C can be efficiently performed, and the residual amount of an unreacted radically polymerizable compound can be reduced. In general, the reactivity of a radically polymerizable compound having a high molecular weight tends to be low. However, since a large amount of a radical can be instantaneously generated by pulse exposure in the exposed portion, even the radically polymerizable compound having a high molecular weight can be rapidly cured. In addition, in general, as the molecular weight of an unreacted radically polymerizable compound decreases, the radically polymerizable compound tends to be more easily dissolved in a solvent or the like. Therefore, as the residual amount of an unreacted radically polymerizable compound having a low molecular weight increases, solvent resistance or the like tends to more easily decrease. However, the radically polymerizable compound C included in the photosensitive composition according to the embodiment of the present invention includes 70 mass % or higher of the radically polymerizable compound C1 having a high molecular weight. Therefore, the residual amount of an unreacted radically polymerizable compound having a low molecular weight can be made extremely small. In addition, in the photosensitive composition, it is presumed that the coloring material A is present to be covered with the radically polymerizable compound C1 having a high molecular weight. It is presumed that the radically polymerizable compound C1 is cured in this state such that the coloring material A can be reliably held in the film. Therefore, in a case where the photosensitive composition according to the embodiment of the present invention is a photosensitive composition for pulse exposure, a film having excellent solvent resistance, moisture resistance, thermal diffusivity resistance, and the like can be formed. The pulse exposure refers to an exposure method in which light irradiation and rest are repeated in a cycle of a short period of time (for example, a level of milliseconds or lower).

The photosensitive composition according to the embodiment of the present invention is a photosensitive composition for pulse exposure. The light used for the exposure may be light having a wavelength of longer than 300 nm or light having a wavelength of 300 nm or shorter. From the viewpoint of easily obtaining more significant effects of the present invention, the light used for the exposure is preferably light having a wavelength of 300 nm or shorter, more preferably light having a wavelength of 270 nm or shorter, and still more preferably light having a wavelength of 250 nm or shorter. In addition, the above-described light is preferably light having a wavelength of 180 nm or longer. Specific examples of the light include a KrF ray (wavelength: 248 nm) and an ArF ray (wavelength: 193 nm). From the viewpoint of easily obtaining more significant effects of the present invention, a KrF ray (wavelength: 248 nm) is preferable.

It is preferable that the exposure condition of the pulse exposure is the following condition. From the viewpoint of instantaneously generating a large amount of a radical easily, the pulse duration is preferably 100 nanoseconds (ns) or shorter, more preferably 50 nanoseconds or shorter, and still more preferably 30 nanoseconds or shorter. The lower limit of the pulse duration is not particularly limited and may be 1 femtosecond (fs) or longer or 10 femtoseconds (fs) or longer. From the viewpoint of thermally polymerizing the radically polymerizable compound using exposure heat such that a film having excellent solvent resistance, moisture resistance, thermal diffusivity resistance, and the like can be easily formed, the frequency is preferably 1 kHz or higher, more preferably 2 kHz or higher, and still more preferably 4 kHz or higher. From the viewpoint of easily suppressing deformation of a substrate or the like caused by exposure heat, the upper limit of the frequency is preferably 50 kHz or lower, more preferably 20 kHz or lower, and still more preferably 10 kHz or lower. From the viewpoint of curing properties, the maximum instantaneous illuminance is preferably 50000000 W/m$^2$ or higher, more preferably 100000000 W/m$^2$ or higher, and still more preferably 200000000 W/m$^2$ or higher. In addition, from the viewpoint of high illuminance reciprocity failure, the upper limit of the maximum instantaneous illuminance is preferably 1000000000 W/m$^2$ or lower, more preferably 800000000 W/m$^2$ or lower, and still more preferably 500000000 W/m$^2$ or lower. The pulse duration refers to the length of time during which light is irradiated during a pulse period. In addition, the frequency refers to the number of pulse periods per second. In addition, the maximum instantaneous illuminance refers to an average illuminance within a time during which light is irradiated in a pulse period. In addition, the pulse period refers to a period in which light irradiation and rest during pulse exposure are set as one cycle.

The photosensitive composition according to the embodiment of the present invention is preferably used as a composition for forming a colored pixel, a black pixel, a light blocking film, a pixel of an infrared transmitting filter layer, or the like. Examples of the colored pixel include a pixel of a color selected from red, blue, green, cyan, magenta, or yellow. Examples of the pixel of the infrared transmitting filter layer include a pixel of a filter layer satisfying spectral characteristics in which a maximum value of a transmittance in a wavelength range of 400 to 640 nm is 20% or lower (preferably 15% or lower and more preferably 10% or lower) and a minimum value of a transmittance in a wavelength range of 1100 to 1300 nm is 70% or higher (preferably 75% or higher and more preferably 80% or higher). In addition, it is also preferable that the pixel of the infrared transmitting filter layer is a pixel of a filter layer satisfying any one of the following spectral characteristics (1) to (4).

(1): a pixel of a filter layer in which a maximum value of a transmittance in a wavelength range of 400 to 640 nm is 20% or lower (preferably 15% or lower and more preferably 10% or lower) and a minimum value of a transmittance in a wavelength range of 800 to 1300 nm is 70% or higher (preferably 75% or higher and more preferably 80% or higher).

(2): a pixel of a filter layer in which a maximum value of a transmittance in a wavelength range of 400 to 750 nm is 20% or lower (preferably 15% or lower and more preferably 10% or lower) and a minimum value of a transmittance in a wavelength range of 900 to 1300 nm is 70% or higher (preferably 75% or higher and more preferably 80% or higher).

(3): a pixel of a filter layer in which a maximum value of a transmittance in a wavelength range of 400 to 830 nm is 20% or lower (preferably 15% or lower and more preferably 10% or lower) and a minimum value of a transmittance in a wavelength range of 1000 to 1300 nm is 70% or higher (preferably 75% or higher and more preferably 80% or higher).

(4): a pixel of a filter layer in which a maximum value of a transmittance in a wavelength range of 400 to 950 nm is 20% or lower (preferably 15% or lower and more preferably 10% or lower) and a minimum value of a transmittance in a wavelength range of 1100 to 1300 nm is 70% or higher (preferably 75% or higher and more preferably 80% or higher).

In a case where the photosensitive composition according to the embodiment of the present invention is used as a composition for forming a pixel of an infrared transmitting filter layer, it is preferable that the photosensitive composition according to the embodiment of the present invention satisfies spectral characteristics in which a ratio Amin/Bmax of a minimum value Amin of an absorbance of the composition in a wavelength range of 400 to 640 nm to a maximum value Bmax of an absorbance of the composition in a wavelength range of 1100 to 1300 nm is 5 or higher. Amin/Bmax is more preferably 7.5 or higher, still more preferably 15 or higher, and still more preferably 30 or higher.

An absorbance $A\lambda$ at a wavelength $\lambda$ is defined by the following Expression (1).

$$A\lambda = -\log(T\lambda/100) \qquad (1)$$

$A\lambda$ represents the absorbance at the wavelength $\lambda$, and $T\lambda$ represents a transmittance (%) at the wavelength $\lambda$.

In the present invention, a value of the absorbance may be a value measured in the form of a solution or a value of a film which is formed using the photosensitive composition. In a case where the absorbance is measured in the form of the film, it is preferable that the absorbance is measured using a film that is formed by applying the photosensitive composition to a glass substrate using a method such as spin coating such that the thickness of the dried film is a predetermined value, and drying the applied composition using a hot plate at 100° C. for 120 seconds.

In a case where the photosensitive composition according to the embodiment of the present invention is used as a composition for forming a pixel of an infrared transmitting filter layer, it is more preferable that the photosensitive composition according to the embodiment of the present invention satisfies any one of the following spectral characteristics (11) to (14).

(11): A ratio Amin1/Bmax1 of a minimum value Amin1 of an absorbance of the photosensitive composition in a wavelength range of 400 to 640 nm to a maximum value Bmax1 of an absorbance of the photosensitive composition in a wavelength range of 800 to 1300 nm is 5 or higher, preferably 7.5 or higher, more preferably 15 or higher, and still more preferably 30 or higher. In this aspect, a film that can block light in a wavelength range of 400 to 640 nm and allows transmission of light having a wavelength of 720 nm or longer can be formed.

(12): A ratio Amin2/Bmax2 of a minimum value Amin2 of an absorbance of the photosensitive composition in a wavelength range of 400 to 750 nm to a maximum value Bmax2 of an absorbance of the photosensitive composition in a wavelength range of 900 to 1300 nm is 5 or higher, preferably 7.5 or higher, more preferably 15 or higher, and still more preferably 30 or higher. In this aspect, a film that can block light in a wavelength range of 400 to 750 nm and allows transmission of light having a wavelength of 850 nm or longer can be formed.

(13): A ratio Amin3/Bmax3 of a minimum value Amin3 of an absorbance of the photosensitive composition in a wavelength range of 400 to 850 nm to a maximum value Bmax3 of an absorbance of the photosensitive composition in a wavelength range of 1000 to 1300 nm is 5 or higher, preferably 7.5 or higher, more preferably 15 or higher, and still more preferably 30 or higher. In this aspect, a film that can block light in a wavelength range of 400 to 850 nm and allows transmission of light having a wavelength of 940 nm or longer can be formed.

(14): A ratio Amin4/Bmax4 of a minimum value Amin4 of an absorbance of the photosensitive composition in a wavelength range of 400 to 950 nm to a maximum value Bmax4 of an absorbance of the photosensitive composition in a wavelength range of 1100 to 1300 nm is 5 or higher, preferably 7.5 or higher, more preferably 15 or higher, and still more preferably 30 or higher. In this aspect, a film that can block light in a wavelength range of 400 to 950 nm and allows transmission of light having a wavelength of 1040 nm or longer can be formed.

The photosensitive composition according to the embodiment of the present invention can be preferably used as a photosensitive composition for a solid-state imaging element. In addition, the photosensitive composition according to the embodiment of the present invention can be preferably used as a photosensitive composition for a color filter. Specifically, the photosensitive composition according to the embodiment of the present invention can be preferably used as a photosensitive composition for forming a pixel of a color filter, and can be more preferably used as a photosensitive composition for forming a pixel of a color filter used in a solid-state imaging element.

Hereinafter, each of the components used in the photosensitive composition according to the embodiment of the present invention will be described.

<<Coloring Material A>>

The photosensitive composition according to the embodiment of the present invention includes the coloring material A (hereinafter, simply referred to as "coloring material"). Examples of the coloring material include a chromatic colorant, a black colorant, and an infrared absorbing colorant. It is preferable that the coloring material used in the photosensitive composition according to the embodiment of the present invention includes at least a chromatic colorant. In addition, it is preferable that the coloring material used in the photosensitive composition according to the embodiment of the present invention is a pigment. In this aspect, a film having excellent solvent resistance, moisture resistance, thermal diffusivity resistance, and the like can be easily obtained. In addition, in the present invention, a combination of a pigment and a dye may be used as the coloring material. In a case where a combination of a pigment and a dye is used, the content of the pigment is preferably 50 mass % or higher, more preferably 70 mass % or higher, and still more preferably 90 mass % or higher with respect to the total mass of the coloring material.

(Chromatic Colorant)

Examples of the chromatic colorant include a red colorant, a green colorant, a blue colorant, a yellow colorant, a violet colorant, and an orange colorant. As the chromatic colorant, a pigment or a dye may be used. It is preferable that the chromatic colorant is a pigment. An average particle size (r) of the pigment satisfies preferably 20 nm$\leq$r$\leq$300 nm, more preferably 25 nm$\leq$r$\leq$250 nm, and still more preferably 30 nm$\leq$r$\leq$200 nm. "Average particle size" described herein denotes the average particle size of secondary particles which are aggregates of primary particles of the pigment. In addition, regarding a particle size distribution of the secondary particles of the pigment (hereinafter, simply referred to as "particle size distribution") which can be used, secondary particles having a particle size of (average particle size$\pm$100) nm account for preferably 70 mass % or higher and more preferably 80 mass % or higher in the pigment.

It is preferable that the pigment used as the chromatic colorant is an organic pigment. Preferable examples of the organic pigment are as follows:

Color Index (C.I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214 (all of which are yellow pigments);

C.I. Pigment Orange 2, 5, 13, 16, 17:1, 31, 34, 36, 38, 43, 46, 48, 49, 51, 52, 55, 59, 60, 61, 62, 64, 71, and 73 (all of which are orange pigments);

C.I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279 (all of which are red pigments);

C.I. Pigment Green 7, 10, 36, 37, 58, 59, 62, and 63 (all of which are green pigments);

C.I. Pigment Violet 1, 19, 23, 27, 32, 37, and 42 (all of which are violet pigments); and C.I. Pigment Blue 1, 2, 15, 15:1, 15:2, 15:3, 15:4, 15:6, 16, 22, 60, 64, 66, 79, and 80 (all of which are blue pigments).

Among these organic pigments, one kind may be used alone, or two or more kinds may be used in combination.

In addition, as the yellow pigment, a metal azo pigment including at least one anion selected from an azo compound represented by the following Formula (I) or an azo compound having a tautomeric structure of the azo compound represented by Formula (I), two or more metal ions, and a melamine compound can be used.

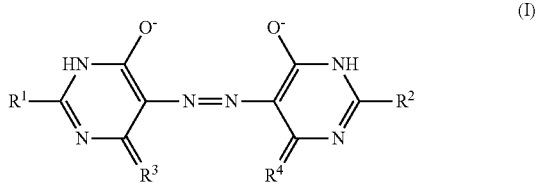

(I)

In the formula, $R^1$ and $R^2$ each independently represent OH or $NR^5R^6$, $R^3$ and $R^4$ each independently represent =O or =$NR^7$, and $R^5$ to $R^7$ each independently represent a hydrogen atom or an alkyl group. The number of carbon atoms in the alkyl group represented by $R^5$ to $R^7$ is preferably 1 to 10, more preferably 1 to 6, and still more preferably 1 to 4. The alkyl group may be linear, branched, or cyclic and is preferably linear or branched and more preferably linear. The alkyl group may have a substituent. As the substituent, a halogen atom, a hydroxy group, an alkoxy group, a cyano group, or an amino group is preferable.

In Formula (I), it is preferable that $R^1$ and $R^2$ represent OH. In addition, it is preferable that $R^3$ and $R^4$ represent O.

It is preferable that the melamine compound in the metal azo pigment is a compound represented by the following Formula (II).

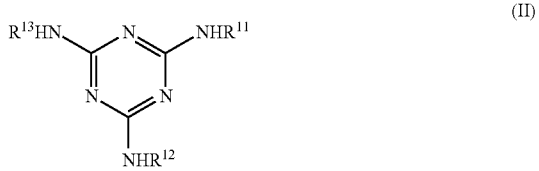

(II)

In the formula, $R^{11}$ to $R^{13}$ each independently represent a hydrogen atom or an alkyl group. The number of carbon atoms in the alkyl group is preferably 1 to 10, more preferably 1 to 6, and still more preferably 1 to 4. The alkyl group may be linear, branched, or cyclic and is preferably linear or branched and more preferably linear. The alkyl group may have a substituent. As the substituent, a hydroxy group is preferable. It is preferable that at least one of $R^{11}$, . . . , or $R^{13}$ represents a hydrogen atom, and it is more preferable that all of $R^{11}$ to $R^{13}$ represent a hydrogen atom.

It is preferable that the above-described metal azo pigment is a metal azo pigment according to an aspect including at least one anion selected from an azo compound represented by Formula (I) or an azo compound having a tautomeric structure of the azo compound represented by Formula (I), metal ions including at least $Zn^{2+}$ and $Cu^{2+}$, and a melamine compound. In this aspect, the total content of $Zn^{2+}$ and $Cu^{2+}$ is preferably 95 to 100 mol %, more preferably 98 to 100 mol %, still more preferably 99.9 to 100 mol %, and still more preferably 100 mol % with respect to 1 mol of all the metal ions of the metal azo pigment. In addition, a molar ratio $Zn^{2+}$:$Cu^{2+}$ of $Zn^{2+}$ to $Cu^{2+}$ in the metal azo pigment is preferably 199:1 to 1:15, more preferably 19:1 to 1:1, and still more preferably 9:1 to 2:1. In addition, in this aspect, the metal azo pigment may further include a divalent or trivalent metal ion (hereinafter, also referred to as "metal ion Mel") in addition to $Zn^{2+}$ and $Cu^{2+}$. Examples of the metal ion Mel include $Ni^{2+}$, $Al^{3+}$, $Fe^{2+}$, $Fe^{3+}$, $Co^{2+}$, $Co^{3+}$, $La^{3+}$, $Ce^{3+}$, $Pr^{3+}$, $Nd^{2+}$, $Nd^{3+}$, $Sm^{2+}$, $Sm^{3+}$, $Eu^{2+}$, $Eu^{3+}$, $Gd^{3+}$, $Tb^{3+}$, $Dy^{3+}$, $Ho^{3+}$, $Yb^{2+}$, $Yb^{3+}$, $Er^{3+}$, $Tm^{3+}$, $Mg^{2+}$, $Ca^{2+}$, $Sr^{2+}$, $Mn^{2+}$, $Y^{3+}$, $Sc^{3+}$, $Ti^{2+}$, $Ti^{3+}$, $Nb^{3+}$, $Mo^{2+}$, $Mo^{3+}$, $V^{2+}$, $V^{3+}$, $Zr^{2+}$, $Zr^{3+}$, $Cd^{2+}$, $Cr^{3+}$, $Pb^{2+}$, and $Ba^{2+}$. Among these, at least one selected from $Al^{3+}$, $Fe^{2+}$, $Fe^{3+}$, $Co^{2+}$, $Co^{3+}$, $La^{3+}$, $Ce^{3+}$, $Pr^{3+}$, $Nd^{3+}$, $Sm^{3+}$, $Eu^{3+}$, $Gd^{3+}$, $Tb^{3+}$, $Dy^{3+}$, $Ho^{3+}$, $Yb^{3+}$, $Er^{3+}$, $Tm^{3+}$, $Mg^{2+}$, $Ca^{2+}$, $Sr^{2+}$, $Mn^{2+}$, or $Y^{3+}$ is preferable, at least one selected from $Al^{3+}$, $Fe^{2+}$, $Fe^{3+}$, $Co^{2+}$, $Co^{3+}$, $La^{3+}$, $Ce^{3+}$, $Pr^{3+}$, $Nd^{3+}$, $Sm^{3+}$, $Tb^{3+}$, $Ho^{3+}$, or $Sr^{2+}$ is more preferable, and at least one selected from $Al^{3+}$, $Fe^{2+}$, $Fe^{3+}$, $Co^{2+}$, or $Co^{3+}$ is still more preferable. The content of the metal ion Mel is preferably 5 mol % or lower, more preferably 2 mol % or lower, and still more preferably 0.1 mol % or lower with respect to 1 mol of all the metal ions of the metal azo pigment.

The details of the metal azo pigment can be found in paragraphs "0011" to "0062" and "0137" to "0276" of JP2017-171912A, paragraphs "0010" to "0062" and "0138" to "0295" of JP2017-171913A, paragraphs "0011" to "0062" and "0139" to "0190" of JP2017-171914A, and paragraphs "0010" to "0065" and "0142" to "0222" of JP2017-171915A, the contents of which are incorporated herein by reference.

In addition, as the red pigment, a compound having a structure in which an aromatic ring group into which a group having an oxygen atom, a sulfur atom, or a nitrogen atom bonded to an aromatic ring is introduced is bonded to a diketo pyrrolo pyrrole skeleton can also be used. This compound is preferably a compound represented by Formula (DPP1) and more preferably a compound represented by Formula (DPP2).

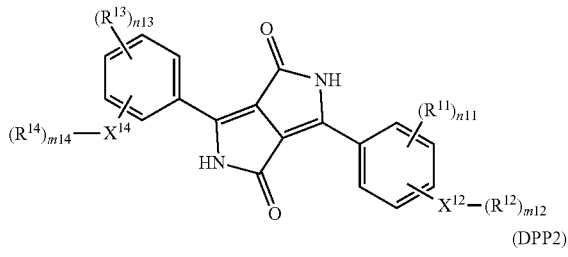

(DPP1)

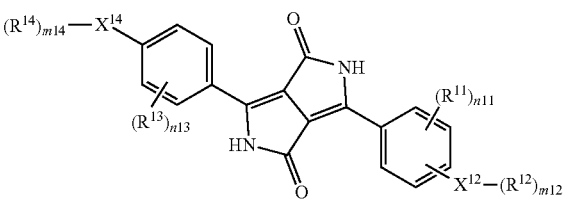

(DPP2)

In the formula, R11 and R13 each independently represent a substituent, $R^{12}$ and $R^{14}$ each independently represent a hydrogen atom, an alkyl group, an aryl group, or a heteroaryl group, n11 and n13 each independently represent an integer of 0 to 4, $X^{12}$ and $X^{14}$ each independently represent an oxygen atom, a sulfur atom, or a nitrogen atom, in a case where $X^{12}$ represents an oxygen atom or a sulfur atom, m12 represents 1, in a case where $X^{12}$ represents a nitrogen atom, m12 represents 2, in a case where $X^{14}$ represents an oxygen atom or a sulfur atom, m14 represents 1, and in a case where $X^{14}$ represents a nitrogen atom, m14 represents 2. Specific preferable example of the substituent represented by $R^{11}$ and $R^{13}$ include an alkyl group, an aryl group, a halogen atom, an acyl group, an alkoxycarbonyl group, an aryloxycarbonyl group, a heteroaryloxycarbonyl group, an amido group, a cyano group, a nitro group, a trifluoromethyl group, a sulfoxide group, and a sulfo group.

In addition, as a green pigment, a halogenated zinc phthalocyanine pigment having 10 to 14 halogen atoms, 8 to 12 bromine atoms, and 2 to 5 chlorine atoms in one molecule on average can also be used. Specific examples of the green colorant include a compound described in WO2015/118720A.

In addition, as a blue pigment, an aluminum phthalocyanine compound having a phosphorus atom can also be used. Specific examples of the blue colorant include a compound described in paragraphs "0022" to "0030" of JP2012-247591A and paragraph "0047" of JP2011-157478A.

As the dye, well-known dyes can be used without any particular limitation. Examples of the dye include a dye such as a pyrazole azo dye, an anilino azo dye, a triarylmethane dye, an anthraquinone dye, an anthrapyridone dye, a benzylidene dye, an oxonol dye, a pyrazolotriazole azo dye, a pyridone azo dye, a cyanine dye, a phenothiazine dye, a pyrrolopyrazole azomethine dye, a xanthene dye, a phthalocyanine dye, a benzopyran dye, an indigo dye, and a pyrromethene dye. In addition, a polymer of the above-described dyes may be used. In addition, dyes described in JP2015-028144A and JP2015-034966A can also be used.

(Black Colorant)

Examples of the black colorant include an inorganic black colorant such as carbon black, a metal oxynitride (for example, titanium black), or a metal nitride (for example, titanium nitride) and an organic black colorant such as a bisbenzofuranone compound, an azomethine compound, a perylene compound, or an azo compound. As the organic black colorant, a bisbenzofuranone compound or a perylene compound is preferable. Examples of the bisbenzofuranone compound include a compound described in JP2010-534726A, JP2012-515233A, and JP2012-515234A. For example, "Irgaphor Black" (manufactured by BASF SE) is available. Examples of the perylene compound include C.I. Pigment Black 31 and 32. Examples of the azomethine compound include compounds described in JP1989-170601A (JP-H1-170601A) and JP1990-034664A (JP-H2-034664A). For example, "CHROMOFINE BLACK A1103" (manufactured by Dainichiseika Color & Chemicals Mfg. Co., Ltd.) is available. It is preferable that the bisbenzofuranone compound is one of compounds represented by the following formulae or a mixture thereof.

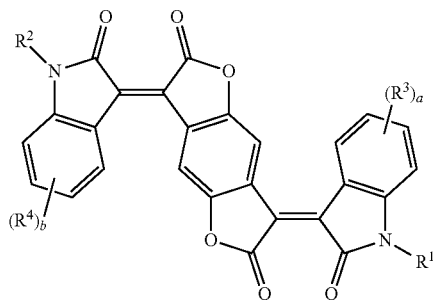

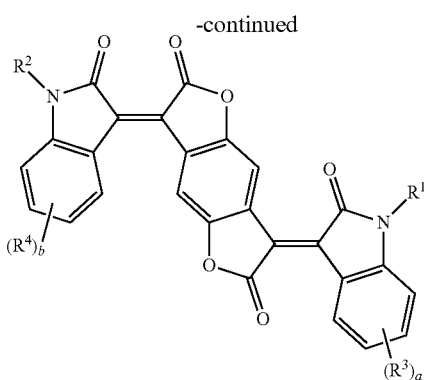

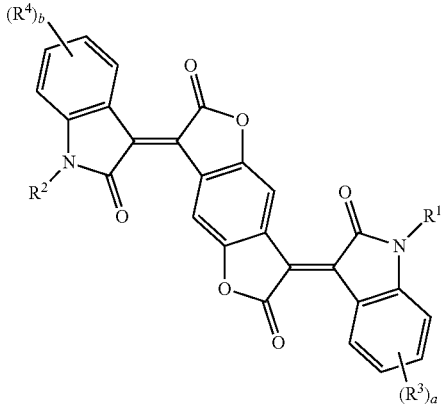

In the formulae, $R^1$ and $R^2$ each independently represent a hydrogen atom or a substituent, $R^3$ and $R^4$ each independently represent a substituent, a and b each independently represent an integer of 0 to 4, in a case where a is 2 or more, a plurality of $R^3$'s may be the same as or different from each other, a plurality of $R^3$'s may be bonded to each other to form a ring, in a case where b is 2 or more, a plurality of $R^4$'s may be the same as or different from each other, and a plurality of $R^4$'s may be bonded to each other to form a ring.

The substituent represented by $R^1$ to $R^4$ is a halogen atom, a cyano group, a nitro group, an alkyl group, an alkenyl group, an alkynyl group, an aralkyl group, an aryl group, a heteroaryl group, $-OR^{301}$, $-COR^{302}$, $-COOR^{303}$, $-OCOR^{304}$, $-NR^{305}R^{306}$, $-NHCOR^{307}$, $-CONR^{308}R^{309}$, $-NHCONR^{310}R^{311}$, $-NHCOOR^{312}$, $-SR^{313}$, $-SO_2R^{314}$, $-SO_2OR^{315}$, $-NHSO_2R^{316}$, or $-SO_2NR^{317}R^{318}$. $R^{301}$ to $R^{318}$ each independently represent a hydrogen atom, an alkyl group, an alkenyl group, an alkynyl group, an aryl group, or a heteroaryl group.

The details of the bisbenzofuranone compound can be found in paragraphs "0014" to "0037" of JP2010-534726A, the content of which is incorporated herein by reference.

(Infrared Absorbing Colorant)

As the infrared absorbing colorant, a compound having a maximum absorption wavelength preferably in a wavelength range of 700 to 1300 nm and more preferably in a wavelength range of 700 to 1000 nm is preferable. The infrared absorbing colorant may be a pigment or a dye.

In the present invention, as the infrared absorbing colorant, a compound that includes a π-conjugated plane having a monocyclic or fused aromatic ring can be preferably used. The number of atoms constituting the π-conjugated plane included in the infrared absorbing colorant other than hydrogen is preferably 14 or more, more preferably 20 or more, still more preferably 25 or more, and still more preferably 30 or more. For example, the upper limit is preferably 80 or less and more preferably 50 or less. The number of monocyclic or fused aromatic rings in the π-conjugated plane included in the infrared absorbing colorant is preferably 2 or more, more preferably 3 or more, still more preferably 4 or more, and still more preferably 5 or more. The upper limit is preferably 100 or less, more preferably 50 or less, and still more preferably 30 or less. Examples of the aromatic ring include a benzene ring, a naphthalene ring, a pentalene ring, an indene ring, an azulene ring, a heptalene ring, an indacene ring, a perylene ring, a pentacene ring, a quaterrylene ring, an acenaphthene ring, a phenanthrene ring, an anthracene ring, a naphthacene ring, a chrysene ring, a triphenylene ring, a fluorene ring, a pyridine ring, a quinoline ring, an isoquinoline ring, an imidazole ring, a benzimidazole ring, a pyrazole ring, a thiazole ring, a benzothiazole ring, a triazole ring, a benzotriazole ring, an oxazole ring, a benzoxazole ring, an imidazoline ring, a pyrazine ring, a quinoxaline ring, a pyrimidine ring, a quinazoline ring, a pyridazine ring, a triazine ring, a pyrrole ring, an indole ring, an isoindole ring, a carbazole ring, and a fused ring including the above-described ring.

As the infrared absorbing colorant, at least one selected from a pyrrolopyrrole compound, a cyanine compound, a squarylium compound, a phthalocyanine compound, a naphthalocyanine compound, a quaterrylene compound, a merocyanine compound, a croconium compound, an oxonol compound, a diimmonium compound, a dithiol compound, a triarylmethane compound, a pyrromethene compound, an azomethine compound, an anthraquinone compound, or a dibenzofuranone compound is preferable, at least one selected from a pyrrolopyrrole compound, a cyanine compound, a squarylium compound, a phthalocyanine compound, a naphthalocyanine compound, or a diimmonium compound is more preferable, at least one selected from a pyrrolopyrrole compound, a cyanine compound, a squarylium compound is still more preferable, and a pyrrolopyrrole compound is still more preferable.

Examples of the pyrrolopyrrole compound include compounds described in paragraphs "0016" to "0058" of JP2009-263614A, compounds described in paragraphs "0037" to "0052" of JP2011-068731A, compounds described in paragraphs "0010" to "0033" of WO2015/166873A, the contents of which are incorporated herein by reference.

Examples of the squarylium compound include a compound described in paragraphs "0044" to "0049" of JP2011-208101A, a compound described in paragraphs "0060" and "0061" of JP6065169B, a compound described in paragraph "0040" of WO2016/181987A, a compound described in WO2013/133099A, a compound described in WO2014/088063A, a compound described in JP2014-126642A, a compound described in JP2016-146619A, a compound described in JP2015-176046A, a compound described in JP2017-025311A, a compound described in WO2016/154782A, a compound described in JP5884953B, a compound described in JP6036689B, a compound described in JP5810604B, and a compound described in JP2017-068120A, the contents of which are incorporated herein by reference.

In addition, examples of the cyanine compound include a compound described in paragraphs "0044" and "0045" of JP2009-108267A, a compound described in paragraphs "0026" to "0030" of JP2002-194040, a compound described in JP2015-172004A, a compound described in JP2015-172102A, a compound described in JP2008-088426A, and a compound described in JP2017-031394A, the contents of which are incorporated herein by reference.

Examples of the diimmonium compound include a compound described in JP2008-528706A, the content of which is incorporated herein by reference. Examples of the phthalocyanine compound include a compound described in paragraph "0093" of JP2012-077153A, oxytitaniumphthalocyanine described in JP2006-343631A, and a compound described in paragraphs "0013" to "0029" of JP2013-195480A, the contents of which are incorporated herein by reference. Examples of the naphthalocyanine compound include a compound described in paragraph "0093" of JP2012-077153A, the content of which is incorporated herein by reference.

In the present invention, as the infrared absorbing colorant, a commercially available product can also be used. Examples of the commercially available product include SDO-C33 (manufactured by Arimoto Chemical Co., Ltd.); EXCOLOR IR-14, EXCOLOR IR-10A, EXCOLOR TX-EX-801B, and EXCOLOR TX-EX-805K (manufactured by Nippon Shokubai Co., Ltd.); Shigenox NIA-8041, Shigenox NIA-8042, Shigenox NIA-814, Shigenox NIA-820, and Shigenox NIA-839 (manufactured by Hakkol Chemical Co., Ltd.); Epolite V-63, Epolight 3801, and Epolight3036 (manufactured by Epolin Inc.); PRO-JET 825LDI (manufactured by Fujifilm Corporation); NK-3027 and NK-5060 (manufactured by Hayashibara Co., Ltd.); and YKR-3070 (manufactured by Mitsui Chemicals, Inc.).

From the viewpoint of easily obtaining a thin film having excellent spectral characteristics, the content of the coloring material is preferably 50 mass % or higher, more preferably 55 mass % or higher, still more preferably 60 mass % or higher, and still more preferably 65 mass % or higher with respect to the total solid content of the photosensitive composition. The upper limit is preferably 80 mass % or lower, and more preferably 75 mass % or lower.

It is preferable that the coloring material used in the photosensitive composition according to the embodiment of the present invention includes at least one selected from a chromatic colorant or a black colorant, and it is more preferable that the coloring material includes a chromatic colorant. In addition, the content of the chromatic colorant and the black colorant is preferably 30 mass % or higher, more preferably 50 mass % or higher, and still more preferably 70 mass % or higher with respect to the total mass of the coloring material. The upper limit may be 100 mass % or may be 90 mass % or lower.

In addition, it is preferable that the coloring material used in the photosensitive composition according to the embodiment of the present invention includes at least a green colorant (preferably a green pigment). In addition, the content of the green colorant (preferably the green pigment) is preferably 30 mass % or higher, more preferably 40 mass % or higher, and still more preferably 50 mass % or higher with respect to the total mass of the coloring material. The upper limit may be 100 mass % or may be 80 mass % or lower.

In a case where the photosensitive composition according to the embodiment of the present invention is used as a composition for forming a colored pixel, the content of the chromatic colorant is preferably 40 mass % or higher, more preferably 50 mass % or higher, still more preferably 55 mass % or higher, and still more preferably 60 mass % or higher with respect to the total solid content of the photosensitive composition. In addition, the content of the chromatic colorant is preferably 25 mass % or higher, more preferably 45 mass % or higher, and still more preferably 65 mass % or higher with respect to the total mass of the coloring material. The upper limit may be 100 mass % or may be 75 mass % or lower. In addition, it is preferable that the coloring material includes at least a green colorant. In addition, the content of the green colorant is preferably 35 mass % or higher, more preferably 45 mass % or higher, and still more preferably 55 mass % or higher with respect to the total mass of the coloring material. The upper limit may be 100 mass % or may be 80 mass % or lower.

In a case where the photosensitive composition according to the embodiment of the present invention is used as a composition for forming a black pixel or a light blocking film, the content of the black colorant (preferably the inorganic black colorant) is preferably 40 mass % or higher, more preferably 50 mass % or higher, still more preferably 55 mass % or higher, and still more preferably 60 mass % or higher with respect to the total solid content of the photosensitive composition. In addition, the content of the black colorant is preferably 30 mass % or higher, more preferably 50 mass % or higher, and still more preferably 70 mass % or higher with respect to the total mass of the coloring material. The upper limit may be 100 mass % or may be 90 mass % or lower.

In a case where the photosensitive composition according to the embodiment of the present invention is used as a composition for forming a pixel of an infrared transmitting filter layer, it is preferable that the coloring material used in the present invention satisfies at least one of the following requirements (1) to (3).

(1): The coloring material that blocks visible light includes two or more chromatic colorants, and a combination of the two or more chromatic colorants forms black. That is, it is preferable that the coloring material forms black using a combination of two or more colorants selected from a red colorant, a blue colorant, a yellow colorant, a violet colorant, and a green colorant.

(2): The coloring material includes an organic black colorant.

(3): In (1) or (2), the coloring material further includes an infrared absorbing colorant.

Examples of a preferable combination in the aspect (1) are as follows.

(1-1) An aspect in which the coloring material includes a red colorant and a blue colorant.

(1-2) An aspect in which the coloring material includes a red colorant, a blue colorant, and a yellow colorant.

(1-3) An aspect in which the coloring material includes a red colorant, a blue colorant, a yellow colorant, and a violet colorant.

(1-4) An aspect in which the coloring material includes a red colorant, a blue colorant, a yellow colorant, a violet colorant, and a green colorant.

(1-5) An aspect in which the coloring material includes a red colorant, a blue colorant, a yellow colorant, and a green colorant.

(1-6) An aspect in which the coloring material includes a red colorant, a blue colorant, and a green colorant.

(1-7) An aspect in which the coloring material includes a yellow colorant and a violet colorant.

In the aspect (2), it is preferable that the coloring material further includes a chromatic colorant. By using the organic black colorant in combination with a chromatic colorant, excellent spectral characteristics are likely to be obtained. Examples of the chromatic colorant which can be used in combination with the organic black colorant include a red colorant, a blue colorant, and a violet colorant. Among these, a red colorant or a blue colorant is preferable. Among these colorants, one kind may be used alone, or two or more kinds may be used in combination. In addition, regarding a mixing ratio between the chromatic colorant and the organic black colorant, the amount of the chromatic colorant is preferably 10 to 200 parts by mass and more preferably 15 to 150 parts by mass with respect to 100 parts by mass of the organic black colorant.

In the aspect (3), the content of the infrared absorbing colorant is preferably 5 to 40 mass % with respect to the total mass of the coloring material. The upper limit is preferably 30 mass % or lower and more preferably 25 mass % or lower. The lower limit is preferably 10 mass % or higher and more preferably 15 mass % or higher.

<<Photoradical Polymerization Initiator B>>

The photosensitive composition according to the embodiment of the present invention includes the photoradical polymerization initiator B. It is preferable that the photoradical polymerization initiator B is a compound that reacts with light having a wavelength of 300 nm or shorter to generate a radical.

It is also preferable that the photoradical polymerization initiator B is a compound that is likely to cause two-photon absorption to occur. The two-photon absorption refers to an excitation process of simultaneously absorbing two photons.

It is preferable that the photoradical polymerization initiator B is at least one compound selected from an alkylphenone compound, an acylphosphine compound, a benzophenone compound, a thioxanthone compound, a triazine compound, or an oxime compound, and it is more preferable that the photoradical polymerization initiator B is an oxime compound.

Examples of the alkylphenone compound include a benzyldimethylketal compound, α-hydroxyalkylphenone compound, and an α-aminoalkylphenone compound.

Examples of the benzyldimethylketal compound include 2,2-dimethoxy-2-phenylacetophenone. Examples of a commercially available product include IRGACURE-651 (manufactured by BASF SE).

Examples of the α-hydroxyalkylphenone compound include 1-hydroxy-cyclohexyl-phenyl-ketone, 2-hydroxy-2-methyl-1-phenyl-propane-1-one, 1-[4-(2-hydroxyethoxy)-phenyl]-2-hydroxy-2-methyl-1-propane-1-one, and 2-hydroxy-1-{4-[4-(2-hydroxy-2-methyl-propionyl)-benzyl]phenyl}-2-methyl-propane-1-one. Examples of a commercially available product of the α-hydroxyalkylphenone compound include IRGACURE-184, DAROCUR-1173, IRGACURE-500, IRGACURE-2959, and IRGACURE-127 (all of which are manufactured by BASF SE).

Examples of the α-aminoalkylphenone compound include 2-methyl-1-(4-methylthiophenyl)-2-morpholinopropan-1-one, 2-benzyl-2-dimethylamino-1-(4-morpholinophenyl)-1-butanone, and 2-dimethylamino-2-[(4-methylphenyl)methyl]-1-[4-(4-morpholinyl)phenyl]-1-butanone. Examples of a commercially available product of the α-aminoalkylphenone compound include IRGACURE-907, IRGACURE-369, and IRGACURE-379 (all of which are manufactured by BASF SE).

Examples of the acylphosphine compound include 2,4,6-trimethylbenzoyl-diphenyl-phosphine oxide and bis(2,4,6-trimethylbenzoyl)-phenylphosphine oxide. Examples of a commercially available product of the acylphosphine compound include IRGACURE-819 and IRGACURE-TPO (all of which are manufactured by BASF SE).

Examples of the benzophenone compound include benzophenone, methyl o-benzoylbenzoate, 4-phenylbenzophenone, 4-benzoyl-4'-methyldiphenyl sulfide, 3,3',4,4'-tetra(t-butyl peroxy carbonyl)benzophenone, and 2,4,6'-trimethyl benzophenone.

Examples of the thioxanthone compound include 2-isopropylthioxanthone, 4-isopropylthioxanthone, 2,4-diethylthioxanthone, 2,4-dichlorothioxanthone, and 1-chloro-4-propoxythioxanthone.

Examples of the triazine compound include 2,4-bis(trichloromethyl)-6-(4-methoxyphenyl)-1,3,5-triazine, 2,4-bis(trichloromethyl)-6-(4-methoxynaphthyl)-1,3,5-triazine, 2,4-bis(trichloromethyl)-6-piperonyl-1,3,5-triazine, 2,4-bis(trichloromethyl)-6-(4-methoxyscrew)-1,3,5-triazine, 2,4-bis(trichloromethyl)-6-[2-(5-methylfuran-2-yl)ethenyl]-1,3,5-triazine, 2,4-bis(trichloromethyl)-6-[2-(furan-2-yl)ethenyl]-1,3,5-triazine, 2,4-bis(trichloromethyl)-6-[2-(4-di ethylamino-2-methyl phenyl)ethenyl]-1,3,5-triazine, and 2,4-bis(trichloromethyl)-6-[2-(3,4-dimethoxyphenyl)ethenyl]-1,3,5-triazine.

Examples of the oxime compound include a compound described in JP2001-233842A, a compound described in JP2000-080068A, a compound described in JP2006-342166A, a compound described in J. C. S. Perkin II (1979, pp. 1653 to 1660), a compound described in J. C. S. Perkin II (1979, pp. 156 to 162), a compound described in Journal of Photopolymer Science and Technology (1995, pp. 202 to 232), a compound described in JP2000-066385A, a compound described in JP2000-080068A, a compound described in JP2004-534797A, a compound described in JP2006-342166A, a compound described in JP2017-019766A, a compound described in JP6065596B, a compound described in WO2015/152153A, and a compound described in WO2017/051680A. Specific examples of the oxime compound include 3-benzoyloxyiminobutane-2-one, 3-acetoxyiminobutane-2-one, 3-propionyloxyiminobutane-2-one, 2-acetoxyiminopentane-3-one, 2-acetoxyimino-1-phenylpropane-1-one, 2-benzoyloxyimino-1-phenylpropane-1-one, 3-(4-toluene sulfonyloxy)iminobutane-2-one, and 2-ethoxycarbonyloxyimino-1-phenylpropane-1-one. Examples of a commercially available product of the oxime compound include IRGACURE-OXE01, IRGACURE-OXE02, IRGACURE-OXE03, or IRGACURE-OXE04 (all of which are manufactured by BASF SE), TR-PBG-304 (manufactured by Changzhou Tronly New Electronic Materials Co., Ltd.), and ADEKA OPTOMER N-1919 (manufactured by Adeka Corporation, a photopolymerization initiator 2 described in JP2012-014052A). As the oxime compound, a compound having no colorability or a compound having high transparency that is not likely to discolor other components can also be preferably used. Examples of a commercially available product of the oxime compound include ADEKA ARKLS NCI-730, NCI-831, and NCI-930 (all of which are manufactured by Adeka Corporation).

In the present invention, it is also preferable that an oxime compound having a fluorine atom is used as the photoradical polymerization initiator B. It is preferable that the oxime compound having a fluorine atom is a group having a fluorine atom. As the group having a fluorine atom, an alkyl group having a fluorine atom (hereinafter, also referred to as "fluorine-containing alkyl group") and a group (hereinafter, also referred to as "fluorine-containing group") which contains an alkyl group having a fluorine atom is preferable. As the fluorine-containing group, at least one group selected from the group consisting of —$OR^{F1}$, —$SR^{F1}$, —$COR^{F1}$, —$COOR^{F1}$, —$OCOR^{F1}$, —$NR^{F1}R^{F2}$, —$NHCOR^{F1}$, —$CONR^{F1}R^{F2}$, —$NHCONR^{F1}R^{F1}$, —$NHCOOR^{F1}$, —$SO_2R^{F1}$, —$SO_2OR^{F1}$, and —$NHSO_2R^{F1}$ is preferable. $R^{F1}$ represents a fluorine-containing alkyl group, and $R^{F2}$ represents a hydrogen atom, an alkyl group, a fluorine-containing alkyl group, an aryl group, or a heterocyclic group. As the fluorine-containing group, —$OR^{F1}$ is preferable.

The number of carbon atoms in the alkyl group and the fluorine-containing alkyl group is preferably 1 to 20, more preferably 1 to 15, still more preferably 1 to 10, and still more preferably 1 to 4. The alkyl group and the fluorine-containing alkyl group may be linear, branched, or cyclic and is preferably linear or branched. The substitution ratio of fluorine atoms in the fluorine-containing alkyl group is preferably 40% to 100%, more preferably 50% to 100%, and still more preferably 60 to 100%. The substitution ratio with fluorine atoms denotes a ratio (%) of the number of hydrogen atoms substituted with fluorine atoms to the total number of hydrogen atoms in the alkyl group.

The number of carbon atoms in the aryl group is preferably 6 to 20, more preferably 6 to 15, and still more preferably 6 to 10.

It is preferable that the heterocyclic group is a 5- or 6-membered ring. The heterocyclic group may be a monocyclic or fused ring. The number of rings composing the fused ring is preferably 2 to 8, more preferably 2 to 6, still more preferably 3 to 5, and still more preferably 3 or 4. The number of carbon atoms constituting the heterocyclic group is preferably 3 to 40, more preferably 3 to 30, and still more preferably 3 to 20. The number of heteroatoms constituting the heterocyclic group is preferably 1 to 3. The heteroatoms constituting the heterocyclic group are preferably a nitrogen atom, an oxygen atom, or a sulfur atom and more preferably a nitrogen atom.

It is preferable that the group having a fluorine atom has a terminal structure represented by Formula (1) or (2). In the formula, * represents a direct bond.

*—$CHF_2$     (1)

*—$CF_3$     (2)

The total number of fluorine atoms in the oxime compound having a fluorine atom is preferably 3 or more and more preferably 4 to 10.

As the oxime compound having a fluorine atom, a compound represented by the following Formula (OX-1) is preferable.

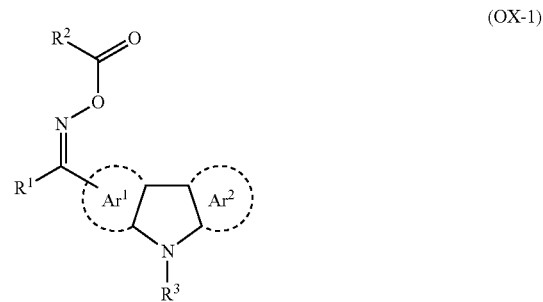

(OX-1)

In Formula (OX-1), $Ar^1$ and $Ar^2$ each independently represent an aromatic hydrocarbon ring which may have a substituent, $R^1$ represents an aryl group which has a group having a fluorine atom, and $R^2$ and $R^3$ each independently represent an alkyl group or an aryl group.

$Ar^1$ and $Ar^2$ each independently represent an aromatic hydrocarbon ring which may have a substituent. The aromatic hydrocarbon ring may be a monocyclic or fused ring.

The number of carbon atoms constituting the aromatic hydrocarbon ring is preferably 6 to 20, more preferably 6 to 15, and still more preferably 6 to 10. As the aromatic hydrocarbon ring, a benzene ring or a naphthalene ring is preferable. In particular, it is preferable that at least one of $Ar^1$ or $Ar^2$ represents a benzene ring, and it is more preferable that $Ar^1$ represents a benzene ring. $Ar^2$ represents preferably a benzene ring or a naphthalene ring, and more preferably a naphthalene ring.

Examples of the substituent which may be included in $Ar^1$ and $Ar^2$ include an alkyl group, an aryl group, a heterocyclic group, a nitro group, a cyano group, a halogen atom, —$OR^{X1}$, —$SR^{X1}$, —$COR^{X1}$, —$COOR^{X1}$, —$OCOR^{X1}$, —$NR^{X1}R^{X2}$, —$NHCOR^{X1}$, —$CONR^{X1}R^{X2}$, —$NHCONR^{X1}R^{X2}$, —$NHCOOR^{X1}$, —$SO_2R^{X1}$, —$SO_2OR^{X1}$, and —$NHSO_2R^{X1}$. $R^{X1}$ and $R^{X2}$ each independently represent a hydrogen atom, an alkyl group, an aryl group, or a heterocyclic group.

Examples of the halogen atom include a fluorine atom, a chlorine atom, a bromine atom, and an iodine atom. In particular, a fluorine atom is preferable. The number of carbon atoms in the alkyl group as the substituent and the alkyl group represented by $R^{X1}$ and $R^{X2}$ is preferably 1 to 30. The alkyl group may be linear, branched, or cyclic and is preferably linear or branched. A portion or all of the hydrogen atoms in the alkyl group may be substituted with halogen atoms (preferably fluorine atoms). In addition, a portion or all of the hydrogen atoms in the alkyl group may be substituted with the above-described substituent. The number of carbon atoms in the aryl group as the substituent and the aryl group represented by $R^{X1}$ and $R^{X2}$ is preferably 6 to 20, more preferably 6 to 15, and still more preferably 6 to 10. The aryl group may be a monocyclic or fused ring. In addition, a portion or all of the hydrogen atoms in the aryl group may be substituted with the above-described substituent. The heterocyclic group as the substituent and the heterocyclic group represented by $R^{X1}$ and $R^{X2}$ are preferably a 5- or 6-membered ring. The heterocyclic group may be a monocyclic or fused ring. The number of carbon atoms constituting the heterocyclic group is preferably 3 to 30, more preferably 3 to 18, and still more preferably 3 to 12. The number of heteroatoms constituting the heterocyclic group is preferably 1 to 3. It is preferable that the heteroatoms constituting the heterocyclic group are a nitrogen atom, an oxygen atom, or a sulfur atom. In addition, a portion or all of the hydrogen atoms in the heterocyclic group may be substituted with the above-described substituent.

It is preferable that the aromatic hydrocarbon ring represented by $Ar^1$ is unsubstituted. The aromatic hydrocarbon ring represented by $Ar^2$ may be unsubstituted or may have a substituent. It is preferable that the aromatic hydrocarbon ring has a substituent. As the substituent, —$COR^{X1}$ is preferable. $R^{X1}$ represents preferably an alkyl group, an aryl group, or a heterocyclic group, and more preferably an aryl group. The aryl group may have a substituent or may be unsubstituted. Examples of the substituent include an alkyl group having 1 to 10 carbon atoms.

$R^1$ represents an aryl group which has a group having a fluorine atom. The number of carbon atoms in the aryl group is preferably 6 to 20, more preferably 6 to 15, and still more preferably 6 to 10. As the group having a fluorine atom, an alkyl group having a fluorine atom (fluorine-containing alkyl group), or a group (fluorine-containing group) which contains an alkyl group having a fluorine atom is preferable. The group having a fluorine atom has the same definition and the same preferable range as described above.

$R^2$ represents an alkyl group or an aryl group and preferably an alkyl group. The alkyl group and the aryl group may be unsubstituted or may have a substituent. Examples of the substituent include the substituents which may be included in $Ar^1$ and $Ar^2$. The number of carbon atoms in the alkyl group is preferably 1 to 20, more preferably 1 to 15, still more preferably 1 to 10, and still more preferably 1 or 4. The alkyl group may be linear, branched, or cyclic and is preferably linear or branched. The number of carbon atoms in the aryl group is preferably 6 to 20, more preferably 6 to 15, and still more preferably 6 to 10.

$R^3$ represents an alkyl group or an aryl group and preferably an alkyl group. The alkyl group and the aryl group may be unsubstituted or may have a substituent. Examples of the substituent include the substituents which may be included in $Ar^1$ and $Ar^2$. The number of carbon atoms in the alkyl group represented by $R^3$ is preferably 1 to 20, more preferably 1 to 15, and still more preferably 1 to 10. The alkyl group may be linear, branched, or cyclic and is preferably linear or branched. The number of carbon atoms in the aryl group represented by $R^3$ is preferably 6 to 20, more preferably 6 to 15, and still more preferably 6 to 10.

Specific examples of the oxime compound having a fluorine atom include a compound described in JP2010-262028A, Compound 24 and 36 to 40 described in JP2014-500852A, and Compound (C-3) described in JP2013-164471A.

In the present invention, it is preferable that an oxime compound having a fluorene ring is used as the photoradical polymerization initiator B. Specific examples of the oxime compound having a fluorene ring include a compound described in JP2014-137466A. The content of this specification is incorporated herein by reference.

In the present invention, it is preferable that an oxime compound having a nitro group is used as the photoradical polymerization initiator B. It is also preferable that the oxime compound having a nitro group is used as a dimer. Specific examples of the oxime compound having a nitro group include compounds described in paragraphs "0031" to "0047" of JP2013-114249A and paragraphs "0008" to "0012" and "0070" to "0079" of JP2014-137466A, compounds described in paragraphs "0007" to 0025" of JP4223071B, and ADEKA ARKLS NCI-831 (manufactured by Adeka Corporation).

In the present invention, it is also preferable that an oxime compound having a benzofuran skeleton is used as the photoradical polymerization initiator B. Specific examples include OE-01 to OE-75 described in WO2015/036910A.

Hereinafter, specific examples of the oxime compound which are preferably used in the present invention are shown below, but the present invention is not limited thereto.

(C-1)

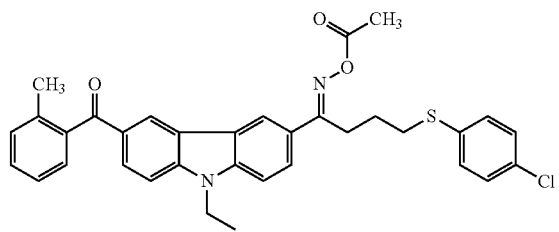

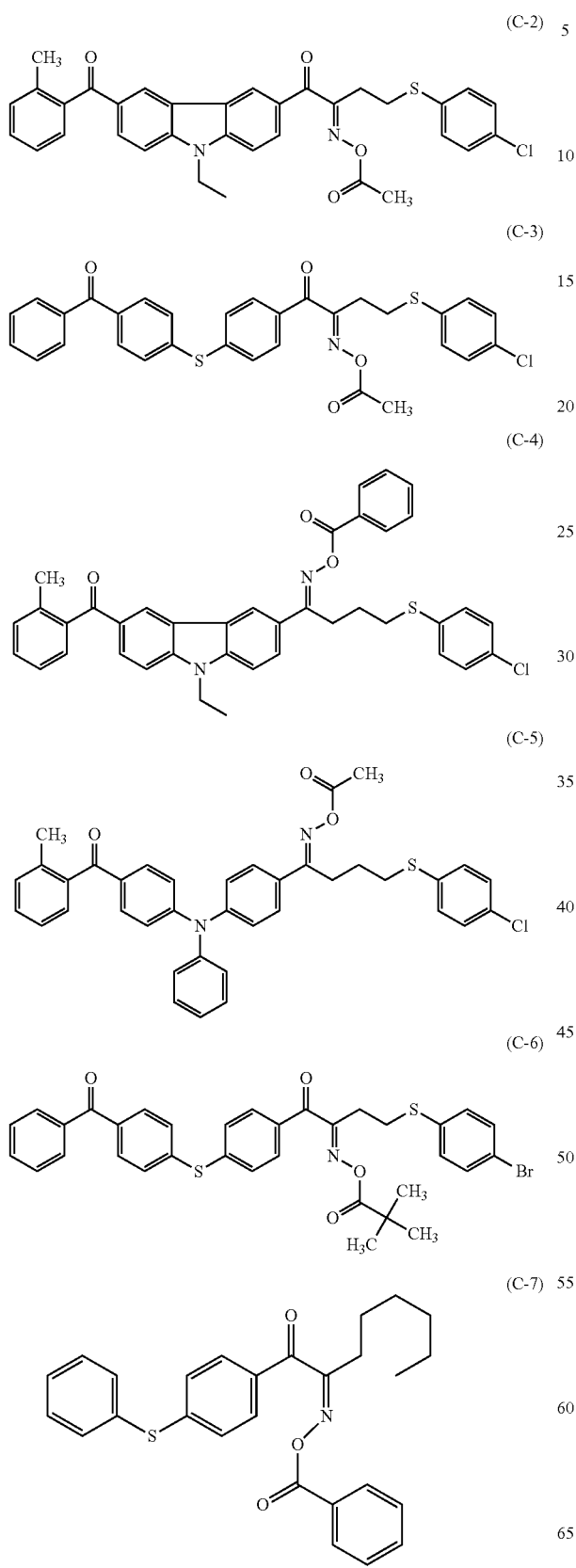
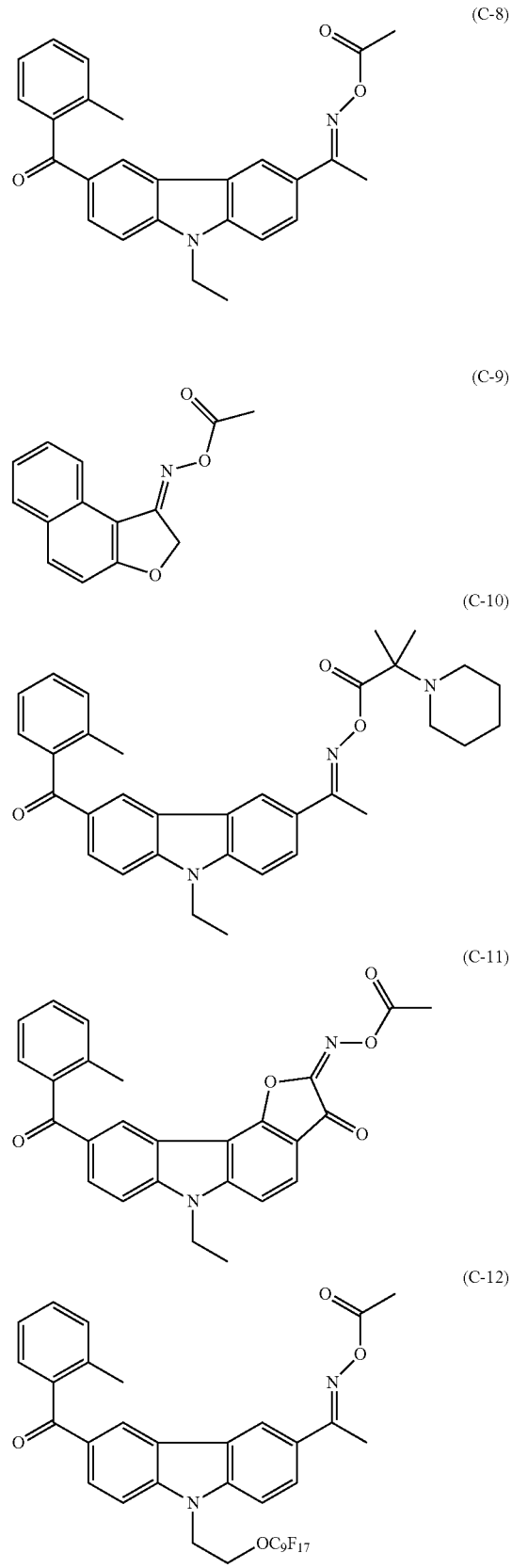

(C-13)

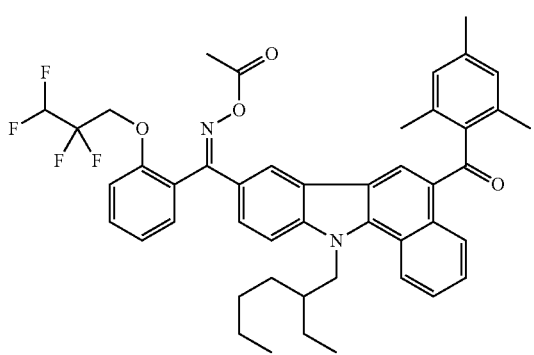

(C-14)

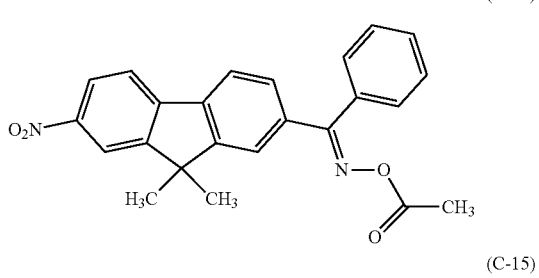

(C-15)

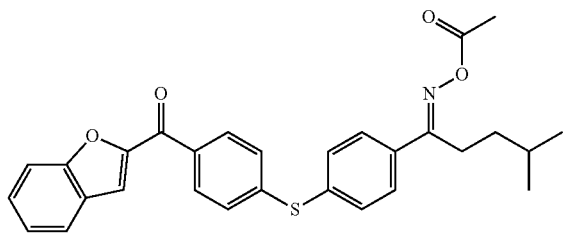

(C-16)

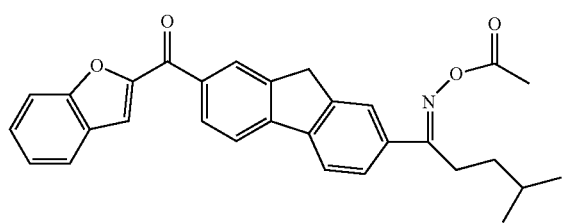

In the present invention, as the photoradical polymerization initiator B, a photoradical polymerization initiator having two functional groups or three or more functional groups may be used. By using this photoradical polymerization initiator, two or more radicals are generated from one molecule of the photoradical polymerization initiator. Therefore, excellent sensitivity can be obtained. In addition, in a case where a compound having an asymmetric structure is used, crystallinity deteriorates, solubility in a solvent or the like is improved, precipitation is not likely to occur over time, and temporal stability of the photosensitive composition can be improved. Specific examples of the photoradical polymerization initiator having two functional groups or three or more functional groups include a dimer of an oxime compound described in JP2010-527339A, JP2011-524436A, WO2015/004565A, paragraphs "0407" to "0412" of JP2016-532675A, or paragraphs "0039" to "0055" of WO2017/033680A, a compound (E) and a compound (G) described in JP2013-522445A, Cmpd 1 to 7 described in WO2016/034963A, an oxime ester photoinitiator described in paragraph "0007" of JP2017-523465A, a photoradical polymerization initiator described in paragraphs "0020" to "0033" of JP2017-167399A, and a photopolymerization initiator (A) described in paragraphs "0017" to "0026" of JP2017-151342A.

In the present invention, a pinacol compound can also be used as the photoradical polymerization initiator B. Examples of the pinacol compound include benzopinacol, 1,2-dimethoxy-1,1,2,2-tetraphenylethane, 1,2-diethoxy-1,1,2,2-tetraphenylethane, 1,2-diphenoxy-1,1,2,2-tetraphenylethane, 1,2-dimethoxy-1,1,2,2-tetra(4-methylphenyl)ethane, 1,2-diphenoxy-1,1,2,2-tetra(4-methoxyphenyl)ethane, 1,2-bis(trimethylsiloxy)-1,1,2,2-tetraphenylethane, 1,2-bis(triethylsiloxy)-1,1,2,2-tetraphenylethane, 1,2-bis(t-butyldimethylsiloxy)-1,1,2,2-tetraphenylethane, 1-hydroxy-2-trimethylsiloxy-1,1,2,2-tetraphenylethane, 1-hydroxy-2-triethylsiloxy-1,1,2,2-tetraphenylethane, and 1-hydroxy-2-t-butyldimethylsiloxy-1,1,2,2-tetraphenylethane. In addition, the details of the pinacol compound can be found in JP2014-523939A and JP2014-521772A, the contents of which are incorporated herein by reference.

In the present invention, it is preferable that the photoradical polymerization initiator B includes a photoradical polymerization initiator b1 that satisfies the following condition 1.

Condition 1: after a propylene glycol monomethyl ether acetate solution including 0.035 mmol/L of the photoradical polymerization initiator b1 is exposed to pulses of light having a wavelength of 355 nm under conditions of a maximum instantaneous illuminance of 375000000 W/m$^2$, pulse duration: 8 nanoseconds, and frequency: 10 Hz, a quantum yield q355 is 0.05 or higher.

The quantum yield q355 of the photoradical polymerization initiator b1 is preferably 0.10 or higher, more preferably 0.15 or higher, still more preferably 0.25 or higher, still more preferably 0.35 or higher, and still more preferably 0.45 or higher.

In this specification, the quantum yield q355 of the photoradical polymerization initiator b1 is a value obtained by dividing the number of decomposed molecules in the photoradical polymerization initiator b1 after the pulse exposure under the condition 1 by the number of absorbed photons in the photoradical polymerization initiator b1. Regarding the number of absorbed photons, the number of irradiated photons was obtained from the exposure time during the pulse exposure under the above-described condition, an average absorbance at 355 nm before and after exposure was converted into a transmittance, and the number of irradiated photons was multiplied by (1−transmittance) to obtain the number of absorbed photons. Regarding the number of decomposed molecules, a decomposition rate of the photoradical polymerization initiator b1 is obtained from the absorbance of the photoradical polymerization initiator b1 after exposure, and the decomposition rate is multiplied by the number of molecules present in the photoradical polymerization initiator b1 to obtain the number of decomposed molecules. In addition, regarding the absorbance of the photoradical polymerization initiator b1, a propylene glycol monomethyl ether acetate solution including 0.035 mmol/L of the photoradical polymerization initiator b1 is put into an optical cell of 1 cm×1 cm×4 cm, and the absorbance of the initiator b1 can be measured using a spectrophotometer. As the spectrophotometer, for example, HP8453 (manufactured by Agilent Technologies Inc.) can be used. Examples of the photoradical polymerization initiator b1 that satisfies the above-described condition 1 include IRGACURE-OXE01, OXE02, and OXE03 (all of which are manufactured by BASF SE). In addition, a compound having the following structure can be preferably used as the photoradical polymerization initiator b1 that satisfies the above-described condition 1. In particular, from the viewpoint of adhesiveness, IRGACURE-OXE01 and OXE02 are preferably used. In addition, from the viewpoint of curing properties, a compound represented by the following Formula (I3) is preferably used.

(I1)

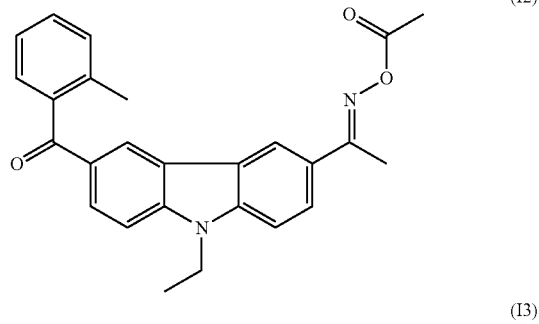
(I2)

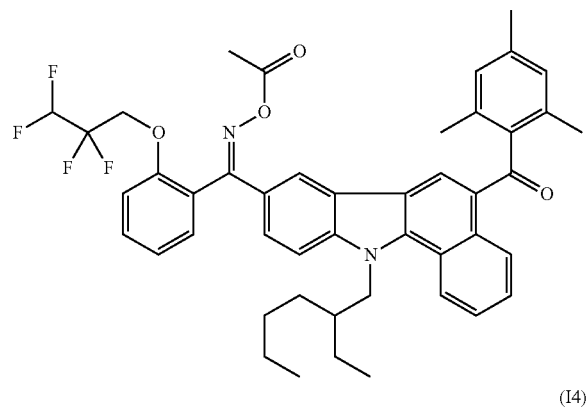
(I3)

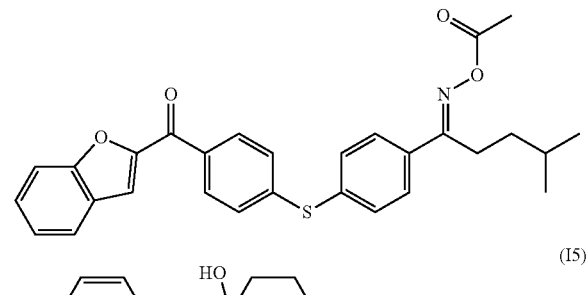
(I4)

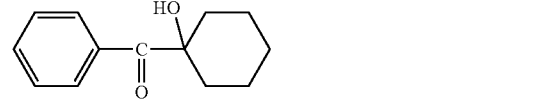
(I5)

In addition, it is more preferable that the photoradical polymerization initiator b1 further satisfies the following condition 2.

Condition 2: after a film having a thickness of 1.0 μm and including 5 mass % of the photoradical polymerization initiator b1 and 95 mass % of a resin is exposed to pulses of light having a wavelength of 265 nm under conditions of a maximum instantaneous illuminance of 375000000 W/m², pulse duration: 8 nanoseconds, and frequency: 10 Hz, a quantum yield $q_{265}$ is 0.05 or higher.

The quantum yield $q_{265}$ of the photoradical polymerization initiator b1 is preferably 0.10 or higher, more preferably 0.15 or higher, still more preferably 0.20 or higher.

In this specification, the quantum yield $q_{265}$ of the photoradical polymerization initiator b1 is a value obtained by dividing the number of decomposed molecules in the photoradical polymerization initiator b1 per 1 cm² of the film after the pulse exposure under the condition 2 by the number of absorbed photons in the photoradical polymerization initiator b1. Regarding the number of absorbed photons, the number of irradiated photons was obtained from the exposure time during the pulse exposure under the condition 2, and the number of irradiated photons per 1 cm² of the film was multiplied by (1−transmittance) to obtain the number of absorbed photons. Regarding the number of decomposed molecules in the photoradical polymerization initiator b1 per 1 cm² of the film after exposure, a decomposition rate of the photoradical polymerization initiator b1 is obtained from a change in the absorbance of the film before and after exposure is obtained, and the decomposition rate of the photoradical polymerization initiator b1 is multiplied by the number of molecules present in the photoradical polymerization initiator b1 per 1 cm² of the film. The weight of the film per 1 cm² of the film area is obtained by setting the film density as 1.2 g/cm³, and the number of molecules present in the photoradical polymerization initiator b1 per 1 cm² of the film is obtained as "((Weight of Film per 1 cm² of Film×5 mass % (Content of Photoradical Polymerization Initiator b1)/Molecular Weight of Photoradical Polymerization Initiator b1)×6.02×10²³ (Avogadro's Number)".

In addition, it is preferable that the photoradical polymerization initiator b1 used in the present invention satisfies the following condition 3.

condition 3: after a film including 5 mass % of the photoradical polymerization initiator b1 and a resin is exposed to one pulse of light having a wavelength in a wavelength range of 248 to 365 nm under conditions of a maximum instantaneous illuminance of 625000000 W/m², pulse duration: 8 nanoseconds, and frequency: 10 Hz, a radical concentration in the film reaches 0.000000001 mmol or higher per 1 cm² of the film.

The radical concentration in the film under the condition 3 per 1 cm² of the film reaches preferably 0.000000005 mmol or higher, more preferably 0.00000001 mmol or higher, still more preferably 0.00000003 mmol or higher, and still more preferably 0.0000001 mmol or higher.

In this specification, the radical concentration in the above-described film is obtained by multiplying a quantum yield of the initiator b1 with respect to the light having a measurement wavelength by (1−transmittance of film) to calculate a decomposition rate per number of incident photons and calculating the density of the initiator b1 decomposed per 1 cm² of the film from "mol number of photons per one pulse"×"decomposition rate of photoradical polymerization initiator b1 per number of incident photons". The radical concentration is a value calculated assuming that the entirety of the photoradical polymerization initiator b1 decomposed by light irradiation is a radical (that does not disappear during an intermediate reaction).

The resin used for the measurement under the condition 2 or 3 is not particularly limited as long as it is compatible to the photoradical polymerization initiator b1. For example, a resin (A) having the following structure is preferably used. A numerical value added to a repeating unit represents a molar ratio, a weight-average molecular weight is 40000, and a dispersity (Mn/Mw) is 5.0.

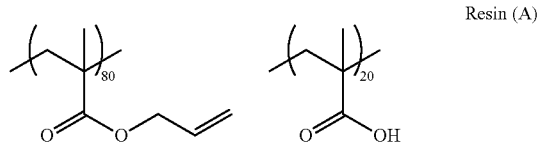

Resin (A)

From the viewpoint of easily instantaneously generating a large amount of a radical by pulse exposure, as the photoradical polymerization initiator b1, an alkylphenone compound or an oxime compound is preferable, and an oxime compound is more preferable. In addition, it is preferable that the photoradical polymerization initiator b1 is a compound that is likely to cause two-photon absorption to occur. The two-photon absorption refers to an excitation process of simultaneously absorbing two photons.

The photoradical polymerization initiator B used in the present invention may consist of only one photoradical polymerization initiator or may include two or more photoradical polymerization initiators. In a case where the photoradical polymerization initiator B includes two or more photoradical polymerization initiators, each of the photoradical polymerization initiators may be the photoradical polymerization initiator b1 that satisfies the above-described condition 1. In addition, the photoradical polymerization initiator B may include one or more photoradical polymerization initiators b1 that satisfy the above-described condition 1 and one or more photoradical polymerization initiators b2 that do not satisfy the above-described condition 1. In a case where two or more photoradical polymerization initiators included in the photoradical polymerization initiator B consist of the photoradical polymerization initiators b1 that satisfy the above-described condition 1, a required amount of a radical for curing the radically polymerizable compound C can be easily instantaneously generated by pulse exposure. In a case where two or more photoradical polymerization initiators included in the photoradical polymerization initiator B includes one or more photoradical polymerization initiators b1 that satisfy the above-described condition 1 and one or more photoradical polymerization initiators b2 that do not satisfy the above-described condition 1, desensitization over time caused by pulse exposure can be easily suppressed.

From the viewpoint of easily adjusting the sensitivity, it is preferable that the photoradical polymerization initiator B used in the present invention include two or more photoradical polymerization initiators. In addition, in a case where the photoradical polymerization initiator B used in the present invention includes two or more photoradical polymerization initiators, from the viewpoint of curing properties, it is preferable that the photoradical polymerization initiator B satisfies the following condition 1a.

Condition 1a: after a propylene glycol monomethyl ether acetate solution including 0.035 mmol/L of a mixture is exposed to pulses of light having a wavelength of 355 nm under conditions of a maximum instantaneous illuminance of 375000000 W/m², pulse duration: 8 nanoseconds, and frequency: 10 Hz, a quantum yield $q_{355}$ is preferably 0.05 or higher, more preferably 0.10 or higher, still more preferably 0.15 or higher, still more preferably 0.25 or higher, still more preferably 0.35 or higher, and still more preferably 0.45 or higher, the mixture being obtained by mixing two or more photoradical polymerization initiators at a ratio at which the photosensitive composition includes the two or more photoradical polymerization initiators.

In addition, in a case where the photoradical polymerization initiator B used in the present invention includes two or more photoradical polymerization initiators, from the viewpoint of curing properties, it is preferable that the photoradical polymerization initiator B satisfies the following condition 2a.

Condition 2a: after a film having a thickness of 1.0 μm and including 5 mass % of a mixture and 95 mass % of a resin is exposed to pulses of light having a wavelength of 265 nm under conditions of a maximum instantaneous illuminance of 375000000 W/m², pulse duration: 8 nanoseconds, and frequency: 10 Hz, a quantum yield $q_{265}$ is 0.05 or higher, more preferably 0.10 or higher, still more preferably 0.15 or higher, and still more preferably 0.20 or higher, the mixture being obtained by mixing two or more photoradical initiators at a ratio at which the photosensitive composition includes the two or more photoradical polymerization initiators.

In addition, in a case where the photoradical polymerization initiator B used in the present invention includes two or more photoradical polymerization initiators, from the viewpoint of curing properties, it is preferable that the photoradical polymerization initiator B satisfies the following condition 3a.

Condition 3a: after a film including 5 mass % of a mixture and a resin is exposed to pulses of light having a wavelength in a wavelength range of 248 to 365 nm for 0.1 seconds under conditions of a maximum instantaneous illuminance of 625000000 W/m², pulse duration: 8 nanoseconds, and frequency: 10 Hz, a radical concentration in the film reaches preferably 0.000000001 mmol or higher, more preferably 0.000000005 mmol or higher, still more preferably 0.00000001 mmol or higher, still more preferably 0.00000003 mmol or higher, and most preferably 0.0000001 mmol or higher per 1 cm² of the film, the mixture being obtained by mixing two or more photoradical initiators at a ratio at which the photosensitive composition includes the two or more photoradical polymerization initiators.

The content of the photoradical polymerization initiator B is preferably 2% to 10 mass % with respect to the total solid content of the photosensitive composition. The upper limit is preferably 8 mass % or lower, and more preferably 6 mass % or lower. The lower limit is preferably 3 mass % or higher and more preferably 5 mass % or higher.

In addition, the content of the photoradical polymerization initiator B is preferably 10 to 100 parts by mass with respect to 100 parts by mass of the radically polymerizable compound C described below. The upper limit is preferably 70 parts by mass or less and more preferably 50 parts by mass or less. The lower limit is preferably 13 parts by mass or more and more preferably 15 parts by mass or more.

In addition, the content of the photoradical polymerization initiator B is preferably 10 to 100 parts by mass with respect to 100 parts by mass of the radically polymerizable compound C1 described below. The upper limit is preferably 70 parts by mass or less and more preferably 50 parts by mass or less. The lower limit is preferably 13 parts by mass or more and more preferably 15 parts by mass or more.

In a case where the photosensitive composition according to the embodiment of the present invention includes two or more photoradical polymerization initiators B, it is preferable that the total content of the two or more photoradical polymerization initiators B is in the above-described range.

<<Radically Polymerizable Compound C>>

The photosensitive composition according to the embodiment of the present invention includes the radically polymerizable compound C. As the radically polymerizable compound, a compound having a radically polymerizable group is used. The photosensitive composition according to the embodiment of the present invention includes the radically polymerizable compound C1 having a weight-average molecular weight of 3000 or higher (hereinafter, also referred to as "radically polymerizable compound C1") as the radically polymerizable compound C.

(Radically Polymerizable Compound C1)

The weight-average molecular weight of the radically polymerizable compound C1 is 3000 or higher, preferably 3000 to 50000, more preferably 5000 to 50000, and still more preferably 5000 to 40000. In a case where the weight-average molecular weight of the radically polymerizable compound C1 is 3000 or higher, the radically polymerizable compound C1 can be easily cured in the vicinity of the coloring material, and a film having excellent solvent resistance, moisture resistance, thermal diffusivity resistance, and the like can be easily formed. In the present invention, the radically polymerizable compound C1 can also be used as a dispersant.

Examples of the radically polymerizable group included in the radically polymerizable compound C1 include an ethylenically unsaturated bond group such as a vinyl group, a vinyloxy group, an allyl group, a methallyl group, a (meth)acryloyl group, a styrene group, a cinnamoyl group, or a maleimide group. Among these a (meth)acryloyl group, a styrene group, or a maleimide group is preferable, a (meth)acryloyl group is more preferable, and an acryloyl group is still more preferable. A (meth)acryloyl group is highly reactive and has a low steric hindrance. Therefore, a (meth)acryloyl group can be cured in the vicinity of the coloring material A, and the effects of the present invention can be more significantly obtained.

In addition, the amount of an ethylenically unsaturated bond group (hereinafter, also referred to as "C=C value") in the radically polymerizable compound C1 is preferably 0.2 to 5.0 mmol/g, more preferably 0.2 to 4.0 mmol/g, and still more preferably 0.2 to 3.0 mmol/g from the viewpoints of photolithographic properties and the storage stability of the photosensitive composition. The lower limit is more preferably 0.3 mmol/g or higher. In a case where the molar amount of the ethylenically unsaturated bond group in the radically polymerizable compound C1 can be calculated from raw materials used for synthesis of the radically polymerizable compound C1, a value calculated from raw materials added is used as the C=C value of the radically polymerizable compound C1. In addition, in a case where the molar amount of the ethylenically unsaturated bond group in the radically polymerizable compound C1 cannot be calculated from raw materials used for synthesis of the radically polymerizable compound C1, a value measured using a hydrolysis method is used as the C=C value of the radically polymerizable compound C1. Specifically, the C=C value of the radically polymerizable compound C1 can be calculated from the following expression after extracting a low molecular weight component (a) of the ethylenically unsaturated bond group portion from the radically polymerizable compound C1 by an alkali treatment and measuring the content of the low molecular weight component (a) by high-performance liquid chromatography (HPLC). In addition, in a case where the molar amount of the ethylenically unsaturated bond group in the radically polymerizable compound C1 cannot be calculated from raw materials used for synthesis of the radically polymerizable compound C1 and cannot be measured using a hydrolysis method, a value measured using a nuclear magnetic resonance (NMR method) is used as the C=C value of the radically polymerizable compound C1.

C=C value [mmol/g] in Radically Polymerizable Compound C1=(Content [ppm] of Low Molecular Weight Component (a)/Molecular weight [g/mol] of Low Molecular Weight Component (a))/(Weighted Value [g] of Radically Polymerizable Compound C1×(Solid Content Concentration [mass %] of Radically Polymerizable Compound C1/100)×10)

It is preferable that the radically polymerizable compound C1 is a compound having an acid group. In a case where the radically polymerizable compound C1 has an acid group, the dispersibility of the coloring material A or the like in the photosensitive composition can be improved, and the storage stability of the photosensitive composition can be improved. Further, developability can also be further improved. Examples of the acid group include a carboxyl group, a sulfo group, and a phosphate group. Among these, a carboxyl group is preferable. The acid value of the radically polymerizable compound C1 is preferably 30 to 150 mgKOH/g. The upper limit is more preferably 100 mgKOH/g or lower. The lower limit is preferably 35 mgKOH/g or higher and more preferably 40 mgKOH/g or higher. In a case where the acid value of the radically polymerizable compound C1 is in the above-described range, the developability of the photosensitive composition is excellent. Further, the dispersibility of the coloring material A in the photosensitive composition is also excellent, and the storage stability of the photosensitive composition is also excellent.

It is preferable that the radically polymerizable compound C1 includes a repeating unit having an ethylenically unsaturated bond group at a side chain, and it is more preferable that the radically polymerizable compound C1 includes a repeating unit represented by the following Formula (A-1-1). In addition, in the radically polymerizable compound C1, the content of the repeating unit having an ethylenically unsaturated bond group is preferably 10 mol % or higher, more preferably 10% to 80 mol %, and still more preferably 20% to 70 mol % with respect to all the repeating units of the radically polymerizable compound C1.

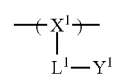

(A-1-1)

In Formula (A-1-1), $X^1$ represents a main chain of the repeating unit, $L^1$ represents a single bond or a divalent linking group, and $Y^1$ represents an ethylenically unsaturated bond group.

In Formula (A-1-1), the main chain of the repeating unit represented by $X^1$ is not particularly limited. The main chain is not particularly limited as long as it is a linking group formed of a well-known polymerizable monomer. Examples of the main chain include a poly(meth)acrylic linking group, a polyalkyleneimine linking group, a polyester linking group, a polyurethane linking group, a polyurea linking group, a polyamide linking group, a polyether linking group, and a polystyrene linking group. From the viewpoint of availability and manufacturing suitability of raw materials, a poly(meth)acrylic linking group, a polyalkyleneimine linking group, is preferable, and a (meth)acrylic linking group is more preferable.

Examples of the divalent linking group represented by $L^1$ in Formula (A-1-1) include an alkylene group (preferably an alkylene group having 1 to 12 carbon atoms), an alkyleneoxy group (preferably an alkyleneoxy group having 1 to 12 carbon atoms), an oxyalkylenecarbonyl group (preferably an oxyalkylenecarbonyl group having 1 to 12 carbon atoms), an arylene group (preferably an arylene group having 6 to 20 carbon atoms), —NH—, —SO—, —SO$_2$—, —CO—, —O—, —COO—, —OCO—, —S—, and a group including a combination of two or more of the above-described groups. The alkylene group, the alkylene group in the alkyleneoxy group, and the alkylene group in the oxyalkylenecarbonyl group may be linear, branched, or cyclic and is preferably linear or branched. In addition, the alkylene group, the alkylene group in the alkyleneoxy group, and the alkylene group in the oxyalkylenecarbonyl group may have a substituent or may be unsubstituted. Examples of the substituent include a hydroxy group and an alkoxy group. From the viewpoint of manufacturing suitability, a hydroxy group is preferable.

Examples of the ethylenically unsaturated bond group represented by $Y^1$ in Formula (A-1-1) include a vinyl group, a vinyloxy group, an allyl group, a methallyl group, a (meth)acryloyl group, a styrene group, a cinnamoyl group, and a maleimide group. Among these, a (meth)acryloyl group, a styrene group, or a maleimide group is preferable, a (meth)acryloyl group is more preferable, and an acryloyl group is still more preferable.

Specific examples of the repeating unit represented by Formula (A-1-1) include a repeating unit represented by the following Formula (A-1-1a) and a repeating unit represented by the following Formula (A-1-1b).

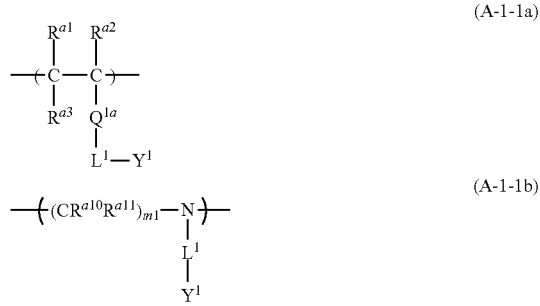

In Formula (A-1-1a), $R^{a1}$ to $R^{a3}$ each independently represent a hydrogen atom or an alkyl group, $Q^{1a}$ represents —CO—, —COO—, —OCO—, —CONH—, or a phenylene group, $L^1$ represents a single bond or a divalent linking group, and $Y^1$ represents an ethylenically unsaturated bond group. The number of carbon atoms in the alkyl group represented by $R^{a1}$ to $R^{a3}$ is preferably 1 to 10, more preferably 1 to 3, and still more preferably 1. $Q^{1a}$ represents preferably —COO— or —CONH— and more preferably —COO—.

In Formula (A-1-1b), $R^{a10}$ and $R^{a11}$ each independently represent a hydrogen atom or an alkyl group, m1 represents an integer of 1 to 5, $L^1$ represents a single bond or a divalent linking group, and $Y^1$ represents an ethylenically unsaturated bond group. The number of carbon atoms in the alkyl group represented by $R^{a10}$ and $R^{a11}$ is preferably 1 to 10 and more preferably 1 to 3.

It is preferable that the radically polymerizable compound C1 is a compound including a repeating unit having a graft chain. In a case where the radically polymerizable compound C1 is a compound including a repeating unit having a graft chain, aggregation or the like of the coloring material A due to steric hindrance caused by the graft chain can be more effectively suppressed. The radically polymerizable compound C1 that includes a repeating unit having a graft chain can be preferably used as a dispersant.

The graft chain refers to a polymer chain branched and extending from the main chain of the repeating unit. The length of the graft chain is not particularly limited. However, as the length of the graft chain increases, the steric repulsion effect is improved, and the dispersibility of the coloring material or the like can be improved. The number of atoms in the graft chain other than hydrogen atoms is preferably 40 to 10000, more preferably 50 to 2000, and still more preferably 60 to 500.

It is preferable that the graft chain includes a repeating unit having at least one structure selected from a polyester repeating unit, a polyether repeating unit, a poly(meth)acryl repeating unit, a polyurethane repeating unit, a polyurea repeating unit, or a polyamide repeating unit, it is more preferable that the graft chain includes a repeating unit having at least one structure selected from a polyester repeating unit, a polyether repeating unit, or a poly(meth)acryl repeating unit, and it is still more preferable that the graft chain includes a polyester repeating unit. Examples of the polyester repeating unit include a repeating unit having a structure represented by the following Formula (G-1), Formula (G-4), or Formula (G-5). In addition, examples of the polyether repeating unit include a repeating unit having a structure represented by the following Formula (G-2). In addition, examples of the poly(meth)acryl repeating unit includes a repeating unit having a structure represented by the following Formula (G-3).

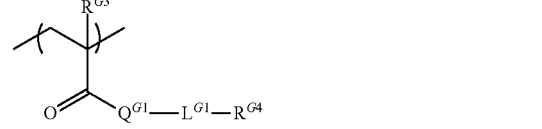

In the formulae, $R^{G1}$ and $R^{G2}$ each independently represent an alkylene group. The alkylene group represented by $R^{G1}$ and $R^{G2}$ is not particularly limited, and a linear or branched alkylene group having 1 to 20 carbon atoms is preferable, a linear or branched alkylene group having 2 to 16 carbon atoms is more preferable, and a linear or branched alkylene group having 3 to 12 carbon atoms is still more preferable.

In the formulae, $R^{G3}$ represents a hydrogen atom or a methyl group.

In the formulae, $Q^{G1}$ represents —O— or —NH—, and $L^{G1}$ represents a single bond or a divalent linking group. Examples of the divalent linking group include an alkylene group (preferably an alkylene group having 1 to 12 carbon atoms), an alkyleneoxy group (preferably an alkyleneoxy group having 1 to 12 carbon atoms), an oxyalkylenecarbonyl group (preferably an oxyalkylenecarbonyl group having 1 to 12 carbon atoms), an arylene group (preferably an arylene group having 6 to 20 carbon atoms), —NH—, —SO—, —SO$_2$—, —CO—, —O—, —COO—, OCO—, —S—, and a group including a combination of two or more of the above-described groups.

$R^{G4}$ represents a hydrogen atom or a substituent. Examples of the substituent include an alkyl group, an aryl group, a heteroaryl group, an alkoxy group, an aryloxy group, a heteroaryloxy group, an alkylthioether group, an arylthioether group, and a heteroarylthioether group.

In addition, it is preferable that the polyester repeating unit includes a repeating unit derived from a lactone compound, it is more preferable that the polyester repeating unit includes a repeating unit derived from a compound selected from ε-caprolactone and δ-valerolactone, and it is still more preferable that the polyester repeating unit includes a repeating unit derived from ε-caprolactone. Examples of the repeating unit derived from ε-caprolactone include a repeating unit having a structure represented by the following ε-CL. In addition, examples of the repeating unit derived from δ-valerolactone includes a repeating unit having a structure represented by the following δ-VL.

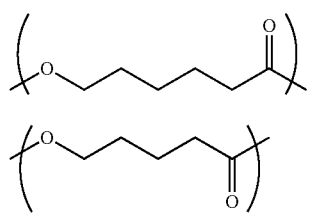

ε-CL

δ-VL

A terminal structure of the graft chain is not particularly limited. The terminal structure may be a hydrogen atom or a substituent. Examples of the substituent include an alkyl group, an aryl group, a heteroaryl group, an alkoxy group, an aryloxy group, a heteroaryloxy group, an alkylthioether group, an arylthioether group, and a heteroarylthioether group. Among these, from the viewpoint of the dispersibility of the coloring material or the like, a group having a steric repulsion effect is preferable, and an alkyl group or an alkoxy group having 5 to 24 carbon atoms is preferable. The alkyl group and the alkoxy group may be linear, branched, or cyclic and is preferably linear or branched.

In the present invention, as the graft chain, a structure represented by the following Formula (G-1a), Formula (G-2a), Formula (G-3a), Formula (G-4a), or Formula (G-5a) is preferable.

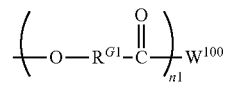

(G-1a)

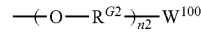

(G-2a)

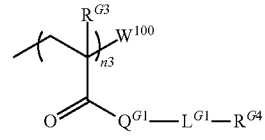

(G-3a)

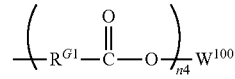

(G-4a)

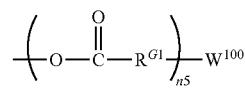

(G-5a)

In the formulae, $R^{G1}$ and $R^{G2}$ each independently represent an alkylene group, $R^{G3}$ represents a hydrogen atom or a methyl group, $Q^{G1}$ represents —O— or —NH—, $L^{G1}$ represents a single bond or a divalent linking group, $R^{G4}$ represents a hydrogen atom or a substituent, and $W^{100}$ represents a hydrogen atom or a substituent. n1 to n5 each independently represent an integer of 2 or more. $R^{G1}$ to $R^{G4}$, $Q^{G1}$ and $L^{G1}$ have the same definitions and the same preferable ranges as $R^{G1}$ to $R^{G4}$, $Q^{G1}$ and $L^{G1}$ described above regarding Formulae (G-1) to (G-5).

In Formulae (G-1a) to (G-5a), it is preferable that $W^{100}$ represents a substituent. Examples of the substituent include an alkyl group, an aryl group, a heteroaryl group, an alkoxy group, an aryloxy group, a heteroaryloxy group, an alkylthioether group, an arylthioether group, and a heteroarylthioether group. Among these, from the viewpoint of the dispersibility of the coloring material or the like, a group having a steric repulsion effect is preferable, and an alkyl group or an alkoxy group having 5 to 24 carbon atoms is preferable. The alkyl group and the alkoxy group may be linear, branched, or cyclic and is preferably linear or branched.

In Formulae (G-1a) to (G-5a), n1 to n5 each independently represent preferably an integer of 2 to 100, more preferably an integer of 2 to 80, and still more preferably an integer of 8 to 60.

In a case where n1 in Formula (G-1a) represents 2 or more, $R^{G1}$ in the respective repeating units may be the same as or different from each other. In a case where $R^{G1}$ includes two or more different repeating units, the arrangement of the respective repeating units is not particularly limited and may be random, alternate, or block-shaped. The same shall be applied to Formulae (G-2a) to (G-5a).

Examples of the repeating unit having a graft chain include a repeating unit represented by the following Formula (A-1-2).

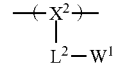

(A-1-2)

In Formula (A-1-2), $X^2$ represents a main chain of the repeating unit, $L^2$ represents a single bond or a divalent linking group, and $W^1$ represents a graft chain.

Examples of the main chain of the repeating unit represented by $X^2$ in Formula (A-1-2) include the structures represented by $X^1$ in Formula (A-1-1), and preferable ranges thereof are the same. Examples of the divalent linking group represented by $L^2$ in Formula (A-1-2) include an alkylene group (preferably an alkylene group having 1 to 12 carbon atoms), an arylene group (preferably an arylene group having 6 to 20 carbon atoms), —NH—, —SO—, —SO$_2$—, —CO—, —O—, —COO—, OCO—, —S—, and a group including a combination of two or more of the above-described groups. Examples of the graft chain represented by $W^1$ in Formula (A-1-2) include the graft chains.

Specific examples of the repeating unit represented by Formula (A-1-2) include a repeating unit represented by the following Formula (A-1-2a) and a repeating unit represented by the following Formula (A-1-2b).

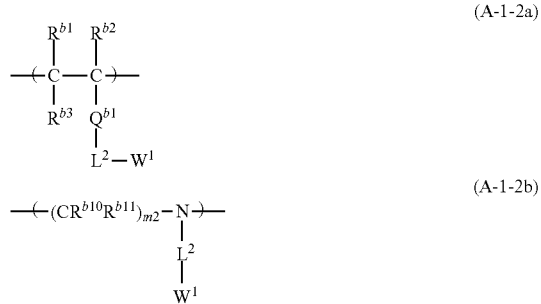

In Formula (A-1-2a), $R^{b1}$ to $R^{b3}$ each independently represent a hydrogen atom or an alkyl group, $Q^{b1}$ represents —CO—, —COO—, —OCO—, —CONH—, or a phenylene group, $L^2$ represents a single bond or a divalent linking group, and $W^1$ represents a graft chain. The number of carbon atoms in the alkyl group represented by $R^{b1}$ to $R^{b3}$ is preferably 1 to 10, more preferably 1 to 3, and still more preferably 1. $Q^{b1}$ represents preferably —COO— or —CONH— and more preferably —COO—.

In Formula (A-1-2b), $R^{b10}$ and $R^{b11}$ each independently represent a hydrogen atom or an alkyl group, m2 represents an integer of 1 to 5, $L^2$ represents a single bond or a divalent linking group, and $W^1$ represents a graft chain. The number of carbon atoms in the alkyl group represented by $R^{b10}$ and $R^{b11}$ is preferably 1 to 10 and more preferably 1 to 3.

In the radically polymerizable compound C1, the weight-average molecular weight (Mw) of the repeating unit having a graft chain is preferably 1000 or higher, more preferably 1000 to 10000, and still more preferably 1000 to 7500. In the present invention, the weight-average molecular weight of the repeating unit having a graft chain is a value calculated from the weight-average molecular weight of a raw material monomer used for polymerization of the repeating unit. For example, the repeating unit having a graft chain can be formed by polymerization of a macromonomer. Here, the macromonomer refers to a polymer compound in which a polymerizable group is introduced into a polymer terminal. In a case where the repeating unit having a graft chain is formed using a macromonomer, the weight-average molecular weight of the macromonomer corresponds to that of the repeating unit having a graft chain.

In a case where the radically polymerizable compound C1 includes a repeating unit having a graft chain, the content of the repeating unit having a graft chain is preferably 1.0% to 60 mol % and more preferably 1.5% to 50 mol % with respect to all the repeating units of the radically polymerizable compound C1.

It is also preferable that the radically polymerizable compound C1 further includes a repeating unit having an acid group. In this aspect, the developability of the photosensitive composition and the dispersibility of the coloring material A or the like can be further improved. Examples of the acid group include a carboxyl group, a sulfo group, and a phosphate group.

Examples of the repeating unit having an acid group include a repeating unit represented by the following Formula (A-1-3).

In Formula (A-1-3), $X^3$ represents a main chain of the repeating unit, $L^3$ represents a single bond or a divalent linking group, and $A^1$ represents an acid group.

Examples of the main chain of the repeating unit represented by $X^3$ in Formula (A-1-3) include the structures represented by $X^1$ in Formula (A-1-1), and preferable ranges thereof are the same.

Examples of the divalent linking group represented by $L^3$ in Formula (A-1-3) include an alkylene group (preferably an alkylene group having 1 to 12 carbon atoms), an alkenylene group (preferably an alkenylene group having 2 to 12 carbon atoms), an alkyleneoxy group (preferably an alkyleneoxy group having 1 to 12 carbon atoms), an oxyalkylenecarbonyl group (preferably an oxyalkylenecarbonyl group having 1 to 12 carbon atoms), an arylene group (preferably an arylene group having 6 to 20 carbon atoms), —NH—, —SO—, —SO$_2$—, —CO—, —O—, —COO—, OCO—, —S—, and a group including a combination of two or more of the above-described groups. The alkylene group, the alkylene group in the alkyleneoxy group, and the alkylene group in the oxyalkylenecarbonyl group may be linear, branched, or cyclic and is preferably linear or branched. In addition, the alkylene group, the alkylene group in the alkyleneoxy group, and the alkylene group in the oxyalkylenecarbonyl group may have a substituent or may be unsubstituted. Examples of the substituent include a hydroxy group.

Examples of the acid group represented by $A^1$ in Formula (A-1-3) include a carboxyl group, a sulfo group, and a phosphate group.

Specific examples of the repeating unit represented by Formula (A-1-3) include a repeating unit represented by the following Formula (A-1-3a) and a repeating unit represented by the following Formula (A-1-3b).

-continued

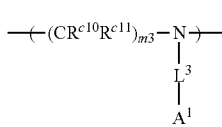
(A-1-3b)

In Formula (A-1-3a), $R^{c1}$ to $R^{c3}$ each independently represent a hydrogen atom or an alkyl group, $Q^{c1}$ represents —CO—, —COO—, —OCO—, —CONH—, or a phenylene group, $L^3$ represents a single bond or a divalent linking group, and $A^1$ represents an acid group. The number of carbon atoms in the alkyl group represented by $R^{c1}$ to $R^{c3}$ is preferably 1 to 10, more preferably 1 to 3, and still more preferably 1. $Q^{c1}$ represents preferably —COO— or —CONH— and more preferably —COO—.

In Formula (A-1-3b), $R^{c10}$ and $R^{c11}$ each independently represent a hydrogen atom or an alkyl group, m3 represents an integer of 1 to 5, $L^3$ represents a single bond or a divalent linking group, and $A^1$ represents an acid group. The number of carbon atoms in the alkyl group represented by $R^{c10}$ and $R^{c11}$ is preferably 1 to 10 and more preferably 1 to 3.

As the repeating unit represented by Formula (A-1-3a), a repeating unit represented by the following Formula (A-1-3a-1) is more preferable.

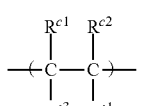
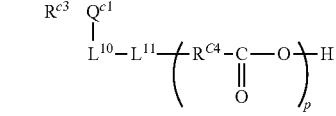
(A-1-3a-1)

In Formula (A-1-3a-1), $R^{c1}$ to $R^{c3}$ each independently represent a hydrogen atom or an alkyl group, $Q^{c1}$ represents —CO—, —COO—, —OCO—, —CONH—, or a phenylene group, $L^{10}$ represents a single bond or an alkylene group, L" represents a single bond, —O—, —S—, —NH—, —CO—, —OCO—, or —COO—, $R^{c4}$ represents an alkylene group or an arylene group, and p represents an integer of 0 to 5. In a case where p represents 0, L" represents —COO—, but $L^{10}$ and $L^{11}$ represent a single bond and $Q^{c1}$ represents —COO—.

In Formula (A-1-3a-1), the number of carbon atoms in the alkyl group represented by Rd to $R^{c3}$ is preferably 1 to 10, more preferably 1 to 3, and still more preferably p represents preferably —COO— or —CONH— and more preferably —COO—.

The number of carbon atoms in the alkylene group represented by $L^{10}$ in Formula (A-1-3a-1) is preferably 1 to 10 and more preferably 1 to 5. The alkylene group may be linear, branched, or cyclic and is preferably linear or branched and more preferably linear. It is preferable that $L^{10}$ represents a single bond.

In Formula (A-1-3a-1), L" represents preferably a single bond or —OCO— and more preferably a single bond.

In Formula (A-1-3a-1), it is preferable that $R^{C4}$ represents an alkylene group. The number of carbon atoms in the alkylene group is preferably 1 to 12, more preferably 1 to 8, still more preferably 2 to 8, and still more preferably 2 to 6. The alkylene group represented by $R^{c4}$ may be linear, branched, or cyclic and is preferably linear or branched and more preferably linear.

In Formula (A-1-3a-1), p represents an integer of 0 to 5, preferably an integer of 0 to 3, and more preferably an integer of 0 to 2.

In a case where the radically polymerizable compound C1 includes a repeating unit having an acid group, the content of the repeating unit having an acid group is preferably 80 mol % or lower and more preferably 10% to 80 mol % with respect to all the repeating units of the radically polymerizable compound C1.

The radically polymerizable compound C1 may further include other repeating units. For example, in a case where the radically polymerizable compound C1 includes the repeating unit represented by Formula (A-1-2b) as the repeating unit having a graft chain, the radically polymerizable compound C1 may further include a repeating unit represented by the following Formula (A-1-4b) and/or a repeating unit represented by the following Formula (A-1-5b).

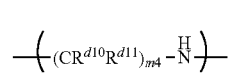
(A-1-4b)

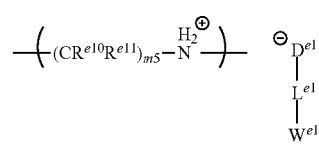
(A-1-5b)

In Formula (A-1-4b), $R^{d10}$ and $R^{d11}$ each independently represent a hydrogen atom or an alkyl group, and m4 represents an integer of 1 to 5. The number of carbon atoms in the alkyl group represented by $R^{d10}$ and $R^{d11}$ is preferably 1 to 10 and more preferably 1 to 3.

In Formula (A-1-5b), $R^{e10}$ and $R^{e11}$ each independently represent a hydrogen atom or an alkyl group, m5 represents an integer of 1 to 5, $D^{e1}$ represents an anionic group, $L^{e1}$ represents a single bond or a divalent linking group, and $W^{31}$ represents a graft chain. The number of carbon atoms in the alkyl group represented by $R^{e10}$ and $R^{e11}$ is preferably 1 to 10 and more preferably 1 to 3. Examples of the anionic group represented by $D^{e1}$ include —$SO_3^-$, —$COO^-$, —$PO_4^-$, and —$PO_4H^-$. Examples of the divalent linking group represented by $L^{e1}$ and the graft chain represented by $W^{e1}$ are the same as described above regarding $L^2$ and $W^1$ in Formula (A-1-2).

In addition, as the other repeating units, the radically polymerizable compound C1 may include a repeating unit derived from monomer components including a compound represented by the following Formula (ED1) and/or a compound represented by the following Formula (ED2) (hereinafter, these compounds will also be referred to as "ether dimer"). Specific examples of the ether dimer can be found in paragraph "0317" of JP2013-29760A, the content of which is incorporated herein by reference.

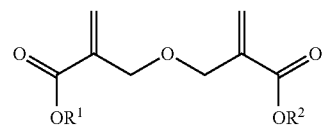
(ED1)

In Formula (ED1), $R^1$ and $R^2$ each independently represent a hydrogen atom or a hydrocarbon group having 1 to 25 carbon atoms which may have a substituent.

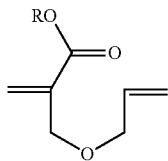
(ED2)

In Formula (ED2), R represents a hydrogen atom or an organic group having 1 to 30 carbon atoms. Specific examples of Formula (ED2) can be found in the description of JP2010-168539A.

In the present invention, a compound represented by the following Formula (SP-1) (hereinafter, also referred to as "compound (SP-1)") can also be used as the radically polymerizable compound C1. The compound (SP-1) can be preferably used as a dispersant. In particular, in a case where a pigment having low dispersibility is used as the coloring material A, the dispersed state of the coloring material A in the photosensitive composition can be easily favorably maintained by using the compound (SP-1) as a dispersant.

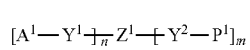
(SP-1)

In the formula, $Z^1$ represents a (m+n)-valent linking group.

$Y^1$ and $Y^2$ each independently represent a single bond or a linking group.

$A^1$ represents a group including a coloring material adsorption portion.

$P^1$ represents a polymer chain.

n represents 1 to 20, m represents 1 to 20, and m+n represents 3 to 21.

An n number of $Y^1$'s and an n number of $A^1$'s may be the same as or different from each other.

An m number of $Y^2$'s and an m number of $P^1$'s may be the same as or different from each other.

At least one of $Z^1$, $A^1$, or $P^1$ has an ethylenically unsaturated bond group.

Examples of the ethylenically unsaturated bond group included in the compound (SP-1) include a vinyl group, a vinyloxy group, an allyl group, a methallyl group, a (meth)acryloyl group, a styrene group, a cinnamoyl group, or a maleimide group. Among these a (meth)acryloyl group, a styrene group, or a maleimide group is preferable, a (meth)acryloyl group is more preferable, and an acryloyl group is still more preferable.

In the compound (SP-1), the ethylenically unsaturated bond group may be included in any one of $Z^1$, $A^1$, or $P^1$ but is preferably included in $P^1$. In addition, in a case where $P^1$ includes an ethylenically unsaturated bond group, it is preferable that $P^1$ represents a polymer chain that includes a repeating unit having an ethylenically unsaturated bond group at a side chain.

In Formula (SP-1), A1 represents a group including a coloring material adsorption portion. Examples of the coloring material adsorption portion include an organic colorant structure, a heterocyclic structure, an acid group, a group having a basic nitrogen atom, a urea group, a urethane group, a group having a coordinating oxygen atom, a hydrocarbon group having 4 or more carbon atoms, an alkoxysilyl group, an epoxy group, an isocyanate group, and a hydroxy group. Among these, a heterocyclic structure, an acid group, a group having a basic nitrogen atom, a hydrocarbon group having 4 or more carbon atoms, or a hydroxy group is preferable, and an acid group is more preferable from the viewpoint of the dispersibility of the coloring material. Examples of the acid group include a carboxyl group, a sulfo group, and a phosphate group. Among these, a carboxyl group is preferable.

One $A^1$ may include at least one coloring material adsorption portion or two or more coloring material adsorption portions. $A^1$ includes preferably 1 to 10 coloring material adsorption portions and more preferably 1 to 6 coloring material adsorption portions. In addition, as the group including a coloring material adsorption portion represented by $A^1$, a group that is formed by the coloring material adsorption portion and a linking group including 1 to 200 carbon atoms, 0 to 20 nitrogen atoms, 0 to 100 oxygen atoms, 1 to 400 hydrogen atoms, and 0 to 40 sulfur atoms being bonded to each other can be used. Examples of the group including a coloring material adsorption portion represented by $A^1$ include a group that is formed by one or more coloring material adsorption portions being bonded through a chained saturated hydrocarbon group having 1 to 10 carbon atoms, a cyclic saturated hydrocarbon group having 3 to 10 carbon atoms, or an aromatic hydrocarbon group having 5 to 10 carbon atoms. The chained saturated hydrocarbon group, the cyclic saturated hydrocarbon group, and the aromatic hydrocarbon group may further have a substituent. Examples of the substituent include an alkyl group having 1 to 20 carbon atoms, an aryl group having 6 to 16 carbon atoms, a hydroxy group, an amino group, a carboxyl group, a sulfonic acid amide group, an N-sulfonylamide group, an acyloxy group having 1 to 6 carbon atoms, an alkoxy group having 1 to 20 carbon atoms, a halogen atom, an alkoxycarbonyl group having 2 to 7 carbon atoms, a cyano group, a carbonate group, and a photocurable group. In addition, in a case where the coloring material adsorption portion may form a monovalent group, the coloring material adsorption portion itself may be $A^1$.

In addition, the chemical formula weight of $A^1$ is preferably 30 to 2000. The upper limit is preferably 1000 or lower and more preferably 800 or lower. The lower limit is preferably 50 or higher and more preferably 100 or higher. In a case where the chemical formula weight of $A^1$ is in the above-described range, the adsorption to the coloring material is excellent. The chemical formula weight of $A^1$ is a value calculated from the structural formula.

In Formula (SP-1), $Z^1$ represents an (m+n)-valent linking group. Examples of the (m+n)-valent linking group include a group including 1 to 100 carbon atoms, 0 to 10 nitrogen atoms, 0 to 50 oxygen atoms, 1 to 200 hydrogen atoms, and 0 to 20 sulfur atoms. Specific examples of the (m+n)-valent linking group include a group (in which a ring structure may be formed) including one of the following structural unit or a combination of two or more of the following structural units.

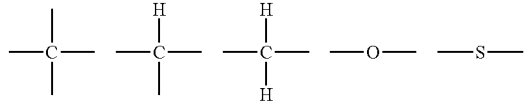

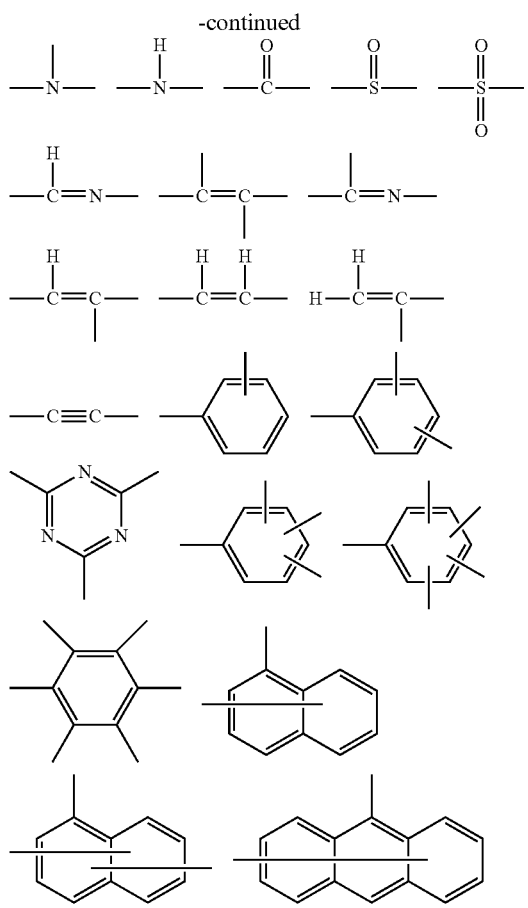

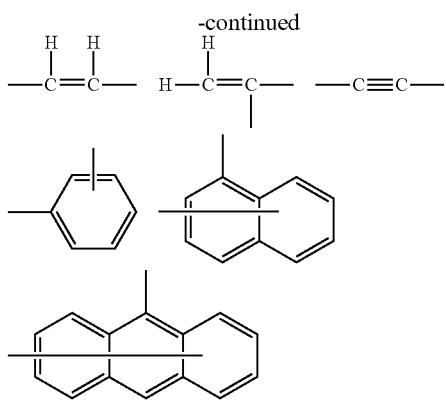

The chemical formula weight of $Z^1$ is preferably 20 to 3000. The upper limit is preferably 2000 or lower and more preferably 1500 or lower. The lower limit is preferably 50 or higher and more preferably 100 or higher. The chemical formula weight of $Z^1$ is a value calculated from the structural formula. Specific examples of the (m+n)-valent linking group can be found in paragraphs "0043" to "0055" of JP2014-177613A, the content of which is incorporated herein by reference.

In Formula (SP-1), $Y^1$ and $Y^2$ each independently represent a single bond or a linking group. Examples of the linking group include a group including 1 to 100 carbon atoms, 0 to 10 nitrogen atoms, 0 to 50 oxygen atoms, 1 to 200 hydrogen atoms, and 0 to 20 sulfur atoms. The above-described group may further have the above-described substituent. Specific examples of the linking group represented by $Y^1$ and $Y^2$ include a group including one of the following structural units or a combination of two or more of the structural units.

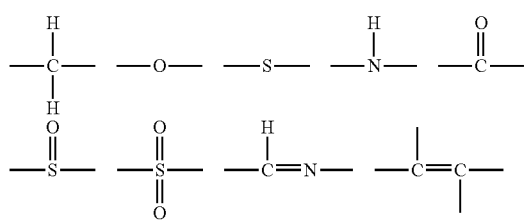

In Formula (SP-1), $P^1$ represents a polymer chain. It is preferable that the polymer chain represented by $P^1$ is a polymer chain that includes at least one repeating unit selected from a poly(meth)acryl repeating unit, a polyether repeating unit, a polyester repeating unit, a polyamide repeating unit, a polyimide repeating unit, a polyimine repeating unit, or a polyurethane repeating unit at a main chain. It is preferable that the polymer chain represented by $P^1$ is a polymer chain that includes a repeating unit represented by any one of the following formulae (P1-1) to (P1-5).

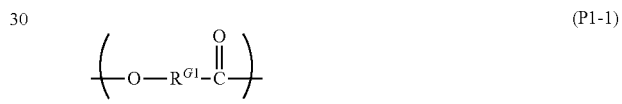
(P1-1)

(P1-2)

(P1-3)

(P1-4)

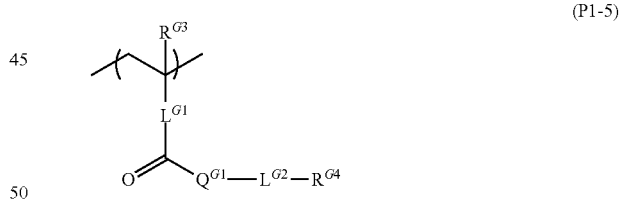
(P1-5)

In the formulae, $R^{G1}$ and $R^{G2}$ each independently represent an alkylene group. As the alkylene group represented by $R^{G1}$ and $R^{G2}$, and a linear or branched alkylene group having 1 to 20 carbon atoms is preferable, a linear or branched alkylene group having 2 to 16 carbon atoms is more preferable, and a linear or branched alkylene group having 3 to 12 carbon atoms is still more preferable. The alkylene group may have a substituent. Examples of the substituent include an aryl group, a heteroaryl group, an alkoxy group, an aryloxy group, a heteroaryloxy group, an alkylthioether group, an arylthioether group, a heteroarylthioether group, and an ethylenically unsaturated group.

In the formulae, $R^{G3}$ represents a hydrogen atom or a methyl group.

In the formulae, $Q^{G1}$ represents —O— or —NH—, $L^{G1}$ represents a single bond or an arylene group, and $L^{G2}$ represents a single bond or a divalent linking group. It is preferable that $Q^{G1}$ represents —O—. It is preferable that $L^{G1}$ represents a single bond. Examples of the divalent linking group represented by $L^{G2}$ include an alkylene group (preferably an alkylene group having 1 to 12 carbon atoms), an arylene group (preferably an arylene group having 6 to 20 carbon atoms), —NH—, —SO—, —SO$_2$—, —CO—, —O—, —COO—, —OCO—, —S—, —NHCO—, —CONH—, and a group including a combination of two or more thereof.

$R^{G4}$ represents a hydrogen atom or a substituent. Examples of the substituent include an alkyl group, an aryl group, a heteroaryl group, an alkoxy group, an aryloxy group, a heteroaryloxy group, an alkylthioether group, an arylthioether group, a heteroarylthioether group, an ethylenically unsaturated bond group, and an acid group.

The number of repeating units in $P^1$ is preferably 3 to 2000. The upper limit is preferably 1500 or less and more preferably 1000 or less. The lower limit is preferably 5 or more and more preferably 7 or more. In addition, it is preferable that $P^1$ represents a polymer chain that includes a repeating unit having an ethylenically unsaturated bond group at a side chain. In addition, the proportion of the repeating unit having an ethylenically unsaturated bond group at a side chain with respect to all the repeating units forming $P^1$ is preferably 1 mol % or higher, more preferably 2 mol % or higher, and still more preferably 3 mol % or higher. The upper limit may be 100 mol %. In addition, in a case where $P^1$ represents a polymer chain that includes a repeating unit having an ethylenically unsaturated bond group at a side chain, it is also preferable that $P^1$ further includes another repeating unit in addition to the repeating unit having an ethylenically unsaturated bond group at a side chain. Examples of the other repeating unit include a repeating unit having an acid group at a side chain. By $P^1$ further including a repeating unit having an acid group at a side chain in addition to the repeating unit having an ethylenically unsaturated bond group at a side chain, the generation of development residues can be more effectively suppressed during pattern formation using a photolithography method. In a case where $P^1$ includes the repeating unit having an acid group at a side chain, the proportion of the repeating unit having an acid group at a side chain with respect to all the repeating units forming $P^1$ is preferably 50 mol % or lower, more preferably 2% to 48 mol %, and still more preferably 4% to 46 mol %.

The weight-average molecular weight of the polymer chain represented by P1 is preferably 1000 or higher and more preferably 1000 to 10000. The upper limit is preferably 9000 or lower, more preferably 6000 or lower, and still more preferably 3000 or lower. The lower limit is preferably 1200 or higher and more preferably 1400 or higher. The weight-average molecular weight of P1 is a value calculated from the weight-average molecular weight of a raw material used for introducing the polymer chain.

It is preferable that the radically polymerizable compound C1 used in the present invention is a compound that includes a repeating unit having an ethylenically unsaturated bond group at a side chain and a repeating unit having a graft chain. In a case where the radically polymerizable compound C1 is a compound including a repeating unit having a graft chain, aggregation or the like of the coloring material due to steric hindrance caused by the graft chain can be more effectively suppressed. Therefore, the radically polymerizable compound C1 can be preferably used as a dispersant. In addition, with this radically polymerizable compound C1, photolithographic properties and dispersibility of the coloring material can be simultaneously achieved at a high level.

Specific examples of the compound that includes a repeating unit having an ethylenically unsaturated bond group at a side chain and a repeating unit having a graft chain include compounds shown below and compounds described below in Examples.

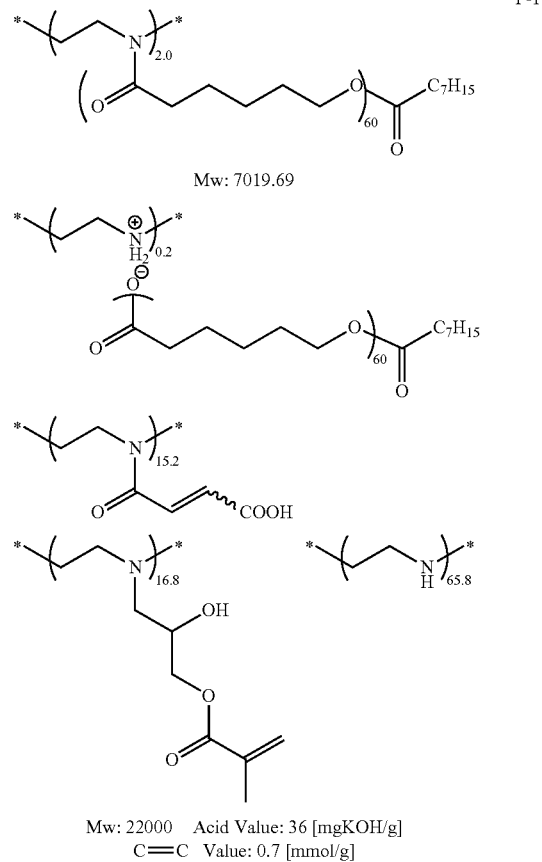

Mw: 7019.69

Mw: 22000   Acid Value: 36 [mgKOH/g]
C=C   Value: 0.7 [mmol/g]

P-2

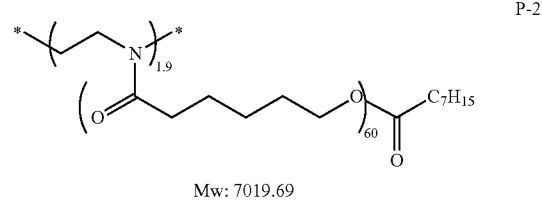

Mw: 7019.69

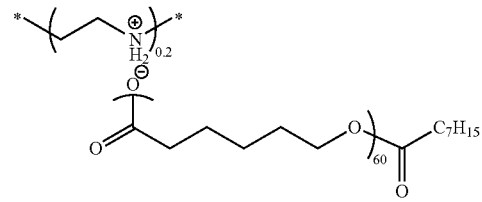

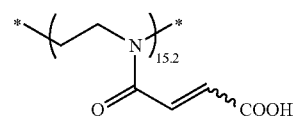

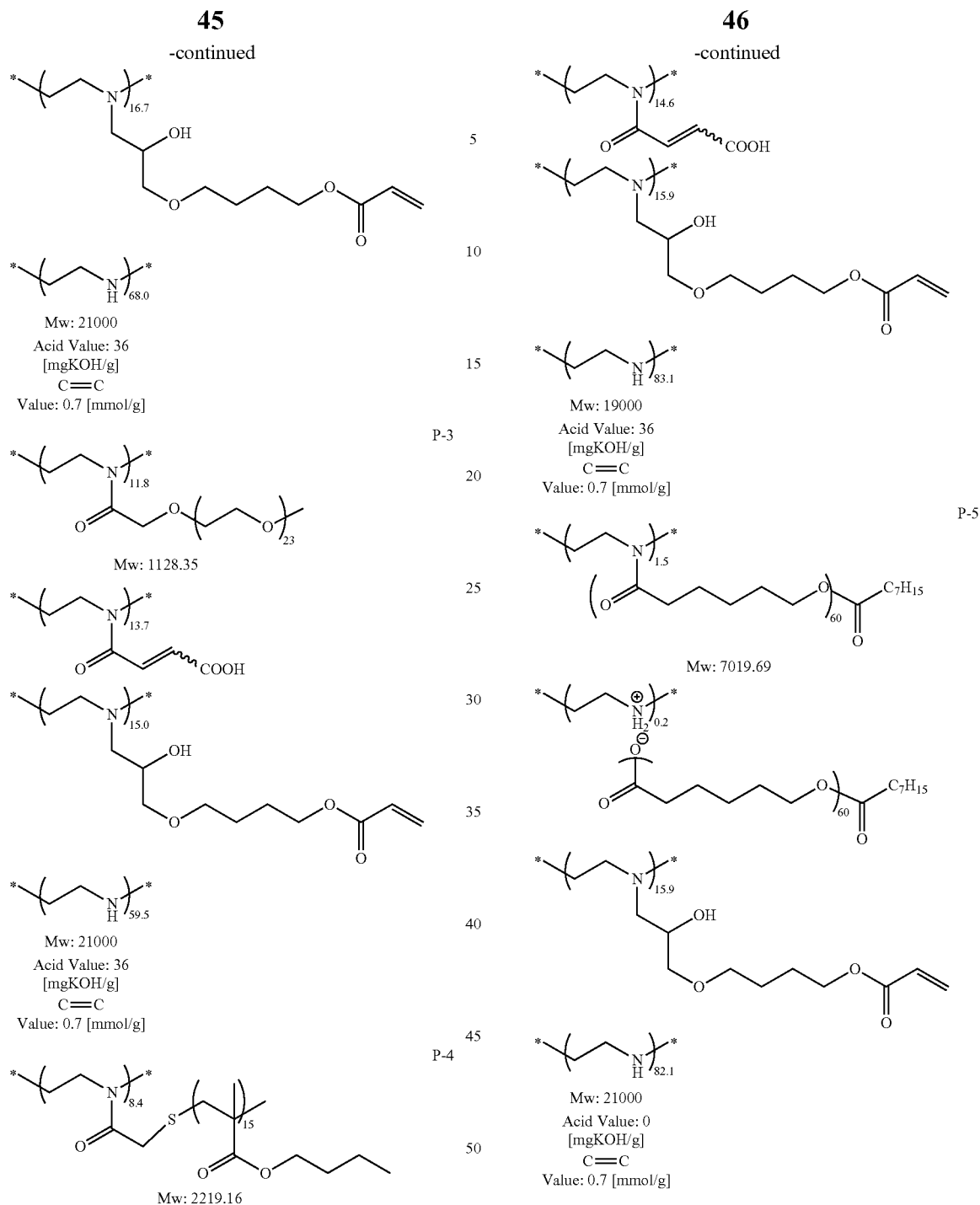

TABLE 1-continued
| | | |
|---|---|---|
| P-7 | 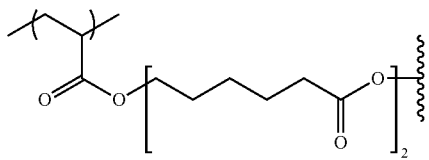 | 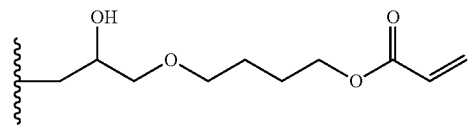 [SMILES: *CC(O)COCCCCOC(=O)C=C] |
| P-8 | 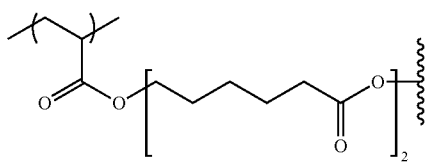 | 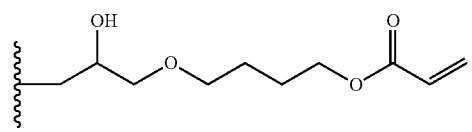 [SMILES: *CC(O)COCCCCOC(=O)C=C] |
| P-9 | 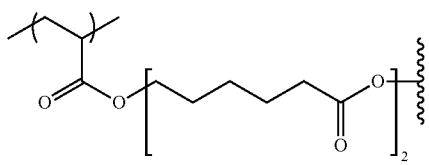 | 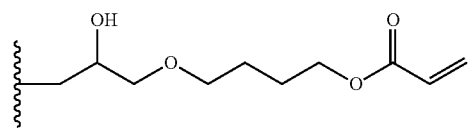 [SMILES: *CC(O)COCCCCOC(=O)C=C] |
| P-10 | 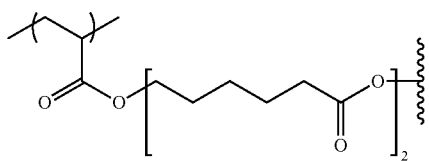 | 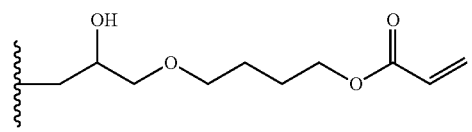 [SMILES: *CC(O)COCCCCOC(=O)C=C] |
| P-11 | 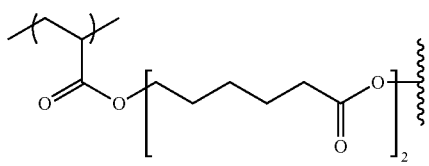 | 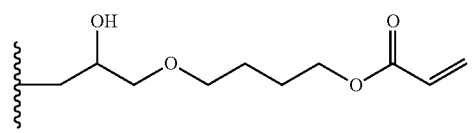 [SMILES: *CC(O)COCCCCOC(=O)C=C] |
| P-12 | 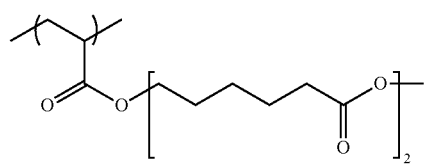 | |
Structure
A-1-2
P-6
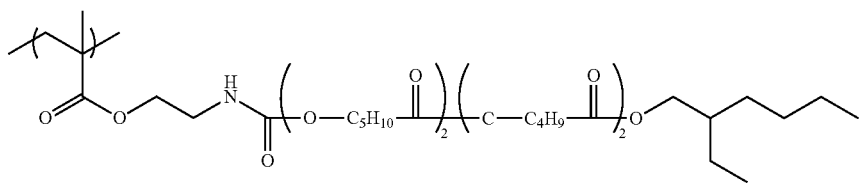
Mw: 2484.1
P-7
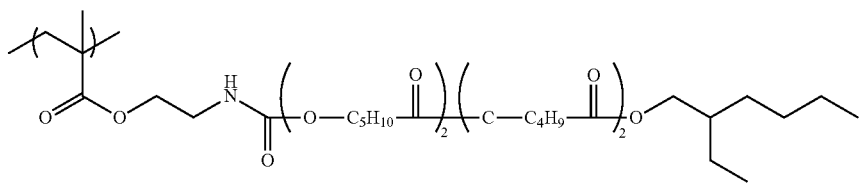
Mw: 2484.1

TABLE 1-continued
P-8 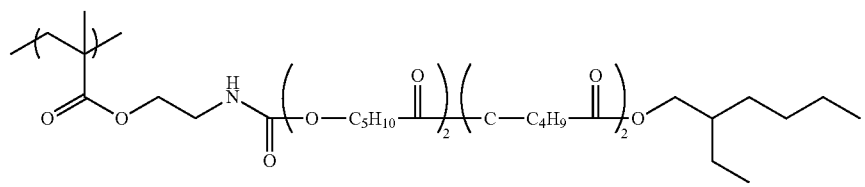
Mw: 2484.1
P-9 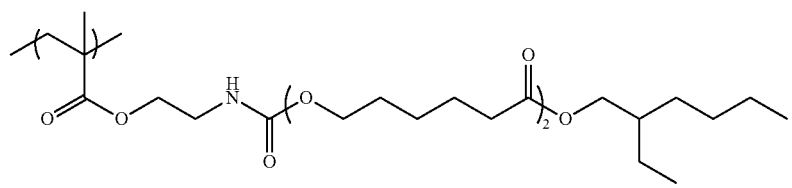
Mw: 1270.62
P-10 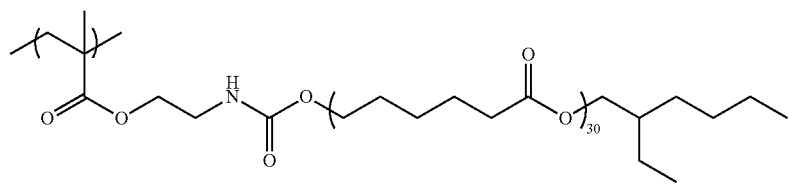
Mw: 2026.16
P-11 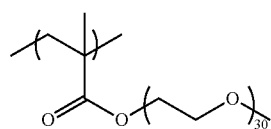
Mw: 1113.34
P-12 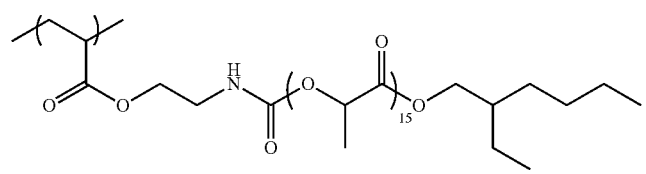
Mw: 1324.23
| | Structure | | Properties | | Molar Raio [mol %] | | |
|---|---|---|---|---|---|---|---|
| | A-1-2 | Mw | Acid Value [mgKOH/g] | C=C Value [mmol/g] | A-1-1 | A-1-2 | A-1-3 |
| P-6 | ![structure] | 22000 | 78 | 0.7 | 32% | 5% | 63% |

TABLE 1-continued
| | | | | | | | |
|---|---|---|---|---|---|---|---|
| P-7 | 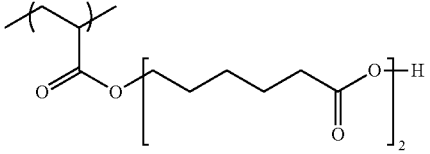 | 18000 | 78 | 0.7 | 32% | 4% | 64% |
| P-8 | 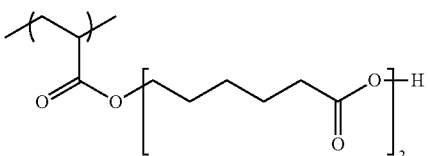 | 20000 | 78 | 0.47 | 25% | 9% | 67% |
| P-9 | 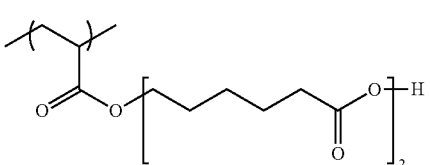 | 19000 | 78 | 0.7 | 32% | 10% | 58% |
| P-10 | 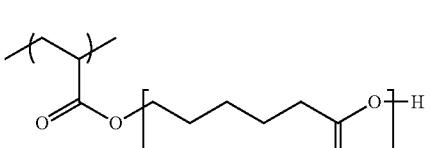 | 12000 | 78 | 0.7 | 34% | 5% | 61% |
| P-11 | 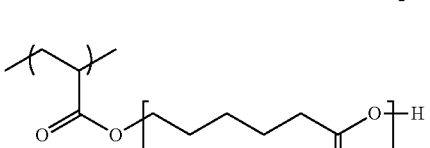 | 18000 | 78 | 0.7 | 32% | 11% | 57% |
| P-12 | 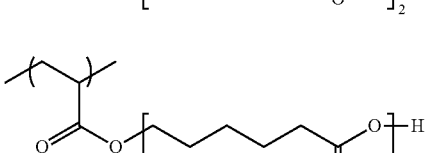 | 17000 | 78 | 0.7 | 32% | 10% | 58% |
TABLE 2
| | Structure A-1-1 | C=C Group Structure |
|---|---|---|
| P-13 | 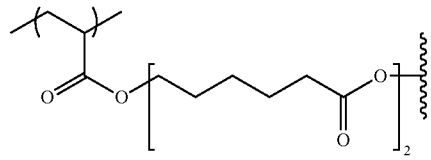 | 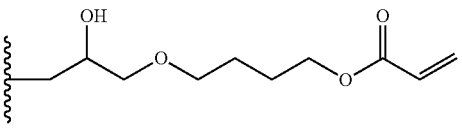 [SMILES: *CC(O)COCCCCOC(=O)C=C] |
| P-14 | 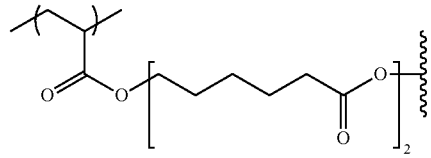 | 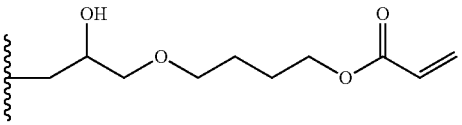 [SMILES: *CC(O)COCCCCOC(=O)C=C] |

TABLE 2-continued
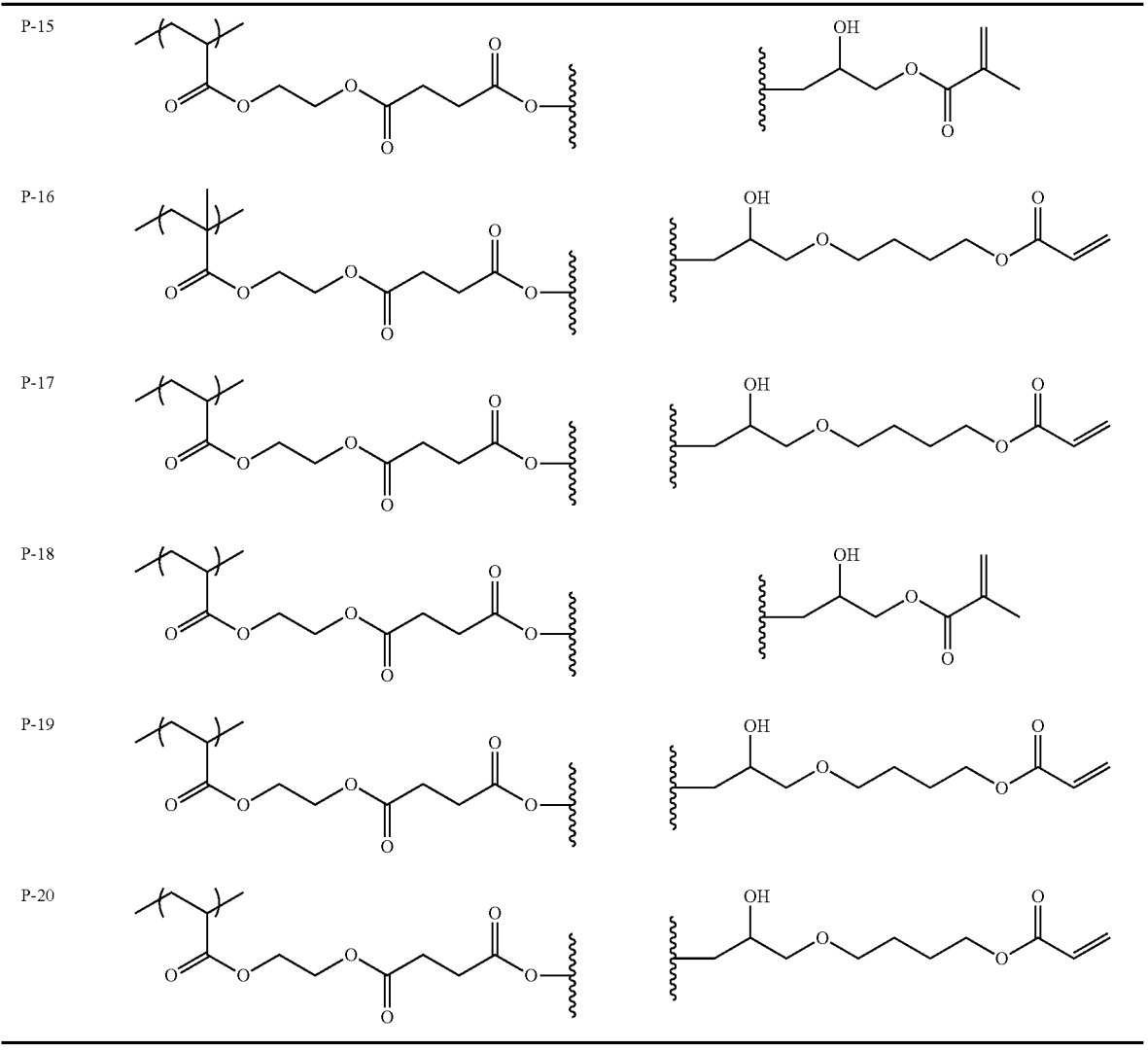
Structure A-1-2
P-13
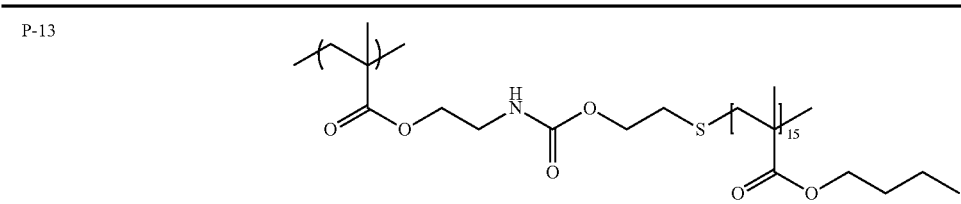
Mw 2485.27
P-14
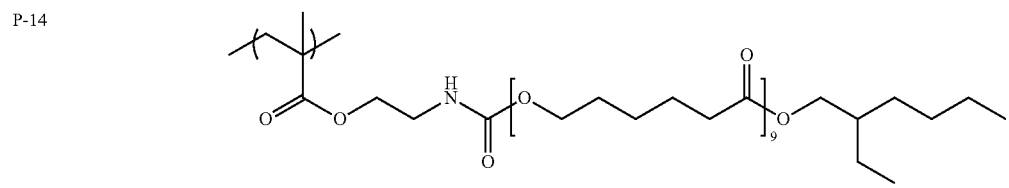
Mw 1270.62

TABLE 2-continued
P-15
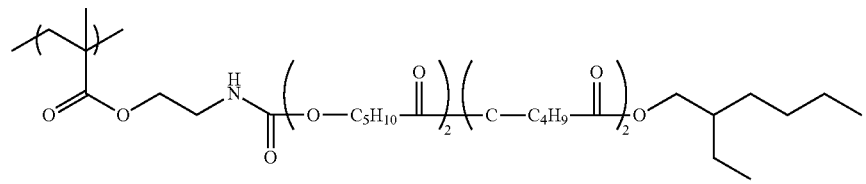
Mw: 2484.1
P-16
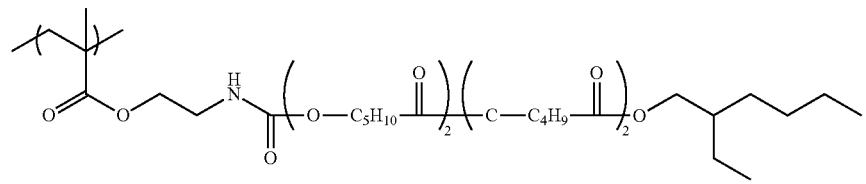
Mw: 2484.1
P-17
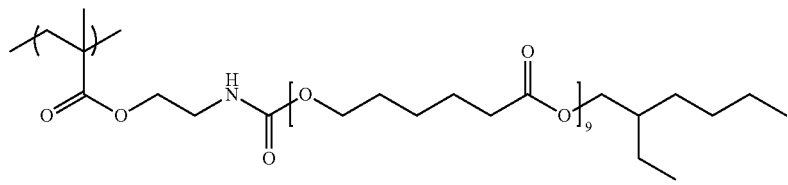
Mw: 1270.62
P-18
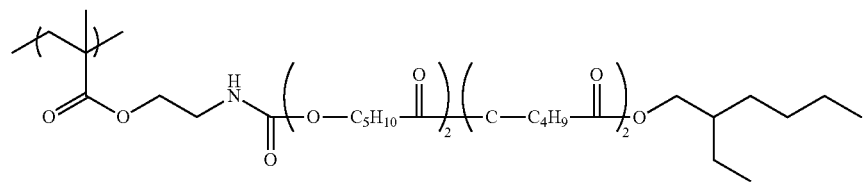
Mw: 2484.1
P-19
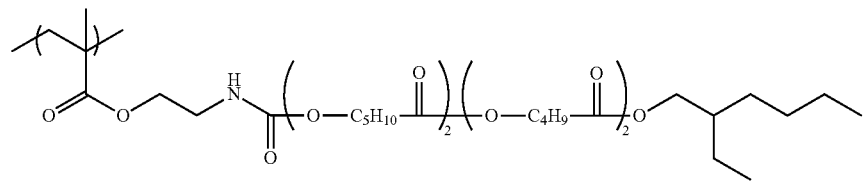
Mw: 2484.1
P-20
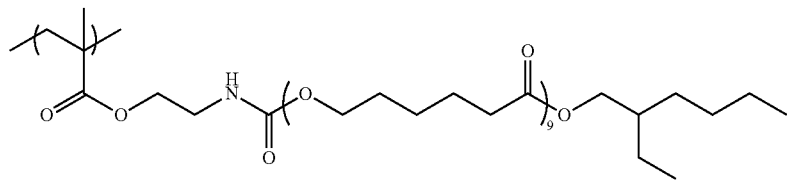
Mw 1270.62

TABLE 2-continued

| | Structure | | Properties | | Molar Ratio [mol %] | | |
|---|---|---|---|---|---|---|---|
| | A-1-3 | Mw | Acid Value [mg/KOH/g] | C=50 C Value [mmol/g] | A-1-1 | A-1-2 | A-1-3 |
| P-13 | ![structure] | 23000 | 78 | 0.7 | 32% | 6% | 64% |
| P-14 | none | 18000 | — | 0.7 | 58% | 42% | 0% |
| P-15 | ![structure] | 21000 | 78 | 0.7 | 31% | 7% | 62% |
| P-16 | ![structure] | 22000 | 78 | 0.7 | 31% | 7% | 62% |
| P-17 | ![structure] | 18000 | 78 | 0.7 | 20% | 13% | 62% |
| P-18 | ![structure] | 20000 | 78 | 0.7 | 31% | 7% | 62% |
| P-19 | ![structure] | 21000 | 78 | 0.7 | 31% | 7% | 62% |
| P-20 | ![structure] | 20000 | 78 | 0.7 | 29% | 13% | 68% |

TABLE 3
| | Structure A-1-1 | |
|---|---|---|
| | | C=C Group Structure |
| P-21 | 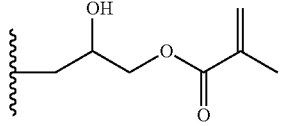 [SMILES: *CC(O)COC(=O)C(=C)C] | 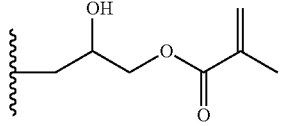 [SMILES: *CC(O)COC(=O)C(=C)C] |
| P-22 | 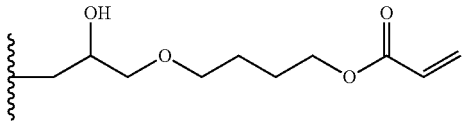 [SMILES: *CC(O)COCCCCOC(=O)C=C] | 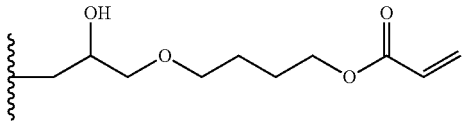 [SMILES: *CC(O)COCCCCOC(=O)C=C] |
| P-23 | 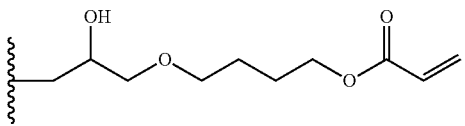 [SMILES: *CC(O)COCCCCOC(=O)C=C] | 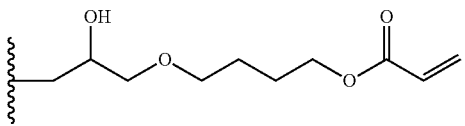 [SMILES: *CC(O)COCCCCOC(=O)C=C] |
| P-24 | 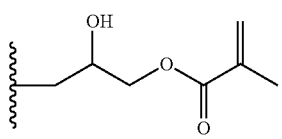 [SMILES: *CC(O)COC(=O)C(=C)C] | 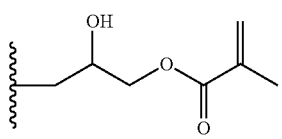 [SMILES: *CC(O)COC(=O)C(=C)C] |
| P-25 | 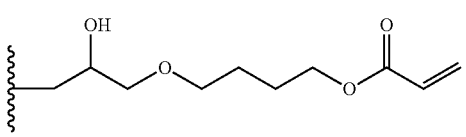 [SMILES: *CC(O)COCCCCOC(=O)C=C] | 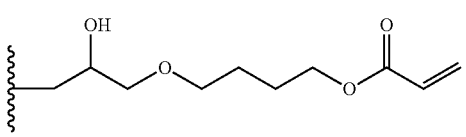 [SMILES: *CC(O)COCCCCOC(=O)C=C] |
| P-26 | 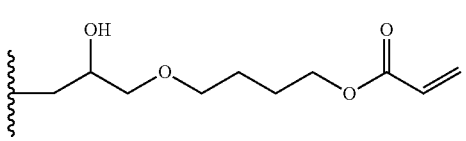 [SMILES: *CC(O)COCCCCOC(=O)C=C] | 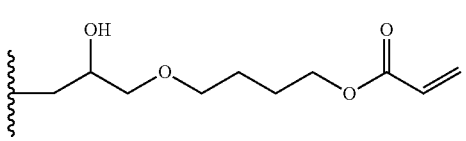 [SMILES: *CC(O)COCCCCOC(=O)C=C] |
| P-27 | 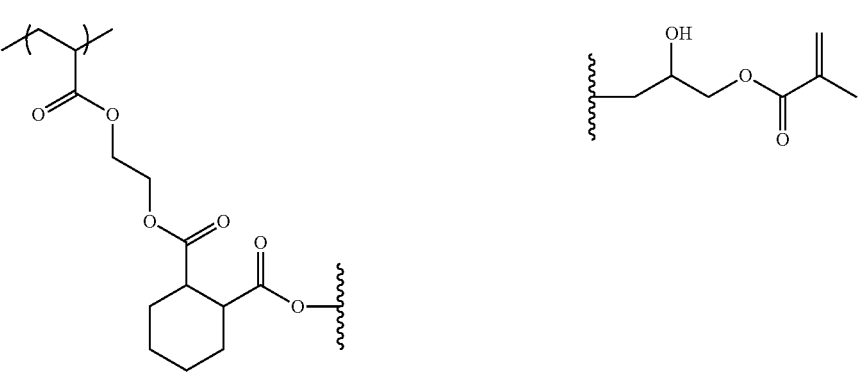 | 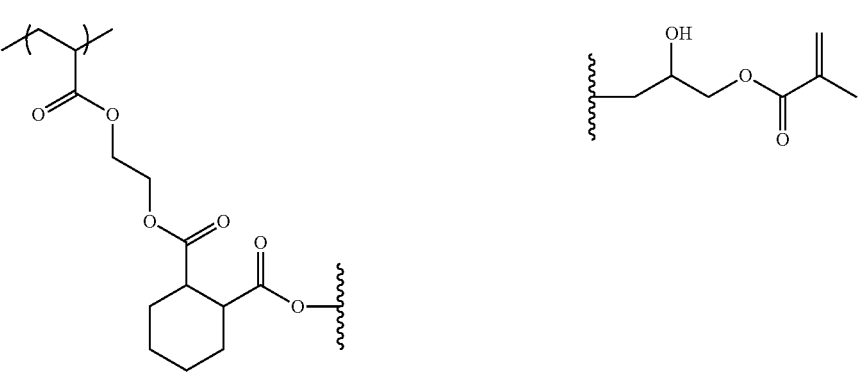 |

TABLE 3-continued
Structure
A-1-2
P-21
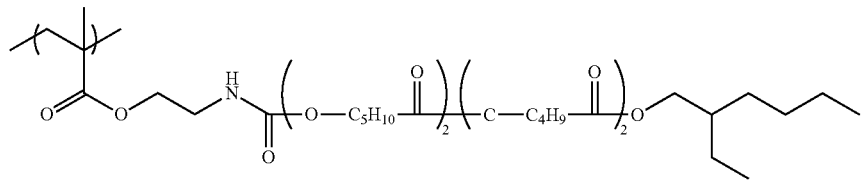
Mw: 2484.1
P-22
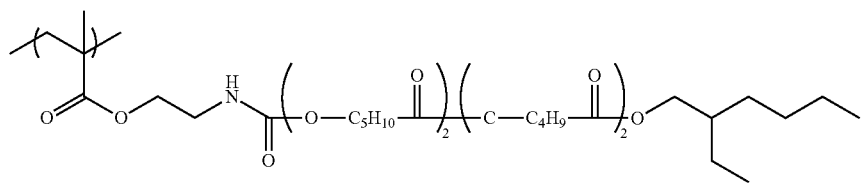
Mw: 2484.1
P-23
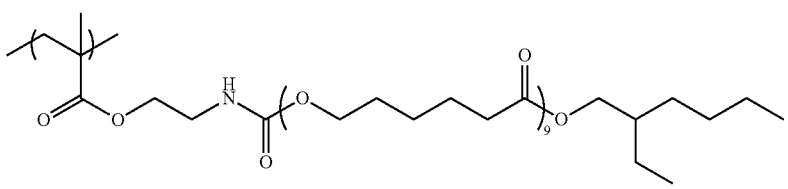
Mw 1270.62
P-24
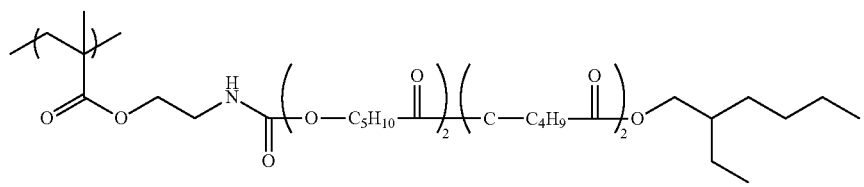
Mw: 2484.1
P-25
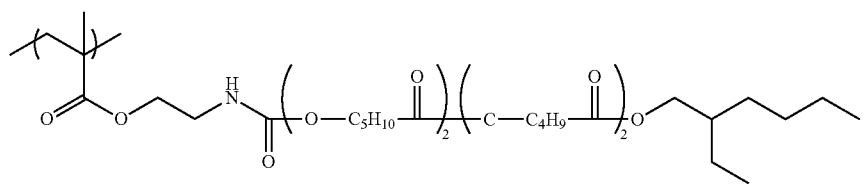
Mw: 2484.1
P-26
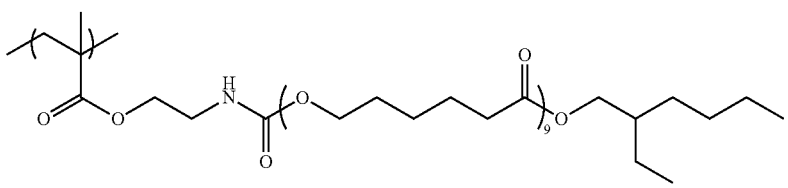
Mw 1270.62

TABLE 3-continued
P-27 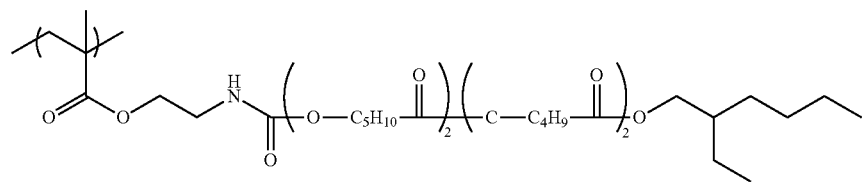
Mw: 2484.1
| | Structure | Properties | | | Molar Ratio [mol %] | | |
|---|---|---|---|---|---|---|---|
| | | | Acid Value | C=C Value | | | |
| | A-1-3 | Mw | [mgKOH/g] | [mmol/g] | A-1- | A-1-2 | A-1-3 |
| P-21 | | 22000 | 76 | 0.7 | 80% | 10% | 60% |
| P-22 | | 20000 | 78 | 0.7 | 30% | 10% | 60% |
| P-23 | | 21000 | 78 | 0.7 | 28% | 17% | 55% |
| P-24 | | 18000 | 78 | 0.7 | 31% | 13% | 56% |
| P-25 | | 21000 | 78 | 0.7 | 31% | 3% | 56% |
| P-26 | | 22000 | 78 | 0.7 | 28% | 22% | 50% |
| P-27 | | 20000 | 78 | 0.7 | 32% | 6% | 62% |

TABLE 4
| | Structure A-1-1 | C=C Group Structure |
|---|---|---|
| P-28 | 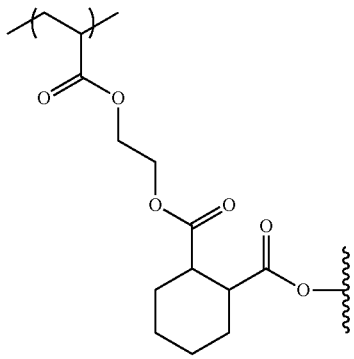 | 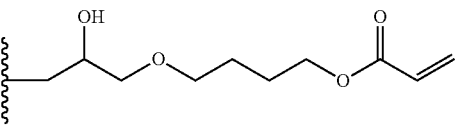 [SMILES: *CC(O)COCCCCOC(=O)C=C] |
| P-29 | 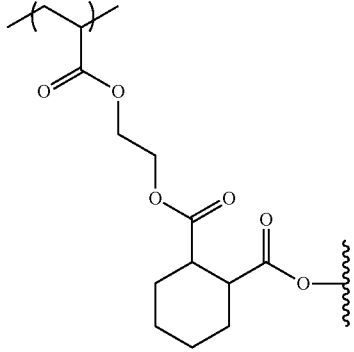 | 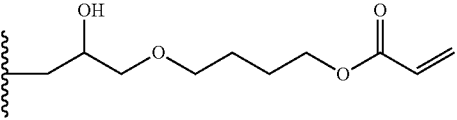 [SMILES: *CC(O)COCCCCOC(=O)C=C] |
| P-30 | 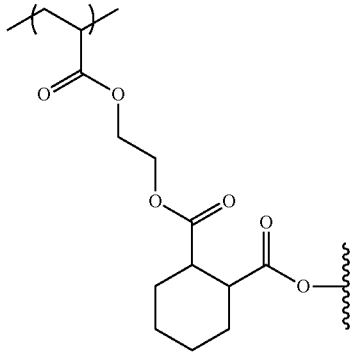 | 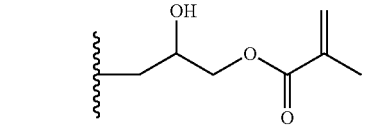 [SMILES: *CC(O)COC(=O)C(=C)C] |
| P-31 | 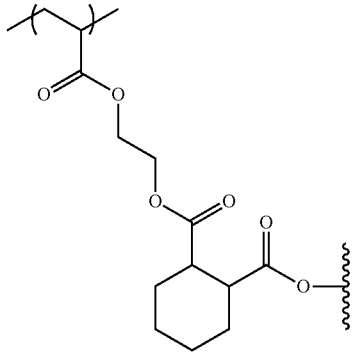 | 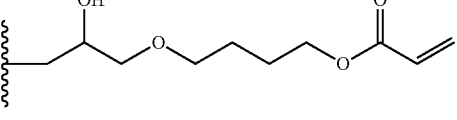 |

TABLE 4-continued
| | Structure A-1-2 |
|---|---|
| P-28 | 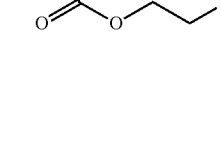<br>Mw: 2484.1 |
| P-29 | 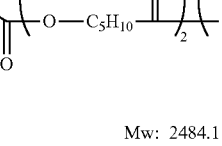<br>Mw 1270.62 |
| P-30 | 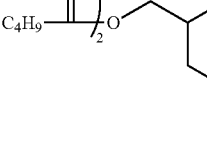<br>Mw: 2484.1 |
| P-31 | <br>Mw: 2484.1 |
| | Structure | | Properties | | | | |
|---|---|---|---|---|---|---|---|
| | | | Acid Value | C=C Value | Molar Ratio [mol %] | | |
| | A-1-3 | Mw | [mgKOH/g] | [mmol/G] | A-1-1 | A-1-2 | A-1-3 |
| P-28 | | 21000 | 78 | 0.7 | 32% | 5% | 63% |

TABLE 4-continued
| | | | | | | | |
|---|---|---|---|---|---|---|---|
| P-29 | 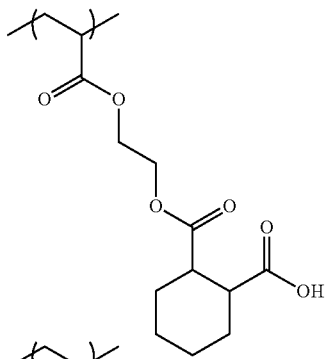 | 20000 | 78 | 0.7 | 30% | 10% | 60% |
| P-30 | 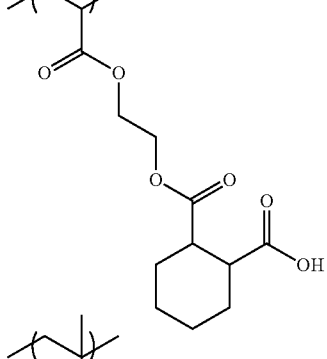 | 23000 | 78 | 0.7 | 32% | 6% | 62% |
| P-31 | 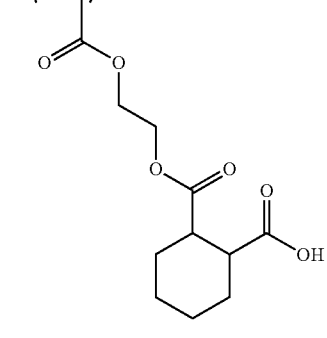 | 22000 | 78 | 0.7 | 32% | 6% | 62% |
TABLE 5
| | Structure A-1-1 | C=C Group Structure |
|---|---|---|
| P-32 | 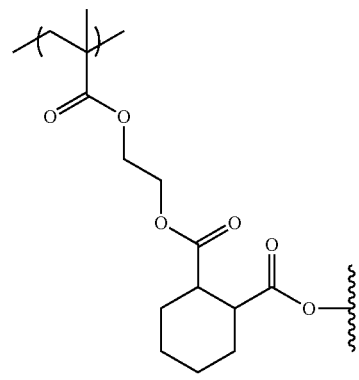 | 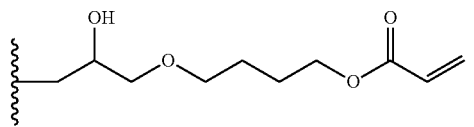 [SMILES: *CC(O)COCCCCOC(=O)C=C] |

TABLE 5-continued
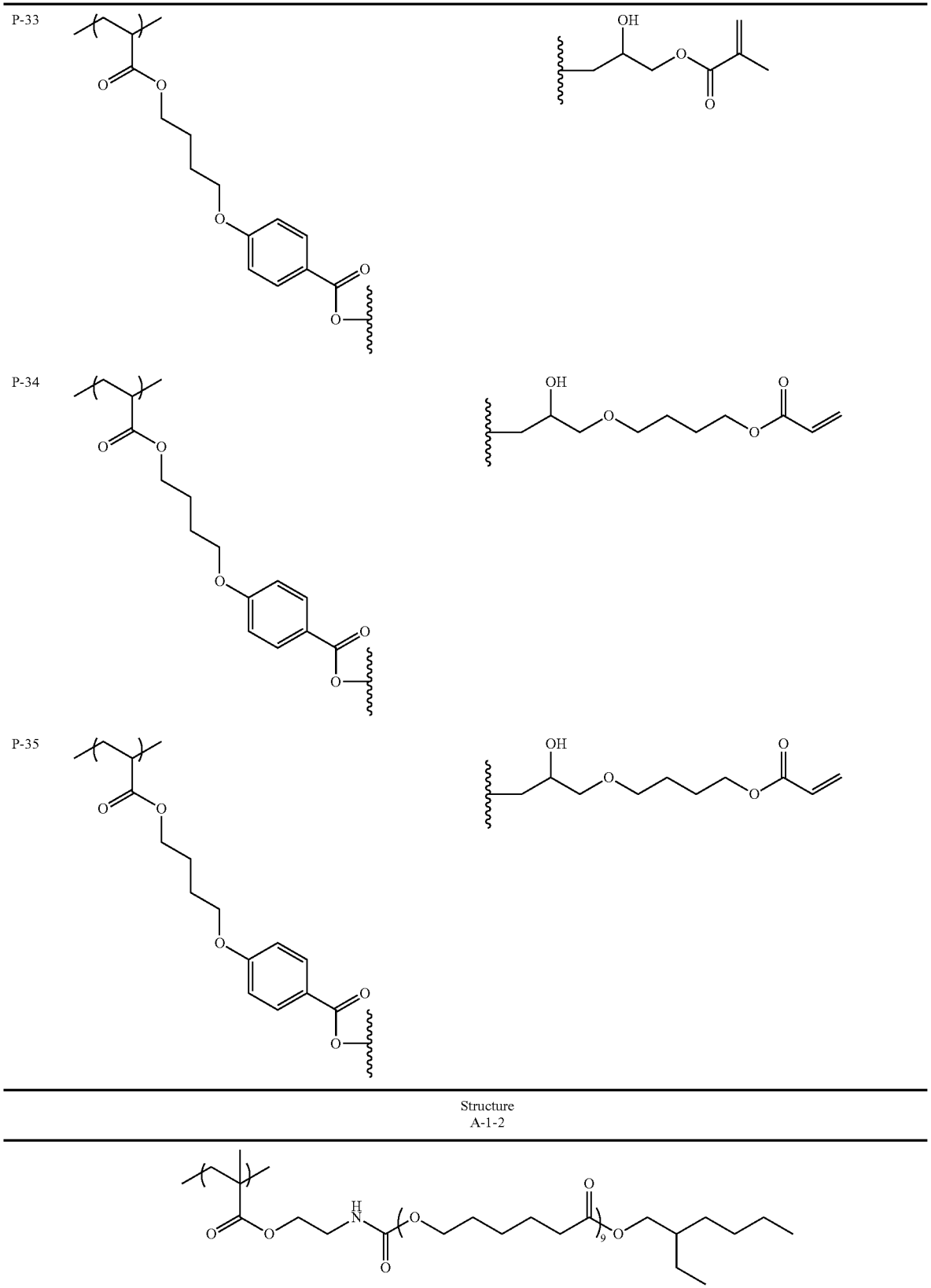
| | Structure |
|---|---|
| | A-1-2 |
Mw: 1270.62

TABLE 5-continued
P-33
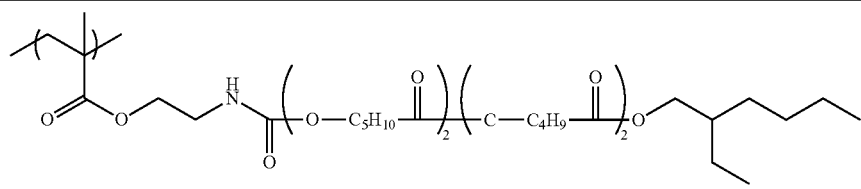
Mw: 2484.1
P-34
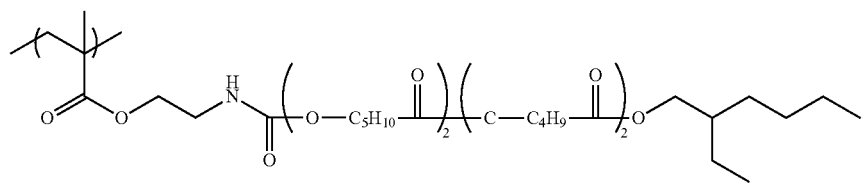
Mw: 2484.1
P-35
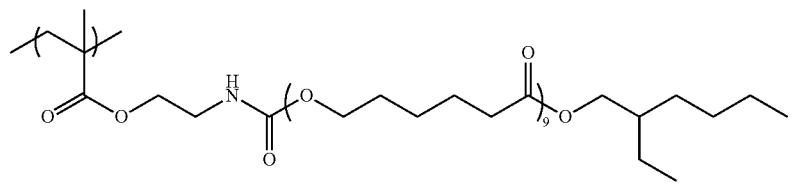
Mw: 1270.62
| Structure A-1-3 | | Properties | | Molar Ratio [mol %] | | |
|---|---|---|---|---|---|---|
| | Mw | Acid Value [mg/KOH/g] | C=Value [mmol/g] | A-1-1 | A-1-2 | A-1-3 |
| P-32 | 19000 | 78 | 0.7 | 31% | 9% | 60% |
| P-33 | 21000 | 78 | 0.7 | 31% | 6% | 62% |

TABLE 5-continued
| | | | | | | | |
|---|---|---|---|---|---|---|---|
| P-34 | 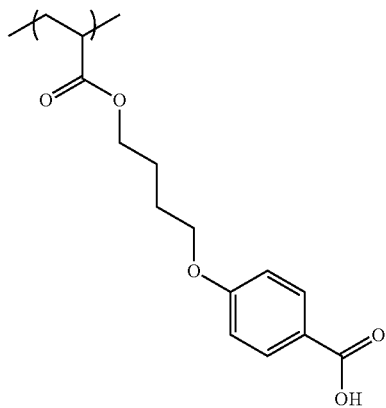 | 22000 | 78 | 0.7 | 32% | 6% | 83% |
| P-35 | 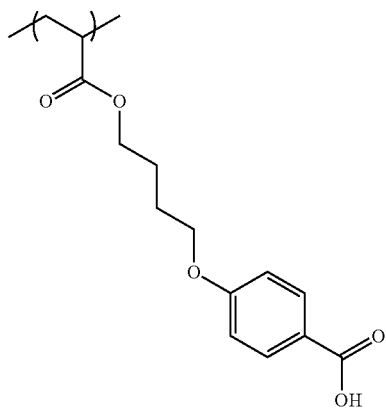 | 20000 | 78 | 0.7 | 30% | 10% | 80% |
TABLE 6
| | Structure | |
|---|---|---|
| | A-1-1 | C=C Group Structure |
| P-36 | 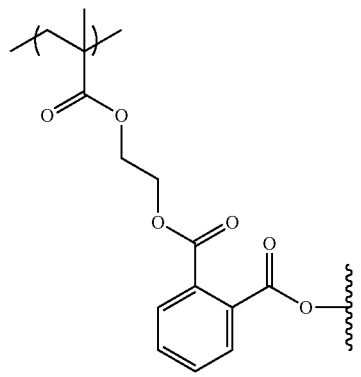 | 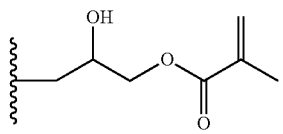 [SMILES: *CC(O)COC(=O)C(=C)C] |

TABLE 6-continued
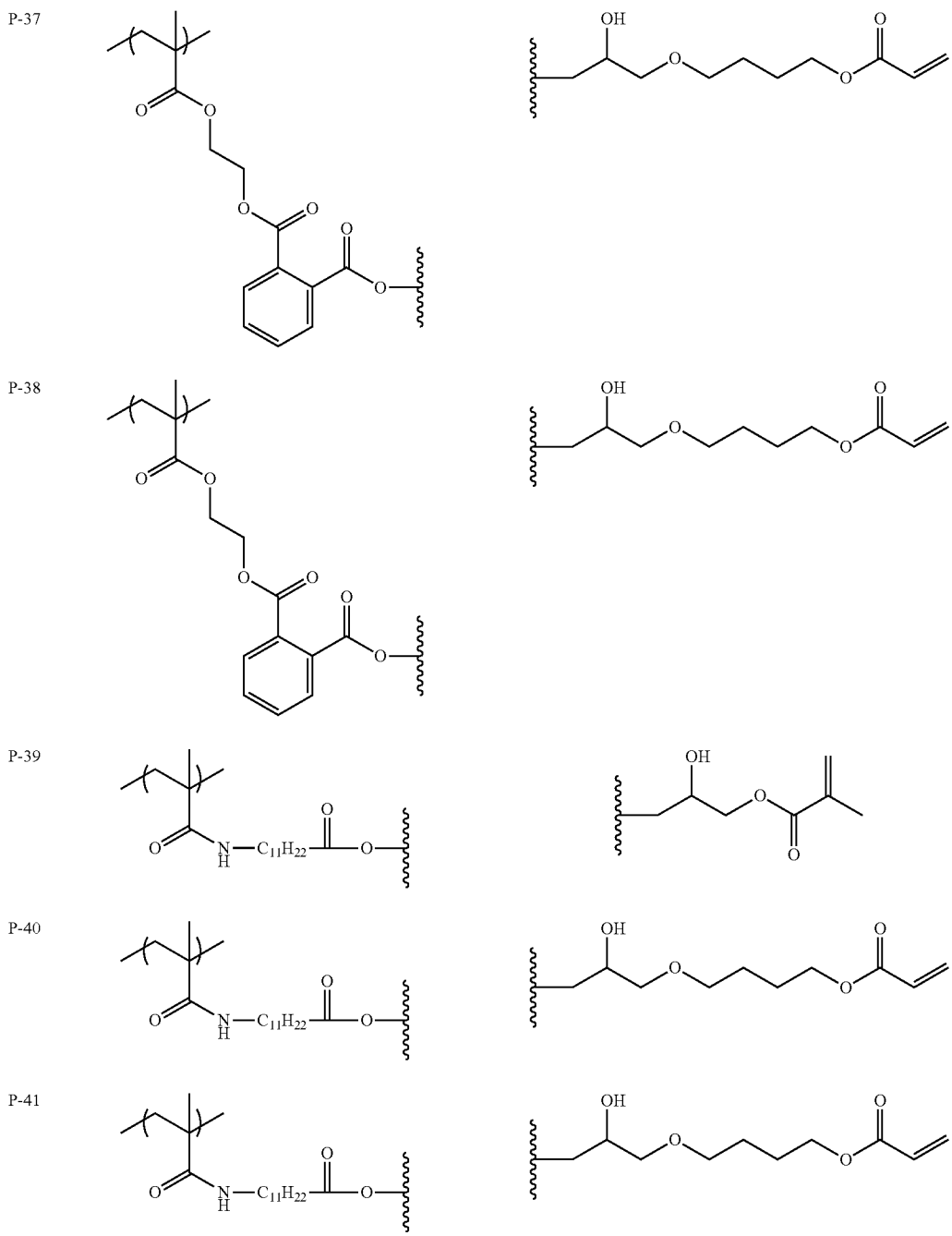
| | Structure<br>A-1-2 |
|---|---|
| P-36 | 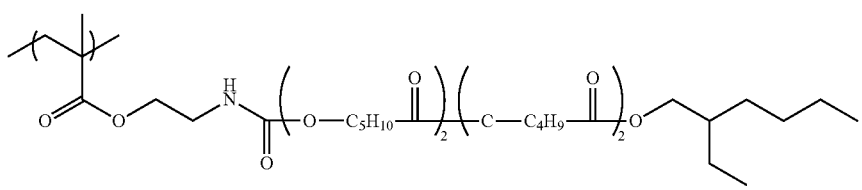 |
Mw: 2484.1

TABLE 6-continued
P-37
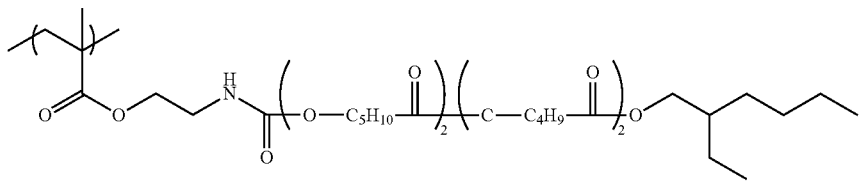
Mw: 2484.1
P-38
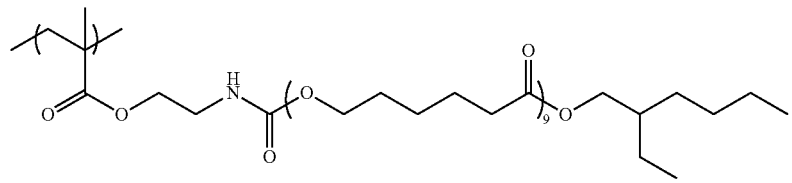
Mw: 1270.62
P-39
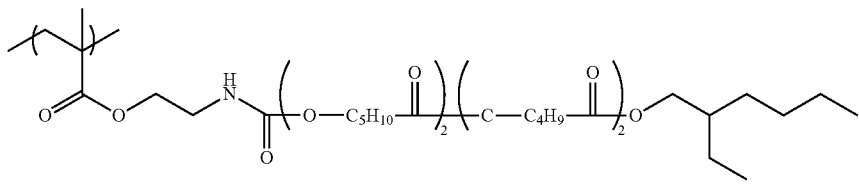
Mw: 2484.1
P-40
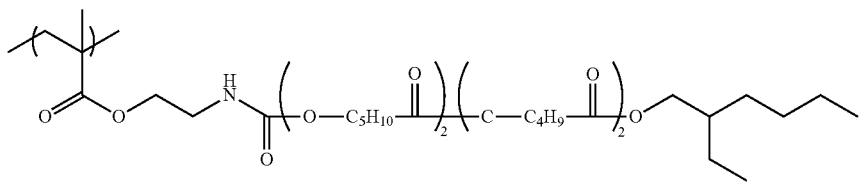
Mw: 2484.1
P-41
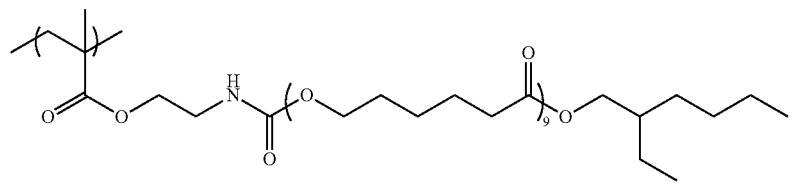
Mw: 1270.62

TABLE 6-continued

| | Structure | | Properties | | Molar Ratio [mol %] | | |
|---|---|---|---|---|---|---|---|
| | A-1-3 | Mw | Acid Value [Mg/KOH/g] | C=C Value [mmol/g] | A-1-1 | A-1-2 | A-1-3 |
| P-36 | (structure with ethylene glycol ester linked to phthalic acid) | 21000 | 78 | 0.7 | 32% | 6% | 62% |
| P-37 | (structure with ethylene glycol ester linked to phthalic acid) | 20000 | 78 | 0.7 | 32% | 5% | 63% |
| P-38 | (structure with ethylene glycol ester linked to phthalic acid) | 19000 | 78 | 0.7 | 30% | 10% | 60% |
| P-39 | (amide structure with $-C_{11}H_{22}-$ COOH) | 20000 | 78 | 0.7 | 32% | 9% | 63% |
| P-40 | (amide structure with $-C_{11}H_{22}-$ COOH) | 21000 | 78 | 0.7 | 32% | 6% | 63% |

TABLE 6-continued
| P-41 | 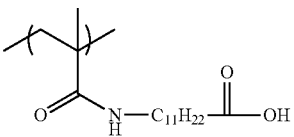 | 18000 | 76 | 0.7 | 30% | 9% | 60% |
-continued
P-42
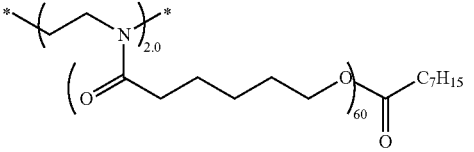

-continued
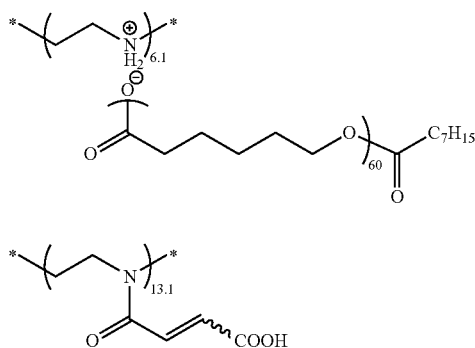
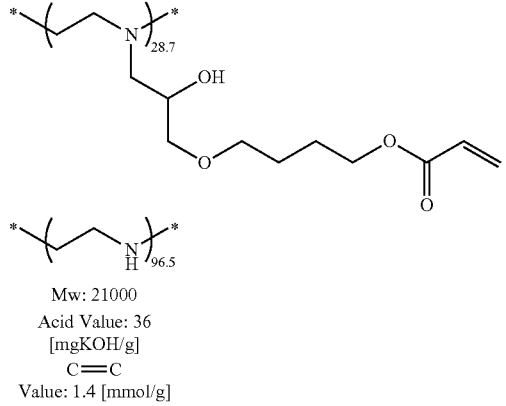
Mw: 21000
Acid Value: 36 [mgKOH/g]
C=C Value: 1.4 [mmol/g]
TABLE 7
| | Structure A-1-1 | C=C Group Structure |
|---|---|---|
| P-46 | | |
| P-47 | | |
| P-48 | | |
| P-49 | | |
| P-50 | | |

TABLE 7-continued
| | | |
|---|---|---|
| P-51 | 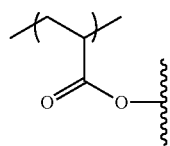 | 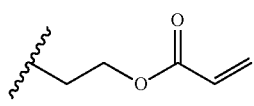 [SMILES: *CCOC(=O)C=C] |
| P-52 | 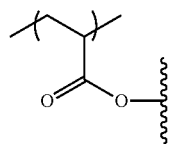 | |
| P-53 | 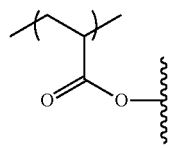 | |
Structure
A-1-2
P-46
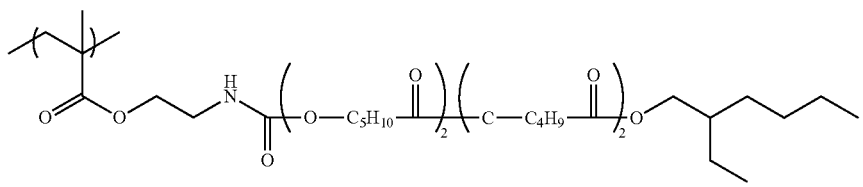
Mw: 2484.1
P-47
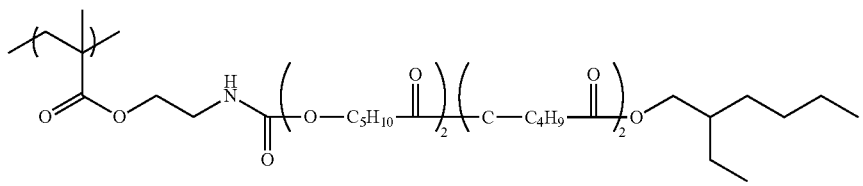
Mw: 2484.1
P-48
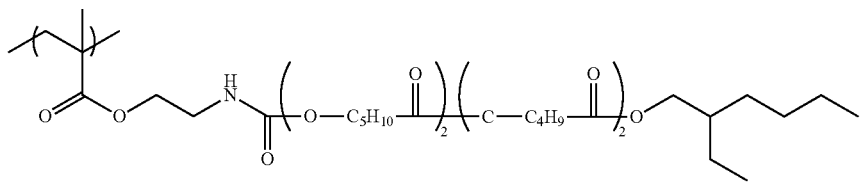
Mw: 2484.1
P-49
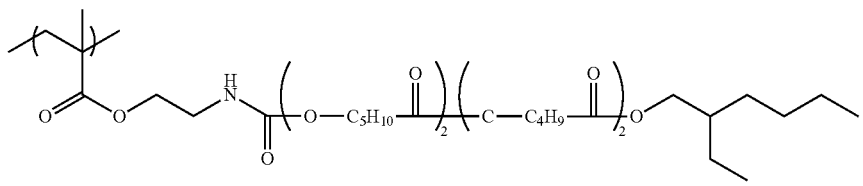
Mw: 2484.1

TABLE 7-continued
P-50
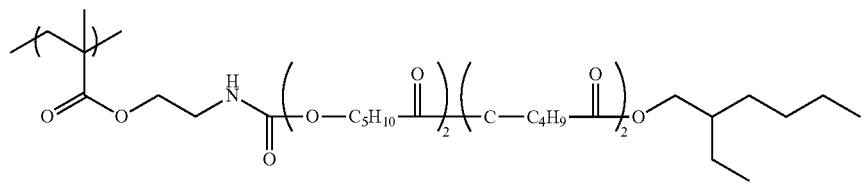
Mw: 2484.1
P-51
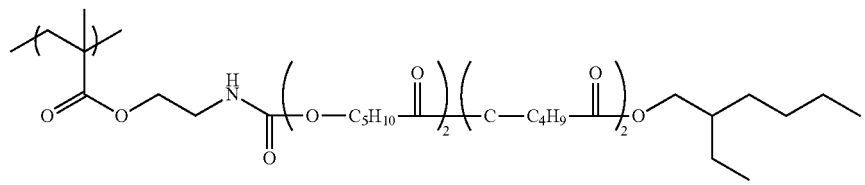
Mw: 2484.1
P-52
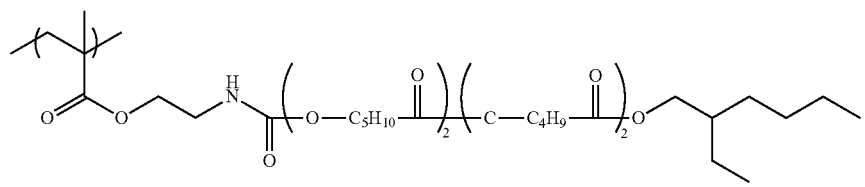
Mw: 2484.1
P-53
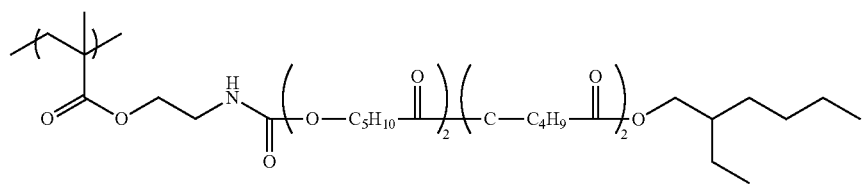
Mw: 2484.1
| Structure | | Properties | | Molar Ratio [mol %] | | |
|---|---|---|---|---|---|---|
| | | Acid Value | C=Value | | | |
| A-1-3 | Mw | [mg/KOH/g] | [mmol/g] | A-1-1 | A-1-2 | A-1-3 |
| P-46 | 21000 | 78 | 0.7 | 32% | 8% | 68% |
| P-47 | 18000 | 78 | 0.7 | 32% | 5% | 63% |
| P-48 | 22000 | 24 | 0.7 | 62% | 18% | 32% |

TABLE 7-continued
| | | | | | | | |
|---|---|---|---|---|---|---|---|
| P-49 | | 21000 | 104 | 0.47 | 25% | 9% | 65% |
| P-50 | | 20000 | 165 | 0.7 | 15% | 5% | 75% |
| P-51 | | 22000 | 78 | 1.4 | 48% | 5% | 47% |
| P-52 | | 18000 | 78 | 2.1 | 58% | 2% | 39% |
| P-53 | | 18000 | 78 | 2.0 | 67% | 3% | 31% |
Specific examples of the compound (SP-1) include compounds having the following structures.
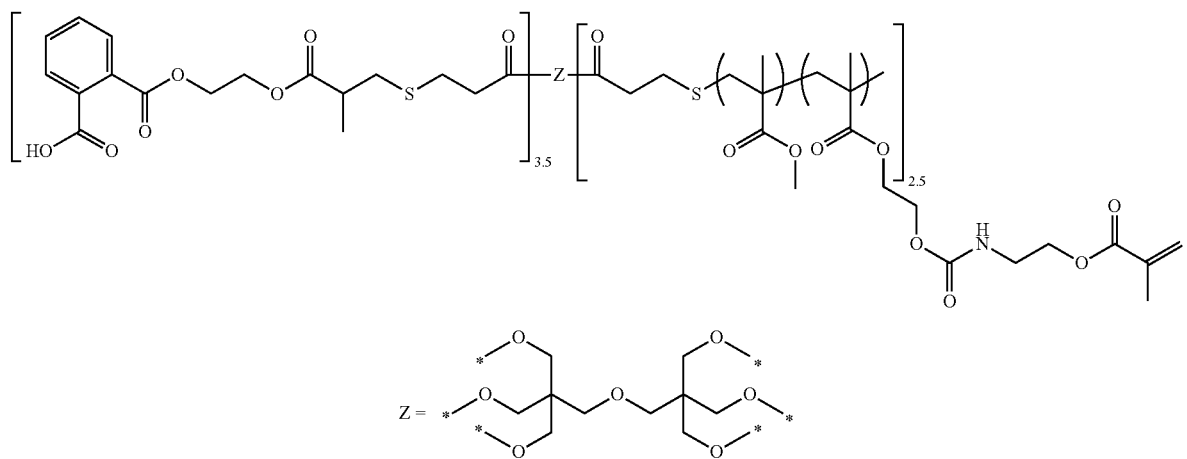

-continued
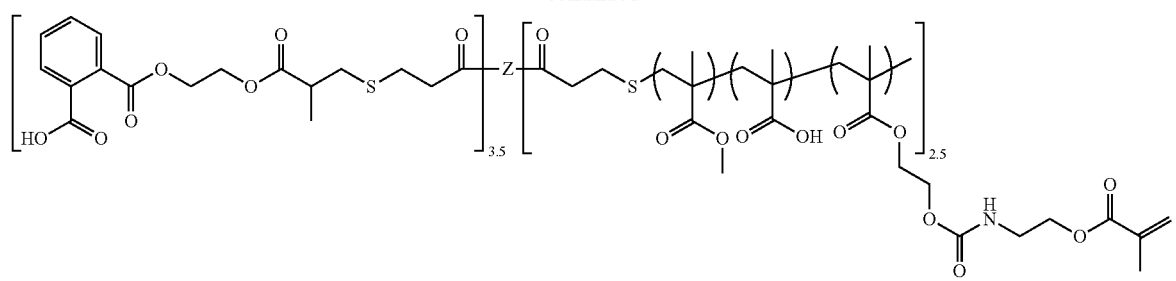
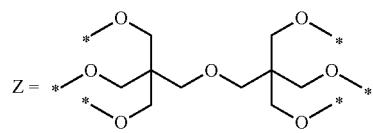
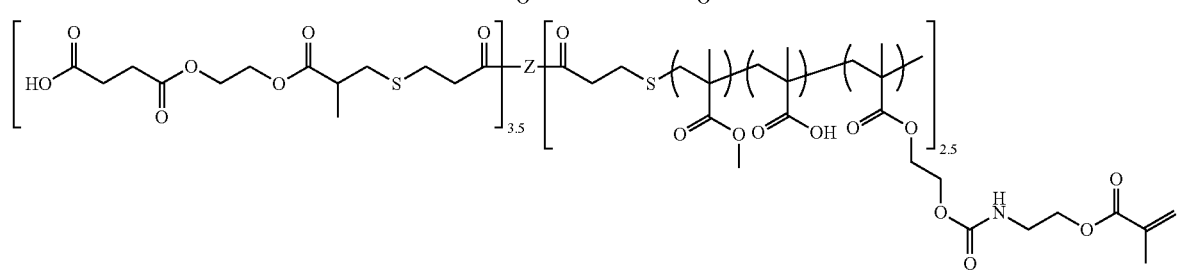
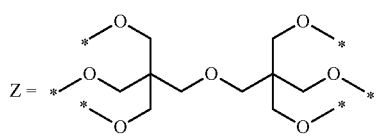
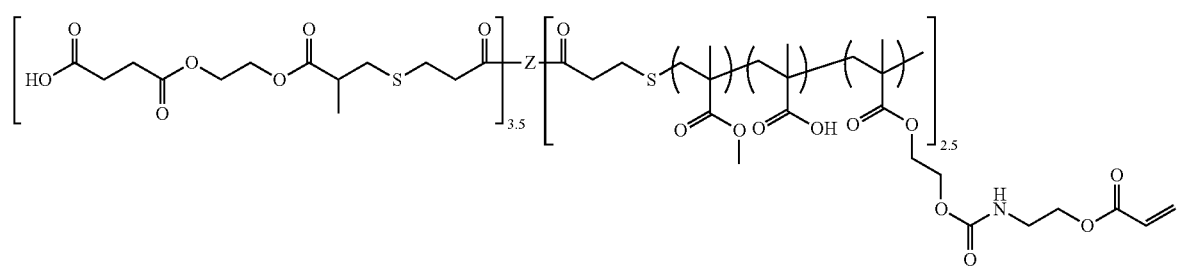
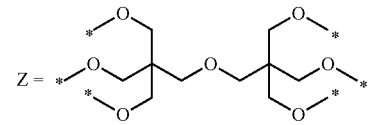
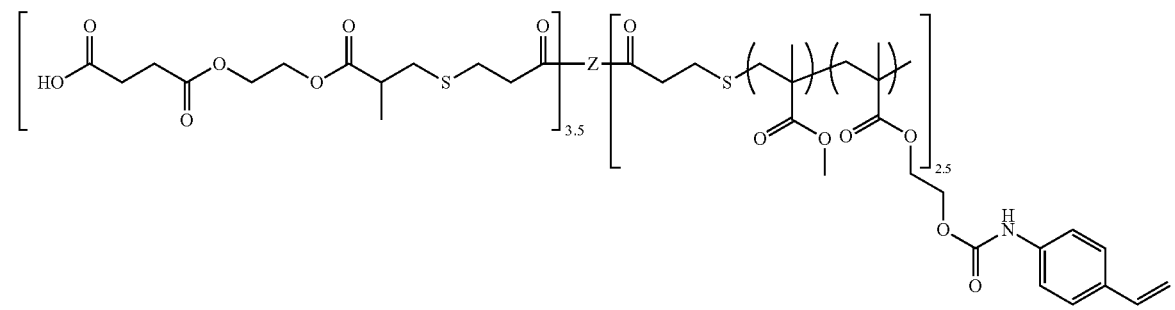
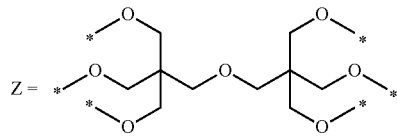

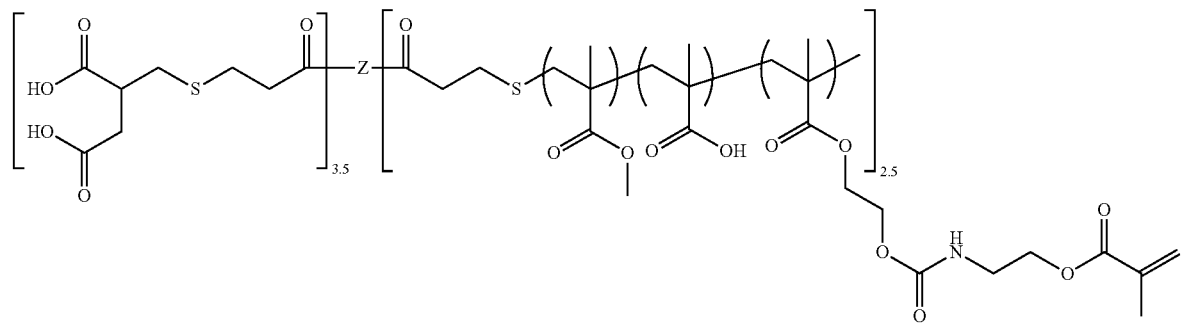
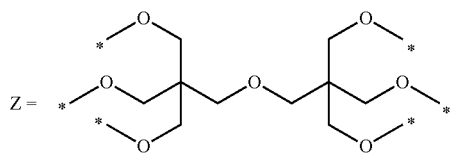
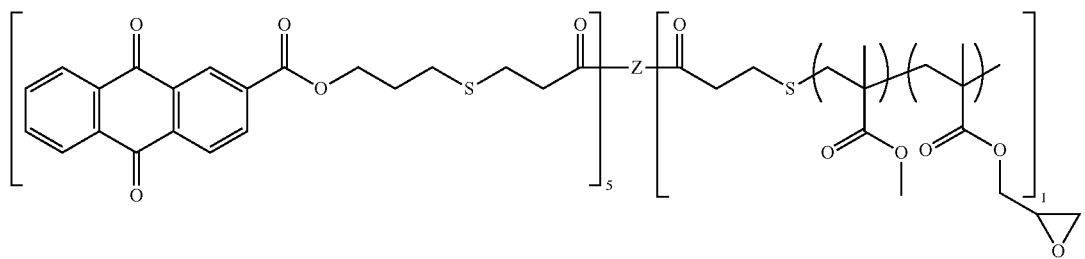
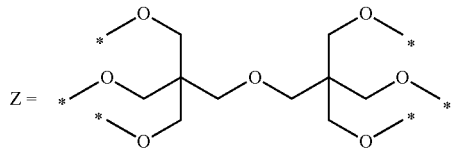
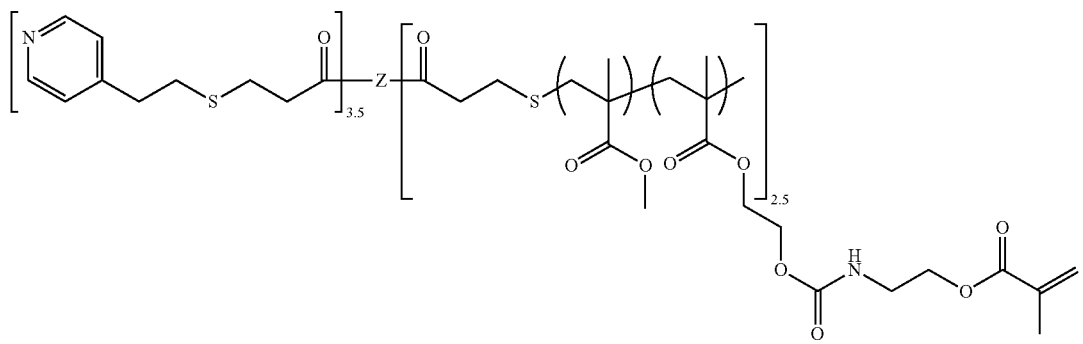
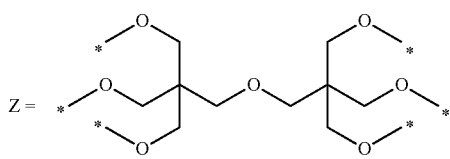

-continued
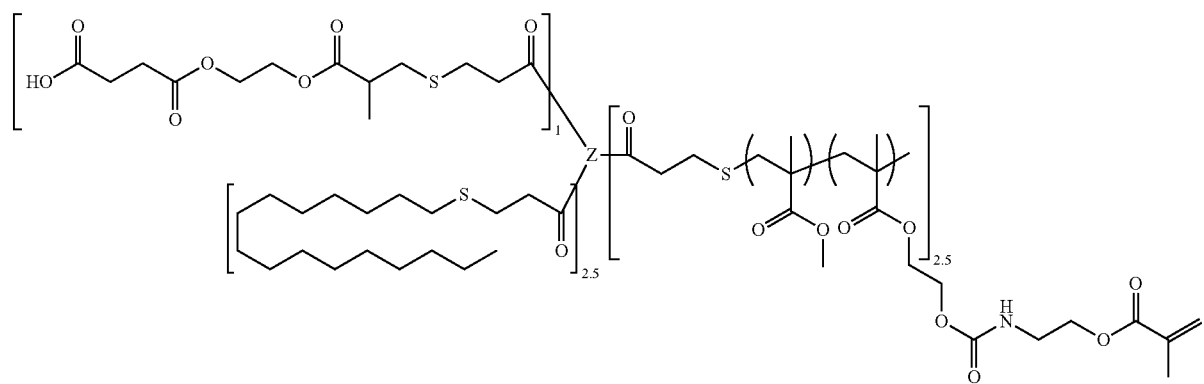
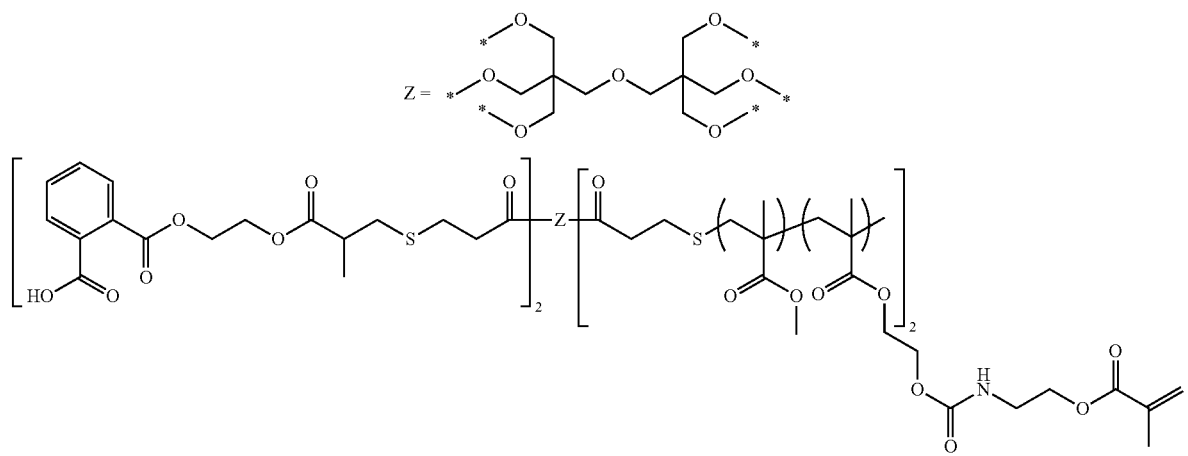
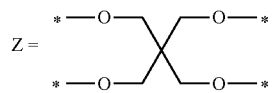
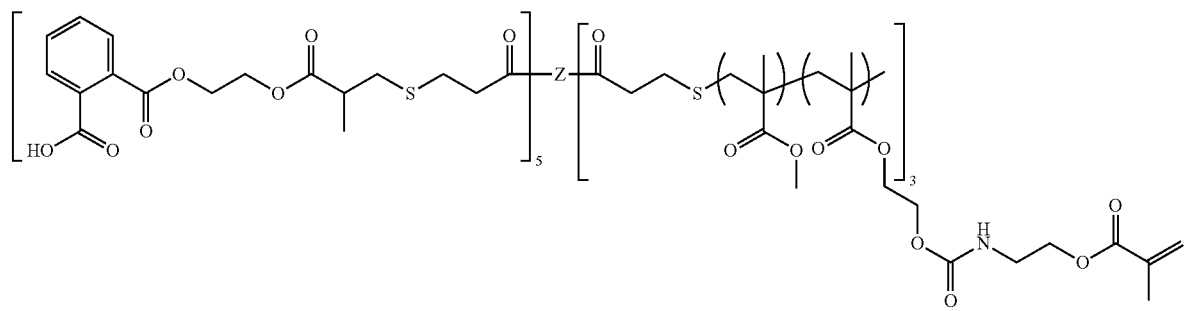
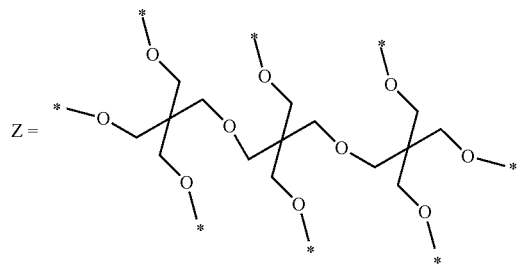

-continued
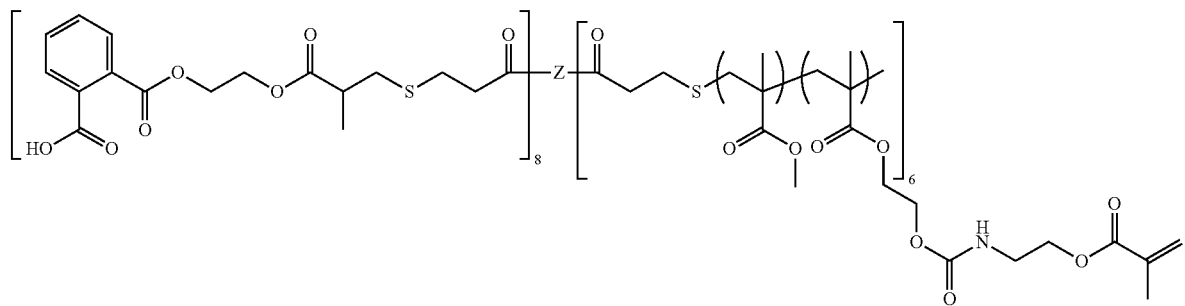
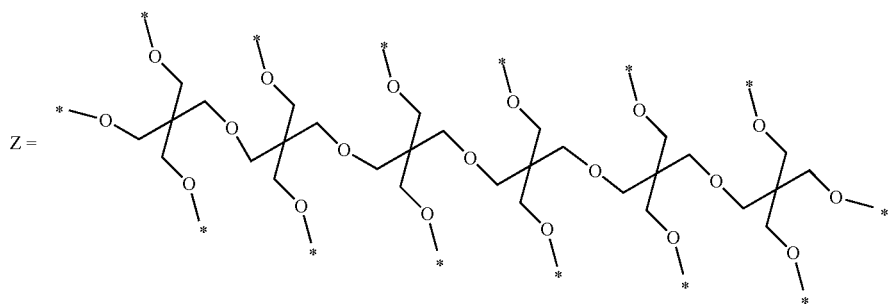
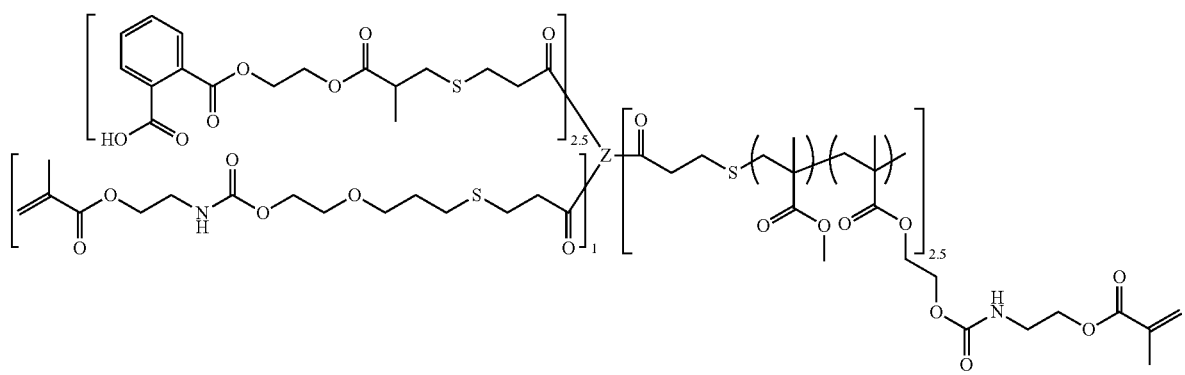
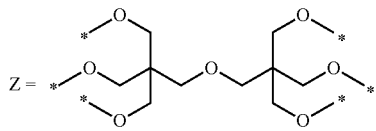
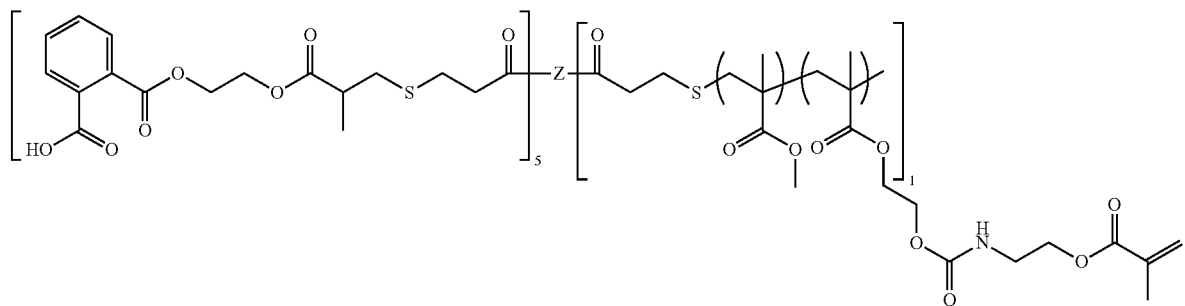
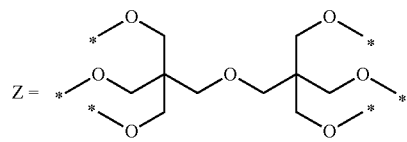

In addition, specific examples of the other radically polymerizable compound C1 include compounds having the following structures.

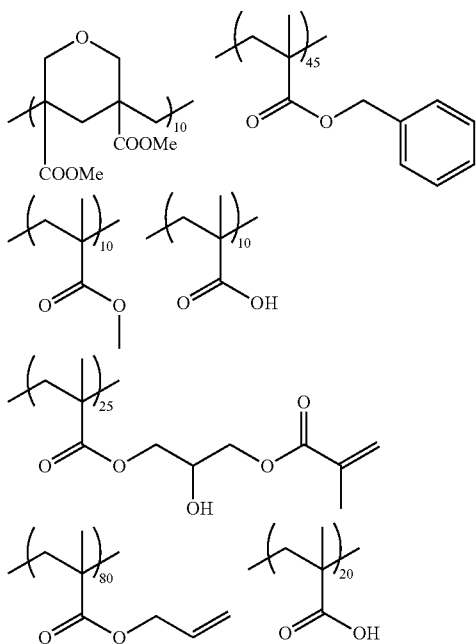

In the photosensitive composition according to the embodiment of the present invention, the content of the radically polymerizable compound C1 is 70 mass % or higher, preferably 80 mass % or higher, more preferably 85 mass % or higher, still more preferably 90 mass % or higher, still more preferably 93 mass % or higher, and still more preferably 95 mass % or higher with respect to the total mass of the radically polymerizable compound C. As the radically polymerizable compound C1, one kind may be used alone, or two or more kinds may be used. In a case where the photosensitive composition includes two or more radically polymerizable compounds C1, it is preferable that the total content of the two or more radically polymerizable compounds C1 is in the above-described range.

In the present invention, only the radically polymerizable compound C1 may be used as the radically polymerizable compound C. It is preferable that the radically polymerizable compound C1 and a radically polymerizable compound C2 having a molecular weight of lower than 3000 (hereinafter, also referred to as "radically polymerizable compound C2) are used in combination. It is presumed that, by using the radically polymerizable compound C1 and the radically polymerizable compound C2 in combination, during the polymerization of the radically polymerizable compound C1, the radically polymerizable compound C2 that is a compound having a lower molecular weight than the radically polymerizable compound C1 functions to link the radically polymerizable compounds to each other such that curing progresses. As a result, the radically polymerizable compound C1 in the exposed portion can be easily more efficiently cured, and higher photolithographic properties can be easily obtained. Further, the solvent resistance, moisture resistance, thermal diffusivity resistance, and the like of the obtained film can be easily further improved.

(Radically Polymerizable Compound C2)

Next, the radically polymerizable compound C2 will be described. The molecular weight of the radically polymerizable compound C2 is preferably 2000 or lower and more preferably 1500 or lower. The lower limit is preferably 100 or higher, more preferably 150 or higher, and still more preferably 200 or higher. The radically polymerizable compound C2 is preferably a compound having two or more ethylenically unsaturated bond groups (compound having two or more functional groups), more preferably a compound having 2 to 15 ethylenically unsaturated bond groups (compound having 2 to 15 functional groups), still more preferably a compound having 2 to 10 ethylenically unsaturated bond groups (compound having 2 to 10 functional groups), and still more preferably a compound having 2 to 6 ethylenically unsaturated bond groups (compound having 2 to 6 functional groups). Specifically, the radically polymerizable compound C2 is preferably a (meth)acrylate compound having two or more functional groups, more preferably a (meth)acrylate compound having 2 to 15 functional groups, still more preferably a (meth)acrylate compound having 2 to 10 functional groups, and still more preferably a (meth)acrylate compound having 2 to 6 functional groups. The C=C value of the radically polymerizable compound C2 is preferably 2 mmol/g or higher, more preferably 6 mmol/g or higher, and still more preferably 10 mol/g or higher. The upper limit is preferably 30 mmol/g or lower. The C=C value of the radically polymerizable compound C2 is a value calculated by dividing the number of ethylenically unsaturated bond groups in one molecule of the radically polymerizable compound C2 by the molecular weight of the radically polymerizable compound C2.

The details of the radically polymerizable compound C2 can be found in paragraphs "0033" and "0034" of JP2013-253224A, paragraphs "0095" to "0108" of JP2009-288705A, paragraph "0227" of JP2013-029760A, and paragraphs "0254" to "0257" of JP2008-292970A, the content of which is incorporated herein by reference. In addition, examples of the radically polymerizable compound C2 include ethyleneoxy-modified pentaerythritol tetraacrylate (as a commercially available product, NK ESTER ATM-35E manufactured by Shin-Nakamura Chemical Co., Ltd.), dipentaerythritol triacrylate (as a commercially available product, KAYARAD D-330 manufactured by Nippon Kayaku Co., Ltd.), dipentaerythritol tetraacrylate (as a commercially available product, KAYARAD D-320 manufactured by Nippon Kayaku Co., Ltd.), dipentaerythritol penta(meth)acrylate (as a commercially available product, KAYARAD D-310 manufactured by Nippon Kayaku Co., Ltd.), dipentaerythritol hexa(meth)acrylate (as a commercially available product, KAYARAD DPHA manufactured by Nippon Kayaku Co., Ltd., A-DPH-12E, manufactured by Shin-Nakamura Chemical Co., Ltd.), a compound having a structure in which the (meth)acryloyl group is bonded through an ethylene glycol residue and/or a propylene glycol residue, and a polymerizable monomer in paragraph "0477" of JP2012-208494A (paragraph "0585" of corresponding US2012/0235099A). In addition, for example, diglycerin ethylene oxide (EO)-modified (meth)acrylate (as a commercially available product, M-460 manufactured by Toagosei Co., Ltd.), pentaerythritol tetraacrylate (A-TMMT manufactured by Shin-Nakamura Chemical Co., Ltd.), 1,6-hexanediol diacrylate (KAYARAD HDDA manufactured by Nippon Kayaku Co., Ltd.), RP-1040 (manufactured by Nippon Kayaku Co., Ltd.), or ARONIX TO-2349 (manufactured by Toagosei Co., Ltd.) can also be used.

As the radically polymerizable compound C2, a compound having an acid group such as a carboxyl group, a sulfo group, or a phosphate group can also be used. Examples of a commercially available product include ARONIX M-305, M-510, and M-520 (manufactured by Toagosei Co., Ltd.). In addition, as the radically polymerizable compound C2, a radically polymerizable compound having a caprolactone structure can also be used.

In addition, as the radically polymerizable compound C2, a radically polymerizable compound having a fluorene skeleton can also be used. It is preferable that the radically polymerizable compound having a fluorene skeleton is a radically polymerizable compound having a partial structure represented by Formula (Fr). In addition, the radically polymerizable compound having a fluorene skeleton is preferably a compound having two or more ethylenically unsaturated bond groups, more preferably a compound having 2 to 15 ethylenically unsaturated bond groups, still more preferably a compound having 2 to 10 ethylenically unsaturated bond groups, and still more preferably a compound having 2 to 6 ethylenically unsaturated bond groups. Specific examples of the radically polymerizable compound having a fluorene skeleton include a compound having the following structure. In addition, examples of a commercially available product of the radically polymerizable compound having a fluorene skeleton include OGSOL EA-0200 and EA-0300 (manufactured by Osaka Gas Chemicals Co., Ltd., a (meth) acrylate monomer having a fluorene skeleton).

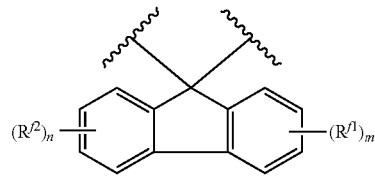
(Fr)

In the formula, a wave line represents a direct bond, $R^{f1}$ and $R^{f2}$ each independently represent a substituent, and m and n each independently represent an integer of 0 to 5. In a case where m represents 2 or more, m $R^{f1}$'s may be the same as or different from each other, or two $R^{f1}$'s among m $R^{f1}$'s may be bonded to each other to form a ring. In a case where n represents 2 or more, n $R^{f2}$'s may be the same as or different from each other, or two $R^{f2}$'s among n $R^{e}$'s may be bonded to each other to form a ring. Examples of the substituent represented by $R^{f1}$ and $R^{f2}$ include a halogen atom, a cyano group, a nitro group, an alkyl group, an aryl group, a heteroaryl group, —$OR^{f11}$, —$COR^{f12}$, —$COOR^{f13}$, —$OCOR^{f14}$, —$NR^{f15}R^{f16}$, —$NHCOR^{f17}$, —$CONR^{f18}R^{f19}$, —$NHCONR^{f20}R^{f21}$, —$NHCOOR^{f22}$, —$SR^{f23}$, —$SO_2R^{f24}$, —$SO_2OR^{f25}$, —$NHSO_2R^{f26}$, and —$SO_2NR^{f27}R^{f28}$. $R^{f11}$ to $R^{f28}$ each independently represents a hydrogen atom, an alkyl group, an aryl group, or a heteroaryl group.

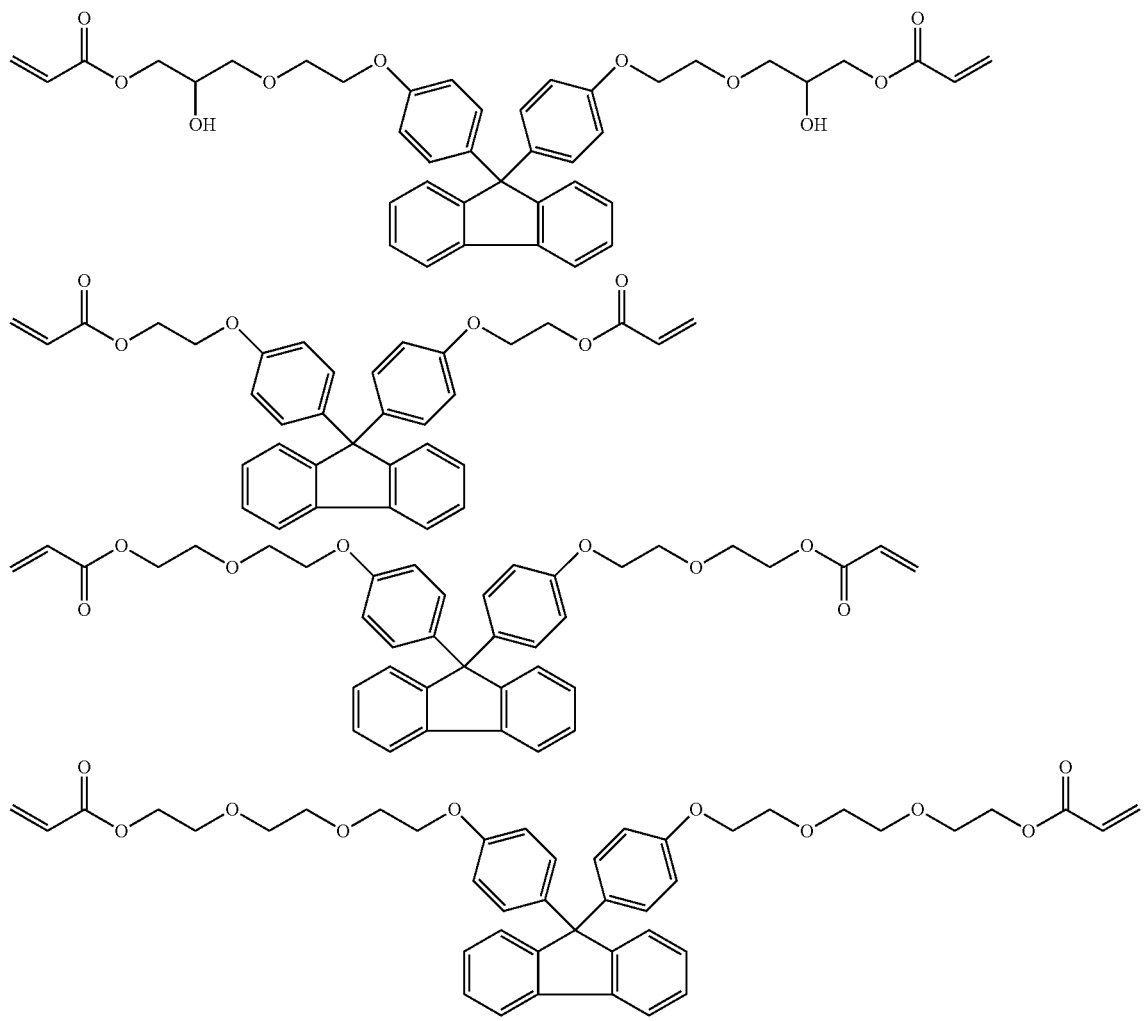

-continued
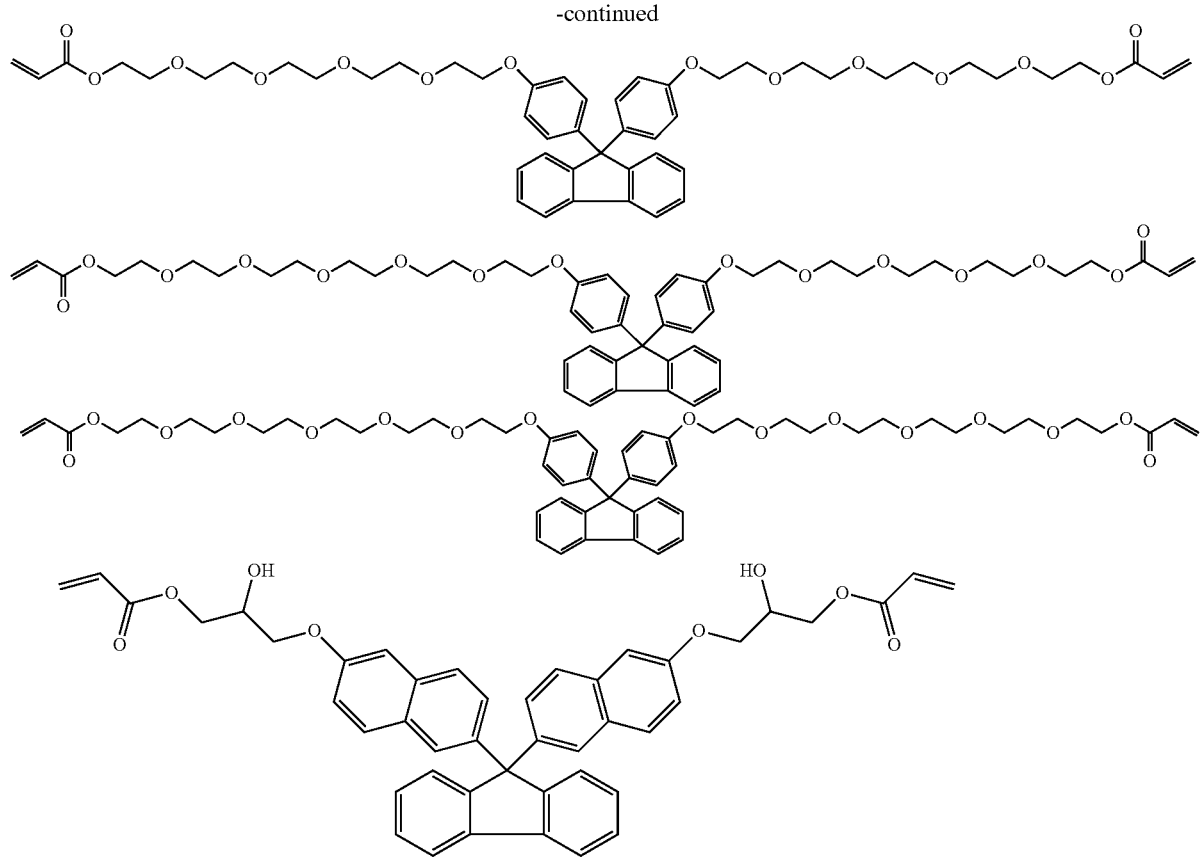
As the radically polymerizable compound C2, compounds represented by the following Formulae (MO-1) to (MO-6) can also be used. In a case where T in the formulae represents an oxyalkylene group, a terminal thereof on a carbon atom side is bonded to R.
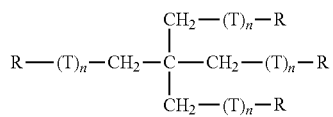 (MO-1)
(MO-2)
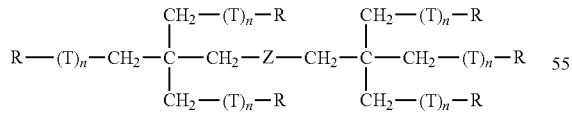
(MO-3)
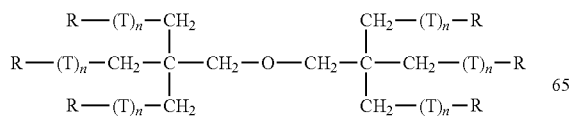
-continued
(MO-4)
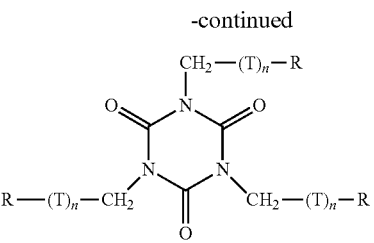
(MO-5)
(MO-6)
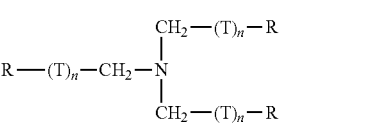
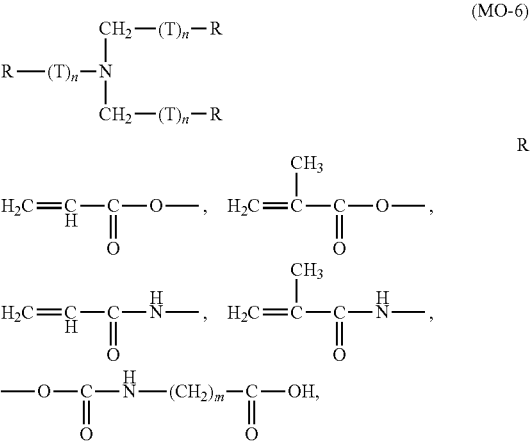

-continued

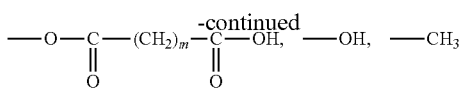

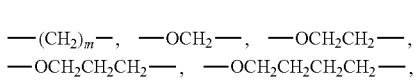

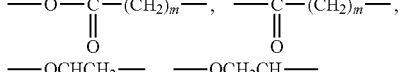

T

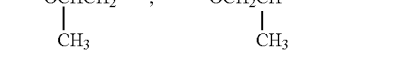

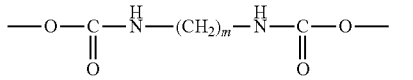

Z

In the formulae, n represents 0 to 14, and m represents 1 to 8. A plurality of R's and a plurality of T's which are present in one molecule may be the same as or different from each other.

At least one of a plurality of R's which are present in each of the compounds represented by Formula (MO-1) to (MO-6) represents —OC(=O)CH=CH$_2$, —OC(=O)C(CH$_3$)=CH$_2$, —NHC(=O)CH=CH$_2$, or —NHC(=O)C(CH$_3$)=CH$_2$. Specific examples of the compounds represented by Formulae (MO-1) to (MO-6) include compounds described in paragraphs "0248" to "0251" of JP2007-269779A.

In addition, as the radically polymerizable compound C2, a compound having a caprolactone structure can also be used. As the compound having a caprolactone structure, a compound represented by the following Formula (Z-1) is preferable.

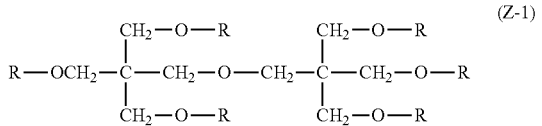

In Formula (Z-1), all of six R's represent a group represented by Formula (Z-2), or one to five R's among the six R's represent a group represented by Formula (Z-2) and the remaining R's represent a group represented by Formula (Z-3), an acid group, or a hydroxy group.

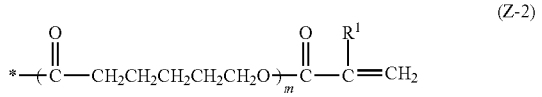

In Formula (Z-2), $R^1$ represents a hydrogen atom or a methyl group, m represents an integer of 1 or 2, and "*" represents a direct bond.

In Formula (Z-3), $R^1$ represents a hydrogen atom or a methyl group, and "*" represents a direct bond.

As the radically polymerizable compound C2, a compound represented by Formula (Z-4) or (Z-5) can also be used.

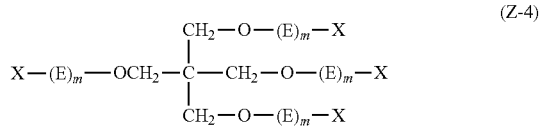

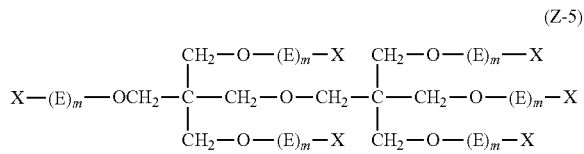

In Formulae (Z-4) and (Z-5), E's each independently represent —((CH$_2$)$_y$CH$_2$O)— or —OCH$_2$)$_y$CH(CH$_3$)O)—, y's each independently represent an integer of 0 to 10, and X's each independently represent a (meth)acryloyl group, a hydrogen atom, or a carboxyl group. In Formula (Z-4), the total number of (meth)acryloyl groups is 3 or 4, m's each independently represent an integer of 0 to 10, and the sum of m's is an integer of 0 to 40. In Formula (Z-5), the total number of (meth)acryloyl groups is 5 or 6, n's each independently represent an integer of 0 to 10, and the sum of n's is an integer of 0 to 60.

In Formula (Z-4), m represents preferably an integer of 0 to 6 and more preferably an integer of 0 to 4. In addition, the sum of m's is preferably an integer of 2 to 40, more preferably an integer of 2 to 16, and still more preferably an integer of 4 to 8. In Formula (Z-5), n represents preferably an integer of 0 to 6 and more preferably an integer of 0 to 4. In addition, the sum of n's is preferably an integer of 3 to 60, more preferably an integer of 3 to 24, and still more preferably an integer of 6 to 12. In addition, it is preferable that, in —((CH$_2$)$_y$CH$_2$O)— or —((CH$_2$)$_y$CH(CH$_3$)O)— of Formula (Z-4) or (Z-5), a terminal thereof on an oxygen atom side is bonded to X.

In addition, as the polymerizable monomer, for example, a compound described in JP2017-048367A, JP6057891B, or JP6031807B, a compound described in JP2017-194662A, 8UH-1006 or 8UH-1012 (manufactured by Taisei Fine Chemical Co., Ltd.), or LIGHT ACRYLATE POB-A0 (manufactured by Kyoeisha Chemical Co., Ltd.) is also preferably used.

The content of the radically polymerizable compound C is preferably 5% to 60 mass % with respect to the total solid content of the photosensitive composition. The lower limit is preferably 10 mass % or higher and more preferably 15 mass % or higher. The upper limit is preferably 50 mass % or lower and more preferably 40 mass % or lower.

The content of the radically polymerizable compound C1 is preferably 4% to 50 mass % with respect to the total solid content of the photosensitive composition. The lower limit is preferably 8 mass % or higher and more preferably 10 mass % or higher. The upper limit is preferably 40 mass % or lower and more preferably 30 mass % or lower.

In addition, the content of the radically polymerizable compound C1 is preferably 10 to 60 parts by mass with respect to 100 parts by mass of the coloring material A. The upper limit is preferably 50 parts by mass or less and more preferably 40 parts by mass or less. The lower limit is preferably 20 parts by mass or more and more preferably 30 parts by mass or more. In a case where a ratio between the content of the coloring material A and the content of the radically polymerizable compound C1 is in the above-described range, a film having excellent solvent resistance, moisture resistance, and thermal diffusivity resistance can be easily obtained. Further, the dispersibility of the coloring material A in the photosensitive composition is excellent, and the photosensitive composition having excellent storage stability can be obtained.

The total content of the coloring material A and the radically polymerizable compound C1 is preferably 60 mass % or higher, more preferably 70 mass % or higher, and still more preferably 80 mass % or higher with respect to the total solid content of the photosensitive composition. The upper limit is preferably 98 mass % or lower, more preferably 95 mass % or lower, and still more preferably 90 mass % or lower.

In a case where the radically polymerizable compound C used in the present invention includes the radically polymerizable compound C1 and the radically polymerizable compound C2, the content of the radically polymerizable compound C1 is preferably 70% to 99.5 mass %, more preferably 80% to 99.5 mass %, still more preferably 85% to 99.5 mass %, still more preferably 90% to 99.5 mass %, still more preferably 95% to 99.5 mass %, and still more preferably 97% to 99.5 mass % from the viewpoint of easily further improving the solvent resistance, moisture resistance, thermal diffusivity resistance, and the like of the obtained film with respect to the total content of the radically polymerizable compound C1 and the radically polymerizable compound C2.

In the photosensitive composition according to the embodiment of the present invention, the content of the radically polymerizable compound C1 is preferably 60 mass % or higher, more preferably 70 mass % or higher, still more preferably 80 mass % or higher, and still more preferably 90 mass % or higher with respect to the total mass of compounds having a weight-average molecular weight of 3000 or higher in the photosensitive composition, the compounds excluding the coloring material A and the photoradical polymerization initiator B. In this aspect, the curing of a film is sufficient, and a film having excellent solvent resistance, moisture resistance, thermal diffusivity resistance, and the like can be easily obtained. Examples of the compound having a weight-average molecular weight of 3000 or higher other than the radically polymerizable compound C1 include a resin described below.

<<Resin>>

The photosensitive composition according to the embodiment of the present invention may include a resin as the component other than the coloring material A, the photo-radical polymerization initiator B, and the radically polymerizable compound C. The resin is added, for example, in order to disperse particles of the pigments and the like in the composition or to be added as a binder. The resin which is mainly used to disperse particles of the pigments and the like will also be called a dispersant. However, the above-described uses of the resin are merely exemplary, and the resin can be used for purposes other than the uses.

The weight-average molecular weight (Mw) of the other resin is preferably 3000 to 2000000. The upper limit is preferably 1000000 or lower and more preferably 500000 or lower. The lower limit is preferably 4000 or higher and more preferably 5000 or higher.

Examples of the other resin include a (meth)acrylic resin, an epoxy resin, an enethiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamide imide resin, a polyolefin resin, a cyclic olefin resin, a polyester resin, and a styrene resin. Among these resins, one kind may be used alone, or a mixture of two or more kinds may be used.

The other resin may have an acid group. Examples of the acid group include a carboxyl group, a phosphate group, a sulfo group, and a phenolic hydroxy group. Among these, a carboxyl group is preferable. Among these acid groups, one kind may be used alone, or two or more kinds may be used in combination. It is preferable that the other resin is a resin having an acid group. The resin having an acid group can also be used as an alkali-soluble resin.

It is preferable that the resin having an acid group is a resin having a carboxyl group at a side chain. It is preferable that the resin having an acid group may include a repeating unit derived from a monomer component including the ether dimer described in the radically polymerizable compound C1. In addition, the resin having an acid group may include a repeating unit which is derived from a compound represented by the following Formula (X).

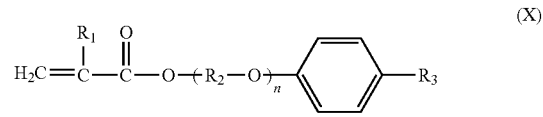

In Formula (X), $R_1$ represents a hydrogen atom or a methyl group, $R_2$ represents an alkylene group having 2 to 10 carbon atoms, and $R_3$ represents a hydrogen atom or an alkyl group having 1 to 20 carbon atoms which may have a benzene ring. n represents an integer of 1 to 15.

The details of the resin having an acid group can be found in paragraphs "0558" to "0571" of JP2012-208494A (corresponding to paragraphs "0685" to "0700" of US2012/0235099A) and paragraphs "0076" to "0099" of JP2012-198408A, the contents of which are incorporated herein by reference.

The acid value of the resin having an acid group is preferably 30 to 200 mgKOH/g. The lower limit is preferably 50 mgKOH/g or higher and more preferably 70 mgKOH/g or higher. The upper limit is preferably 150 mgKOH/g or lower and more preferably 120 mgKOH/g or lower.

Examples of the resin having an acid group include resins having the following structures. In the following structural formulae, Me represents a methyl group.

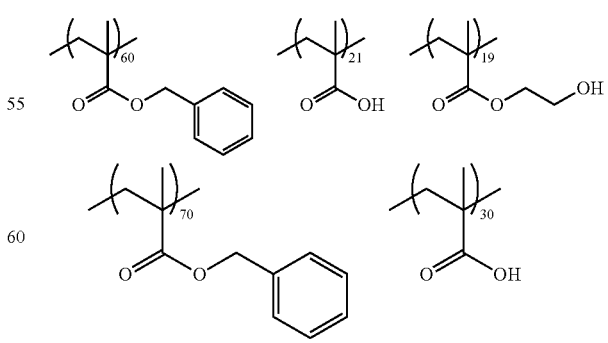

The photosensitive composition according to the embodiment of the present invention may include a resin as a dispersant. Examples of the dispersant include an acidic dispersant (acidic resin) and a basic dispersant (basic resin). Here, the acidic dispersant (acidic resin) refers to a resin in which the content of an acid group is more than the content of a basic group. In a case where the sum of the amount of an acid group and the amount of a basic group in the acidic dispersant (acidic resin) is represented by 100 mol %, the amount of the acid group in the acidic resin is preferably 70 mol % or higher and more preferably substantially 100 mol %. The acid group in the acidic dispersant (acidic resin) is preferably a carboxyl group. An acid value of the acidic dispersant (acidic resin) is preferably 40 to 105 mgKOH/g, more preferably 50 to 105 mgKOH/g, and still more preferably 60 to 105 mgKOH/g. In addition, the basic dispersant (basic resin) refers to a resin in which the amount of a basic group is more than the amount of an acid group. In a case where the sum of the amount of an acid group and the amount of a basic group in the basic dispersant (basic resin) is represented by 100 mol %, the amount of the basic group in the basic resin is preferably higher than 50 mol %. The basic group in the basic dispersant is preferably an amino group.

It is preferable that the resin used as the dispersant is a graft copolymer. The details of the graft copolymer can be found in the description of paragraphs "0025" to "0094" of JP2012-255128A, the content of which is incorporated herein by reference. In addition, in the present invention, it is also preferable that the resin used as a dispersant is an oligoimine copolymer having a nitrogen atom at at least either a main chain or a side chain. The oligoimine copolymer can be found in the description of paragraphs "0102" to "0174" of JP2012-255128A, the content of which is incorporated herein by reference. The dispersant is available as a commercially available product, and specific examples thereof include Disperbyk-111 (manufactured by BYK Chemie) and SOLSPERSE 76500 (manufactured by Lubrication Technology Inc.). In addition, a pigment dispersant described in paragraphs "0041" to "0130" of JP2014-130338A can also be used, the content of which is incorporated herein by reference. In addition, the resin having an acid group or the like can also be used as a dispersant.

The content of the resin is preferably 50 mass % or lower, more preferably 35 mass % or lower, still more preferably 20 mass % or lower, and still more preferably 10 mass % or lower with respect to the total solid content of the photosensitive composition. In addition, it is also preferable that the photosensitive composition according to the embodiment of the present invention does not substantially include a resin. The photosensitive composition according to the embodiment of the present invention not substantially including the other resin represents that the content of the resin is preferably 0.5 mass % or lower, more preferably 0.1 mass % or lower, and still more preferably 0 mass % with respect to the total solid content of the photosensitive composition according to the embodiment of the present invention.

<<Compound having Cyclic Ether Group>>

The photosensitive composition according to the embodiment of the present invention may include a compound having a cyclic ether group. Examples of the cyclic ether group include an epoxy group and an oxetanyl group. It is also preferable that the compound having a cyclic ether group is a compound having an epoxy group. Examples of the compound having an epoxy group include a compound having one or more epoxy groups in one molecule. In particular, a compound having two or more epoxy groups in one molecule is preferable. The number of epoxy groups in one molecule is preferably 1 to 100. The upper limit of the number of epoxy groups is, for example, 10 or less or 5 or less. The lower limit of the number of epoxy groups is preferably 2 or more. As the compound having an epoxy group, a compound described in paragraphs "0034" to "0036" of JP2013-011869A, paragraphs "0147" to "0156" of JP2014-043556A, or paragraphs "0085" to "0092" of JP2014-089408A or a compound described in JP2017-179172A can also be used. The contents of this specification are incorporated herein by reference.

The compound having an epoxy group may be a low molecular weight compound (for example, molecular weight: lower than 2000 or lower than 1000) or a high molecular weight compound (macromolecule; for example, molecular weight: 1000 or higher, and in the case of a polymer, weight-average molecular weight: 1000 or higher). The weight-average molecular weight of the compound having an epoxy group is preferably 200 to 100000 and more preferably 500 to 50000. The upper limit of the weight-average molecular weight is preferably 10000 or lower, more preferably 5000 or lower, and still more preferably 3000 or lower.

Examples of a commercially available product of the compound having a cyclic ether group include EHPE 3150 (manufactured by Daicel Corporation), EPICLON N-695 (manufactured by DIC Corporation), and MARPROOF G-0150M, G-0105SA, G-0130SP, G-0250SP, G-1005S, G-1005SA, G-1010S, G-2050M, G-01100, or G-01758 (manufactured by NOF Corporation, an epoxy group-containing polymer).

In a case where the photosensitive composition according to the embodiment of the present invention includes the compound having a cyclic ether group, the content of the compound having a cyclic ether group is preferably 0.1% to 20 mass % with respect to the total solid content of the photosensitive composition. For example, the lower limit is more preferably 0.5 mass % or higher and still more preferably 1 mass % or higher. For example, the upper limit is preferably 15 mass % or lower and more preferably 10 mass % or lower. As the compound having a cyclic ether group, one kind may be used alone, or two or more kinds may be used. In a case where the photosensitive composition includes two or more compounds having a cyclic ether group, it is preferable that the total content of the two or more compounds having a cyclic ether group is in the above-described range.

<<Silane Coupling Agent>>

The photosensitive composition according to the embodiment of the present invention may include a silane coupling agent. In this aspect, the adhesiveness of the obtained film with the support can be improved. In the present invention, the silane coupling agent refers to a silane compound having a functional group other than a hydrolyzable group. In addition, the hydrolyzable group refers to a substituent directly linked to a silicon atom and capable of forming a siloxane bond due to at least one of a hydrolysis reaction or a condensation reaction. Examples of the hydrolyzable group include a halogen atom, an alkoxy group, and an acyloxy group. Among these, an alkoxy group is preferable. That is, it is preferable that the silane coupling agent is a compound having an alkoxysilyl group. Examples of the functional group other than a hydrolyzable group include a vinyl group, a (meth)allyl group, a (meth)acryloyl group, a mercapto group, an epoxy group, an oxetanyl group, an amino group, an ureido group, a sulfide group, an isocyanate group, and a phenyl group. Among these, an amino group, a (meth)acryloyl group, or an epoxy group is preferable. Specific examples of the silane coupling agent include a compound described in paragraphs "0018" to "0036" of JP2009-288703A and a compound described in paragraphs "0056" to "0066" of JP2009-242604A, the contents of which are incorporated herein by reference.

The content of the silane coupling agent is preferably 0.1% to 5 mass % with respect to the total solid content of the photosensitive composition. The upper limit is preferably 3 mass % or lower, and more preferably 2 mass % or lower. The lower limit is preferably 0.5 mass % or higher and more preferably 1 mass % or higher. As the silane coupling agent, one kind may be used alone, or two or more kinds may be used. In a case where the photosensitive composition includes two or more silane coupling agents, it is preferable that the total content of the two or more silane coupling agents is in the above-described range.

<<Pigment Derivative>>

The photosensitive composition according to the embodiment of the present invention may further include a pigment derivative. Examples of the pigment derivative include a compound having a structure in which a portion of a pigment is substituted with an acid group, a basic group, a group having a salt structure, or a phthalimidomethyl group. As the pigment derivative, a compound represented by Formula (B1) is preferable.

(B1)

In Formula (B1), P represents a colorant structure, L represents a single bond or a linking group, X represents an acid group, a basic group, a group having a salt structure, or a phthalimidomethyl group, m represents an integer of 1 or more, n represents an integer of 1 or more, in a case where m represents 2 or more, a plurality of L's and a plurality of X's may be different from each other, and in a case where n represents 2 or more, a plurality of X's may be different from each other.

The colorant structure represented by P is preferably at least one selected from a pyrrolopyrrole colorant structure, a diketo pyrrolopyrrole colorant structure, a quinacridone colorant structure, an anthraquinone colorant structure, a dianthraquinone colorant structure, a benzoisoindole colorant structure, a thiazine indigo colorant structure, an azo colorant structure, a quinophthalone colorant structure, a phthalocyanine colorant structure, a naphthalocyanine colorant structure, a dioxazine colorant structure, a perylene colorant structure, a perinone colorant structure, a benzimidazolone colorant structure, a benzothiazole colorant structure, a benzimidazole colorant structure, and a benzoxazole colorant structure, and more preferably at least one selected from a pyrrolopyrrole colorant structure, a diketo pyrrolo pyrrolopyrrole colorant structure, a quinacridone colorant structure, or a benzimidazolone colorant structure.

Examples of the linking group represented by L include a hydrocarbon group, a heterocyclic group, —NR—, —SO$_2$—, —S—, —O—, —CO—, and a group consisting of a combination thereof. R represents a hydrogen atom, an alkyl group, or an aryl group.

Examples of the acid group represented by X include a carboxyl group, a sulfo group, a carboxylic acid amide group, a sulfonic acid amide group, and an imide acid group. As the carboxylic acid amide group, a group represented by —NHCOR$^{X1}$ is preferable. As the sulfonic acid amide group, a group represented by —NHSO$_2$R$^{X2}$ is preferable. As the imide acid group, a group represented by —SO$_2$NHSO$_2$R$^{X3}$, —CONHSO$_2$R$^{X4}$, —CONHCOR$^{X5}$, or —SO$_2$NHCOR$^{X6}$ is preferable. R$^{X1}$ to R$^{X6}$ each independently represent a hydrocarbon group or a heterocyclic group. The hydrocarbon group and the heterocyclic group represented by R$^{X1}$ to R$^{X6}$ may further have a substituent. As the substituent which may be further included, a halogen atom is preferable, and a fluorine atom is more preferable. Examples of the basic group represented by X include an amino group. Examples of the salt structure represented by X include a salt of the acid group or the basic group described above.

Examples of the pigment derivative include compounds having the following structures. In addition, for example, compounds described in JP1981-118462A (JP-S56-118462A), JP1988-264674A (JP-S63-264674A), JP1989-217077A (JP-H1-217077A), JP1991-009961A (JP-H3-009961A), JP1991-026767A (JP-H3-026767A), JP1991-153780A (JP-H3-153780A), JP1991-045662A (JP-H3-045662A), JP1992-285669A (JP-H4-285669A), JP1994-145546A (JP-H6-145546A), JP1994-212088A (JP-H6-212088A), JP1994-240158A (JP-H6-240158A), JP1998-030063A (JP-H10-030063A), JP1998-195326A (JP-H10-195326A), paragraphs "0086" to "0098" of WO2011/024896A, paragraphs "0063" to "0094" of WO2012/102399A, and paragraph "0082" of WO2017/038252A can be used, the content of which is incorporated herein by reference.

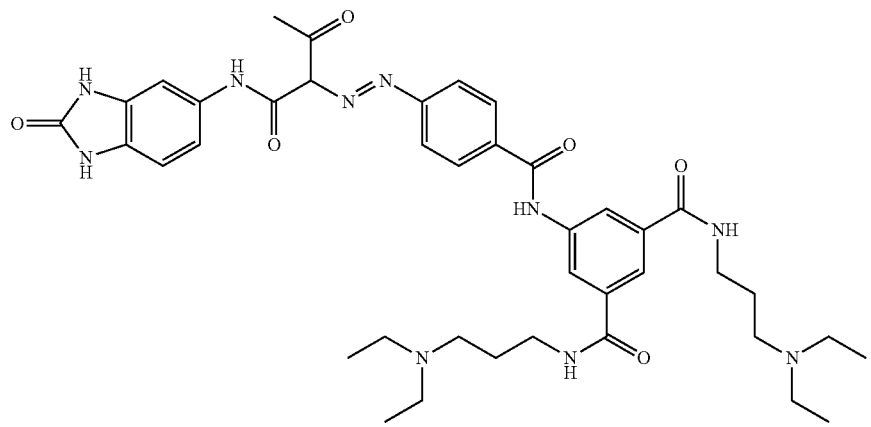 [SMILES: CCN(CC)CCCNC(=O)c1cc(NC(=O)c2ccc(/N=N/C(C(C)=O)C(=O)Nc3ccc4[nH]c(=O)[nH]c4c3)cc2)cc(C(=O)NCCCN(CC)CC)c1]

The content of the pigment derivative is preferably 1 to 50 parts by mass with respect to 100 parts by mass of the pigment. The lower limit value is preferably 3 parts by mass or more and more preferably 5 parts by mass or more. The upper limit value is preferably 40 parts by mass or less and more preferably 30 parts by mass or less. In a case where the content of the pigment derivative is in the above-described range, the pigment dispersibility can be improved, and aggregation of the pigment can be efficiently suppressed. As the pigment derivative, one kind may be used alone, or two or more kinds may be used. In a case where the photosensitive composition includes two or more pigment derivatives, it is preferable that the total content of the two or more pigment derivatives is in the above-described range.

<<Solvent>>

The photosensitive composition according to the embodiment of the present invention may include a solvent. Examples of the solvent include an organic solvent. Basically, the solvent is not particularly limited as long as it satisfies the solubility of the respective components and the application properties of the composition. Examples of the organic solvent include esters, ethers, ketones, and aromatic hydrocarbons. The details of the organic solvent can be found in paragraph "0223" of WO2015/166779A, the content of which is incorporated herein by reference. In addition, an ester solvent in which a cyclic alkyl group is substituted or a ketone solvent in which a cyclic alkyl group is substituted can also be preferably used. Specific examples of the organic solvent include polyethylene glycol monomethyl ether, dichloromethane, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, cyclohexyl acetate, cyclopentanone, ethyl carbitol acetate, butyl carbitol acetate, propylene glycol monomethyl ether, and propylene glycol monomethyl ether acetate. In the present invention, as the organic solvent, one kind may be used alone, or two or more kinds may be used in combination. In addition, 3-methoxy-N,N-dimethylpropanamide or 3-butoxy-N,N-dimethylpropanamide is also preferable from the viewpoint of improving solubility. In this case, it may be preferable that the content of the aromatic hydrocarbon (for example, benzene, toluene, xylene, or ethylbenzene) as the solvent is low (for example, 50 mass parts per million (ppm) or lower, 10 mass ppm or lower, or 1 mass ppm or lower with respect to the total mass of the organic solvent) in consideration of environmental aspects and the like.

In the present invention, a solvent having a low metal content is preferably used. For example, the metal content in the solvent is preferably 10 mass parts per billion (ppb) or lower. Optionally, a solvent having a metal content at a mass parts per trillion (ppt) level may be used. For example, such a high-purity solvent is available from Toyo Gosei Co., Ltd. (The Chemical Daily, Nov. 13, 2015).

Examples of a method of removing impurities such as metal from the solvent include distillation (for example, molecular distillation or thin-film distillation) and filtering using a filter. The pore size of a filter used for the filtering is preferably 10 μm or less, more preferably 5 μm or less, and still more preferably 3 μm or less. As a material of the filter, polytetrafluoroethylene, polyethylene, or nylon is preferable.

The solvent may include an isomer (a compound having the same number of atoms and a different structure). In addition, the organic solvent may include only one isomer or a plurality of isomers.

In the present invention, as the organic solvent, an organic solvent containing 0.8 mmol/L or lower of a peroxide is preferable, and an organic solvent containing substantially no peroxide is more preferable.

The content of the solvent in the photosensitive composition is preferably 10% to 95 mass %, more preferably 20% to 90 mass %, and still more preferably 30% to 90 mass %.

In addition, it is preferable that the photosensitive composition according to the embodiment of the present invention does not substantially include an environmentally regulated material from the viewpoint of environmental regulations. In the present invention, not substantially including the environmentally regulated material represents that the content of the environmentally regulated material in the photosensitive composition is 50 mass ppm or lower, preferably 30 mass ppm or lower, more preferably 10 mass ppm or lower, and still more preferably 1 mass ppm or lower. Examples of the environmentally regulated material include: benzene; an alkylbenzene such as toluene or xylene; and a halogenated benzene such as chlorobenzene. These compounds are registered as environmentally regulated materials based on Registration Evaluation Authorization and Restriction of Chemicals (REACH) regulation, Pollutant Release and Transfer Register (PRTR) method, Volatile Organic Compounds (VOC) regulation, and the like, and the amount thereof used and a handling method thereof are strictly regulated. These compounds are used as solvents in a case where each of the components or the like used in the photosensitive composition according to the embodiment of the present invention is manufactured, and may be incorporated into the photosensitive composition as residual solvents. From the viewpoints of safety for humans and consideration of the environment, it is preferable that these materials are reduced as much as possible. Examples of a method of reducing the environmentally regulated material include a method of distilling off the environmentally regulated material from the system by heating or depressurizing the system such that the temperature of the system is higher than or equal to a boiling point of the environmentally regulated material. In addition, in a case where a small amount of environmentally regulated material is removed by distillation, a method of azeotroping the environmentally regulated material with a solvent having the same boiling point as that of the corresponding solvent is also useful to increase the efficiency. In addition, in a case where a radically polymerizable compound is included, in order to suppress intermolecular crosslinking caused by the progress of a radical polymerization reaction during distillation under reduced pressure, a polymerization inhibitor or the like may be added for distillation under reduced pressure. This distillation method can be performed in, for example, any of a step of raw materials, a step of a reaction product (for example, a resin solution or a polyfunctional monomer solution after polymerization) obtained from a reaction of the raw materials, or a step of a composition prepared by mixing these compounds with each other.

<<Polymerization Inhibitor>>

The photosensitive composition according to the embodiment of the present invention may include a polymerization inhibitor. Examples of the polymerization inhibitor include hydroquinone, p-methoxyphenol, di-tert-butyl-p-cresol, pyrogallol, t-butylcatechol, benzoquinone, 4,4'-thiobis(3-methyl-6-tert-butylphenol), 2,2'-methylenebis(4-methyl-6-t-butylphenol), and N-nitrosophenylhydroxyamine salt (for example, an ammonium salt or a cerium (III) salt). Among these, p-methoxyphenol is preferable. The content of the polymerization inhibitor is preferably 0.001% to 5 mass % with respect to the total solid content of the photosensitive composition.

<<Surfactant>>

The photosensitive composition according to the embodiment of the present invention may include a surfactant. As the surfactants, various surfactants such as a fluorine surfactant, a nonionic surfactant, a cationic surfactant, an anionic surfactant, or a silicone surfactant can be used. The details of the surfactant can be found in paragraphs "0238"

to "0245" of WO2015/166779A, the content of which is incorporated herein by reference.

In the present invention, it is preferable that the surfactant is a fluorine surfactant. By the photosensitive composition containing a fluorine surfactant, liquid characteristics (in particular, fluidity) are further improved, and liquid saving properties can be further improved. In addition, a film having reduced thickness unevenness can be formed.

The fluorine content in the fluorine surfactant is preferably 3 to 40 mass %, more preferably 5 to 30 mass %, and still more preferably 7 to 25 mass %. The fluorine surfactant in which the fluorine content is in the above-described range is effective from the viewpoints of the uniformity in the thickness of the coating film and liquid saving properties, and the solubility thereof in the composition is also excellent.

Examples of the fluorine surfactant include a surfactant described in paragraphs "0060" to "0064" of JP2014-041318A (paragraphs "0060" to "0064" of corresponding WO2014/017669A) and a surfactant described in paragraphs "0117" to "0132" of JP2011-132503A, the contents of which are incorporated herein by reference. Examples of a commercially available product of the fluorine surfactant include: MEGAFACE F171, F172, F173, F176, F177, F141, F142, F143, F144, R30, F437, F475, F479, F482, F554, F780, EXP, and MFS-330 (all of which are manufactured by DIC Corporation); FLUORAD FC430, FC431, and FC171 (all of which are manufactured by Sumitomo 3M Ltd.); SURFLON S-382, SC-101, SC-103, SC-104, SC-105, SC-1068, SC-381, SC-383, S-393, and KH-40 (all of which are manufactured by Asahi Glass Co., Ltd.); and POLYFOX PF636, PF656, PF6320, PF6520, and PF7002 (all of which are manufactured by OMNOVA Solutions Inc.).

In addition, as the fluorine surfactant, an acrylic compound having a molecular structure which has a functional group having a fluorine atom and in which the functional group having a fluorine atom is cut and a fluorine atom is volatilized during heat application can also be preferably used. Examples of the fluorine surfactant include MEGAFACE DS series (manufactured by DIC Corporation, The Chemical Daily, Feb. 22, 2016, Nikkei Business Daily, Feb. 23, 2016), for example, MEGAFACE DS-21.

In addition, as the fluorine surfactant, a polymer of a fluorine-containing vinyl ether compound having a fluorinated alkyl group or a fluorinated alkylene ether group and a hydrophilic vinyl ether compound is also preferable. The details of this fluorine surfactant can be found in JP2016-216602A, the content of which is incorporated herein by reference.

As the fluorine surfactant, a block polymer can also be used. Examples of the block polymer include a compound described in JP2011-089090A. As the fluorine surfactant, a fluorine-containing polymer compound can be preferably used, the fluorine-containing polymer compound including: a repeating unit derived from a (meth)acrylate compound having a fluorine atom; and a repeating unit derived from a (meth)acrylate compound having 2 or more (preferably 5 or more) alkyleneoxy groups (preferably an ethyleneoxy group and a propyleneoxy group). For example, the following compound can also be used as the fluorine surfactant used in the present invention.

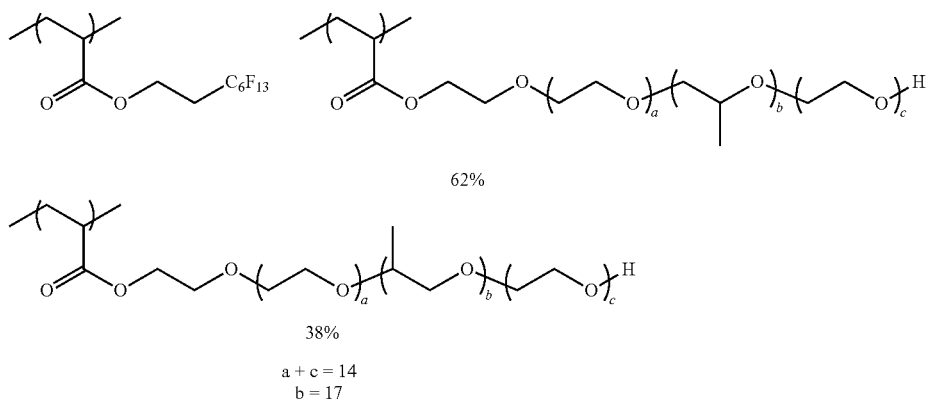

62%

38% a + c = 14
b = 17

The weight-average molecular weight of the compound is preferably 3,000 to 50,000 and, for example, 14,000. In the compound, "%" representing the proportion of a repeating unit is mol %.

In addition, as the fluorine surfactant, a fluorine-containing polymer having an ethylenically unsaturated bond group at a side chain can also be used. Specific examples include a compound described in paragraphs "0050" to "0090" and paragraphs "0289" to "0295" of JP2010-164965A, for example, MEGAFACE RS-101, RS-102, RS-718K, and RS-72-K manufactured by DIC Corporation. As the fluorine surfactant, a compound described in paragraphs "0015" to "0158" of JP2015-117327A can also be used.

Examples of the nonionic surfactant include glycerol, trimethylolpropane, trimethylolethane, an ethoxylate and a propoxylate thereof (for example, glycerol propoxylate or glycerol ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, sorbitan fatty acid esters, PLURONIC L10, L31, L61, L62, 10R5, 17R2, and 25R2 (manufactured by BASF SE), TETRONIC 304, 701, 704, 901, 904, and 150R1 (manufactured by BASF SE)), SOLSPERSE 20000 (manufactured by Lubrication Technology Inc.), NCW-101, NCW-1001, and NCW-1002 (all of which are manufactured by Wako Pure Chemical Industries, Ltd.), PIONIN D-6112, D-6112-W, and D-6315 (all of which are manufactured by Takemoto Oil&Fat Co., Ltd.), and OLEFINE E1010, SURFYNOL 104, 400, and 440 (all of which are manufactured by Nissin Chemical Co., Ltd.).

Examples of the silicone surfactant include: TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (all of which are manufactured by Dow Corning Corporation); TSF-4440, TSF-4300, TSF-4445, TSF-4460, and TSF-4452 (all of which are manufactured by Momentive Performance Materials Inc.); KP-341, KF-6001, and KF-6002 (all of which are manufactured by Shin-Etsu Chemical Co., Ltd.); and BYK307, BYK323, and BYK330 (all of which are manufactured by BYK-Chemie Japan K.K.). In addition, as the silicone surfactant, a compound having the following structure can also be used.

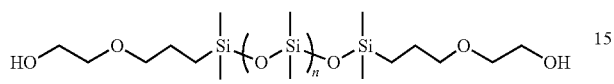

The content of the surfactant is preferably 0.001 mass % to 5.0 mass % and more preferably 0.005% to 3.0 mass % with respect to the total solid content of the photosensitive composition. As the surfactant, one kind may be used alone, or two or more kinds may be used. In a case where two or more surfactants are used in combination, it is preferable that the total content of the two or more surfactants is in the above-described range.

<<Ultraviolet Absorber>>

The photosensitive composition according to the embodiment of the present invention may include an ultraviolet absorber. As the ultraviolet absorber, a conjugated diene compound, an amino diene compound, a salicylate compound, a benzophenone compound, a benzotriazole compound, an acrylonitrile compound, a hydroxyphenyltriazine compound an indole compound, or a triazine compound can be used. The details of the ultraviolet absorber can be found in paragraphs "0052" to "0072" of JP2012-208374A, paragraphs "0317" to "0334" of JP2013-068814A, and paragraphs "0061" to "0080" of JP2016-162946A, the contents of which are incorporated herein by reference. Specific examples of the ultraviolet absorber include compounds having the following structures. Examples of a commercially available product of the ultraviolet absorber include UV-503 (manufactured by Daito Chemical Co., Ltd.). In addition, examples of the benzotriazole compound include MYUA series (manufactured by Miyoshi Oil&Fat Co., Ltd.; The Chemical Daily, Feb. 1, 2016).

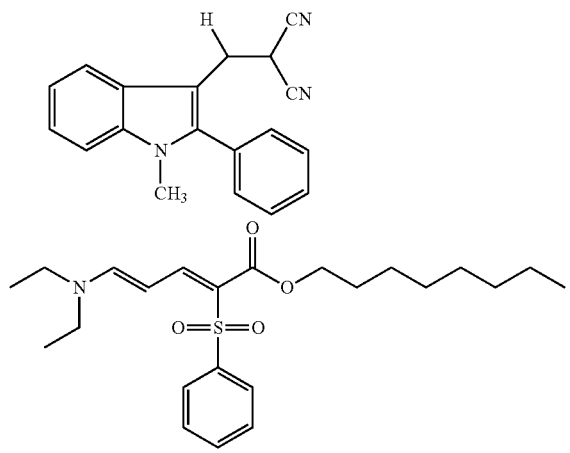

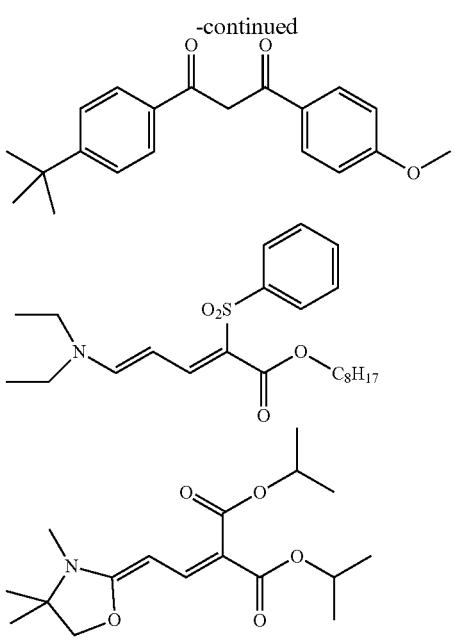

The content of the ultraviolet absorber is preferably 0.01% to 10 mass % and more preferably 0.01% to 5 mass % with respect to the total solid content of the photosensitive composition. In the present invention, as the ultraviolet absorber, one kind may be used alone, or two or more kinds may be used. In a case where two or more ultraviolet absorbers are used in combination, it is preferable that the total content of the two or more ultraviolet absorbers is in the above-described range.

<<Antioxidant>>

The photosensitive composition according to the embodiment of the present invention may include an antioxidant. Examples of the antioxidant include a phenol compound, a phosphite compound, and a thioether compound. As the phenol compound, any phenol compound which is known as a phenol antioxidant can be used. Preferable examples of the phenol compound include a hindered phenol compound. A compound having a substituent at a position (ortho position) adjacent to a phenolic hydroxy group is preferable. As the substituent, a substituted or unsubstituted alkyl group having 1 to 22 carbon atoms is preferable. In addition, as the antioxidant, a compound having a phenol group and a phosphite group in the same molecule is also preferable. In addition, as the antioxidant, a phosphorus antioxidant can also be preferably used. Examples of the phosphorus antioxidant include tris [2-[[2,4,8,10-tetrakis(1,1-dimethylethyl) dibenzo [d,f][1,3,2]dioxaphosphepin-6-yl]oxy]ethyl]amine, tris[2-[(4,6,9,11-tetra-tert-butyldibenzo[d,f][1,3,2]dioxaphosphepin-2-yl)oxy]ethyl]amine, and ethyl bis(2,4-di-tert-butyl-6-methylphenyl)phosphite. Examples of the commercially available product of the antioxidant include ADEKA STAB AO-20, ADEKA STAB AO-30, ADEKA STAB AO-40, ADEKA STAB AO-50, ADEKA STAB AO-50F, ADEKA STAB AO-60, ADEKA STAB AO-60G, ADEKA STAB AO-80, and ADEKA STAB AO-330 (all of which are manufactured by Adeka Corporation). In addition, as the antioxidant, a polyfunctional hindered amine antioxidant described in WO2017/006600A or an antioxidant described in WO2017/164024A can also be used.

The content of the antioxidant is preferably 0.01% to 20 mass % and more preferably 0.3% to 15 mass % with respect to the total solid content of the photosensitive composition. As the antioxidant, one kind may be used alone, or two or more kinds may be used in combination. In a case where two or more ultraviolet absorbers are used in combination, it is preferable that the total content of the two or more ultraviolet absorbers is in the above-described range.

<<Other Components>>

Optionally, the photosensitive composition according to the embodiment of the present invention may further include a sensitizer, a curing accelerator, a filler, a thermal curing accelerator, a plasticizer, and other auxiliary agents (for example, conductive particles, a filler, an antifoaming agent, a flame retardant, a leveling agent, a peeling accelerator, an aromatic chemical, a surface tension adjuster, or a chain transfer agent). By the composition appropriately including the components, properties such as film properties can be adjusted. The details of the components can be found in, for example, paragraph "0183" of JP2012-003225A (corresponding to paragraph "0237" of US2013/0034812A) and paragraphs "0101" to "0104" and "0107" to "0109" of JP2008-250074A, the contents of which are incorporated herein by reference. In addition, the photosensitive composition according to the embodiment of the present invention may optionally include a potential antioxidant. The potential antioxidant is a compound in which a portion that functions as the antioxidant is protected by a protective group and this protective group is desorbed by heating the compound at 100° C. to 250° C. or by heating the compound at 80° C. to 200° C. in the presence of an acid/a base catalyst. Examples of the potential antioxidant include a compound described in WO2014/021023A, WO2017/030005A, and JP2017-008219A. Examples of a commercially available product of the potential antioxidant include ADEKA ARKLS GPA-5001 (manufactured by Adeka Corporation).

For example, in a case where a film is formed by coating, the viscosity (23° C.) of the photosensitive composition according to the embodiment of the present invention is preferably 1 to 100 mPa·s. The lower limit is more preferably 2 mPa·s or higher and still more preferably 3 mPa·s or higher. The upper limit is preferably 50 mPa·s or lower, more preferably 30 mPa·s or lower, and still more preferably 15 mPa·s or lower.

<Storage Container>

A storage container of the photosensitive composition according to the embodiment of the present invention is not particularly limited, and a well-known storage container can be used. In addition, as the storage container, in order to suppress infiltration of impurities into the raw materials or the composition, a multilayer bottle in which a container inner wall having a six-layer structure is formed of six kinds of resins or a bottle in which a container inner wall having a seven-layer structure is formed of six kinds of resins is preferably used. Examples of the container include a container described in JP2015-123351A.

<Method of Preparing Photosensitive Composition>

The photosensitive composition according to the embodiment of the present invention can be prepared by mixing the above-described components with each other. During the preparation of the photosensitive composition, all the components may be dissolved or dispersed in a solvent at the same time to prepare the photosensitive composition. Optionally, two or more solutions or dispersion liquids to which the respective components are appropriately added may be prepared, and the solutions or dispersion liquids may be mixed with each other during use (during application) to prepare the photosensitive composition.

In addition, in a case where the photosensitive composition according to the embodiment of the present invention includes particles of a pigment or the like, it is preferable that a process of dispersing the particles is provided. Examples of a mechanical force used for dispersing the particles in the process of dispersing the particles include compression, squeezing, impact, shearing, and cavitation. Specific examples of the process include a beads mill, a sand mill, a roll mill, a ball mill, a paint shaker, a Microfluidizer, a high-speed impeller, a sand grinder, a flow jet mixer, high-pressure wet atomization, and ultrasonic dispersion. During the pulverization of the particles using a sand mill (beads mill), it is preferable that the process is performed under conditions for increasing the pulverization efficiency, for example, by using beads having a small size and increasing the filling rate of the beads. In addition, it is preferable that coarse particles are removed by filtering, centrifugal separation, and the like after pulverization. In addition, as the process and the disperser for dispersing the particles, a process and a disperser described in "Complete Works of Dispersion Technology, Johokiko Co., Ltd., Jul. 15, 2005", "Dispersion Technique focusing on Suspension (Solid/Liquid Dispersion) and Practical Industrial Application, Comprehensive Reference List, Publishing Department of Management Development Center, Oct. 10, 1978", and paragraph "0022" JP2015-157893A can be suitably used. In addition, in the process of dispersing the particles, particles may be refined in a salt milling step. A material, a device, process conditions, and the like used in the salt milling step can be found in, for example, JP2015-194521A and JP2012-046629A.

During the preparation of the photosensitive composition according to the embodiment of the present invention, it is preferable that the photosensitive composition is filtered through a filter, for example, in order to remove foreign matter or to reduce defects. As the filter, any filter which is used in the related art for filtering or the like can be used without any particular limitation. Examples of a material of the filter include: a fluororesin such as polytetrafluoroethylene (PTFE); a polyamide resin such as nylon (for example, nylon-6 or nylon-6,6); and a polyolefin resin (including a polyolefin resin having a high density and an ultrahigh molecular weight) such as polyethylene or polypropylene (PP). Among these materials, polypropylene (including high-density polypropylene) or nylon is preferable. The pore size of the filter is suitably about 0.01 to 7.0 μm and is preferably about 0.01 to 3.0 μm and more preferably about 0.05 to 0.5 μm. In a case where the pore size of the filter is in the above-described range, fine foreign matter can be reliably removed. In addition, it is preferable that a fibrous filter material is used. Examples of the fibrous filter material include polypropylene fiber, nylon fiber, and glass fiber. Specific examples include a filter cartridge of SBP type series (for example, SBP008), TPR type series (for example, TPR002 or TPR005), and SHPX type series (for example, SHPX003) all of which are manufactured by Roki Techno Co., Ltd. In a case where a filter is used, a combination of different filters (for example, a first filter and a second filter) may be used. At this time, the filtering using each of the filters may be performed once, or twice or more. In addition, a combination of filters having different pore sizes in the above-described range may be used. In addition, the filtering using the first filter may be performed only on the dispersion liquid, and the filtering using the second filter may be performed on a mixture of the dispersion liquid and other components.

<Method of Manufacturing Optical Filter>

Next, a method of manufacturing an optical filter using the photosensitive composition according to the embodiment of the present invention will be described. Examples of the kind of the optical filter include a color filter and an infrared transmitting filter.

The method of manufacturing an optical filter according to an embodiment of the present invention includes: a step (photosensitive composition layer forming step) of applying the above-described photosensitive composition according to the embodiment of the present invention to a support to form a photosensitive composition layer; a step (exposure step) of exposing (pulse exposure) the photosensitive composition layer to pulses of light in a pattern shape; and a step (development step) of forming a pixel by removing a non-exposed portion of the photosensitive composition layer by development. Hereinafter, the respective steps will be described.

(Photosensitive Composition Layer Forming Step)

In the photosensitive composition layer forming step, the above-described photosensitive composition according to the embodiment of the present invention is applied to a support to form a photosensitive composition layer. Examples of the support include a substrate formed of a material such as silicon, non-alkali glass, soda glass, PYREX (registered trade name) glass, or quartz glass. In addition, for example, an InGaAs substrate is preferably used. In addition, a charge coupled device (CCD), a complementary metal-oxide semiconductor (CMOS), a transparent conductive film, or the like may be formed on the support. In addition, a black matrix that separates pixels from each other may be formed on the support. In addition, optionally, an undercoat layer may be provided on the support to improve adhesiveness with a layer above the support, to prevent diffusion of materials, or to make a surface of the substrate flat.

As a method of applying the photosensitive composition to the support, a well-known method can be used. Examples of the well-known method include: a drop casting method; a slit coating method; a spray coating method; a roll coating method; a spin coating method; a cast coating method; a slit and spin method; a pre-wetting method (for example, a method described in JP2009-145395A); various printing methods including jet printing such as an ink jet method (for example, an on-demand method, a piezoelectric method, or a thermal method) or a nozzle jet method, flexographic printing, screen printing, gravure printing, reverse offset printing, and metal mask printing; a transfer method using a mold or the like; and a nanoimprint lithography method. The application method using an ink jet method is not particularly limited, and examples thereof include a method (in particular, pp. 115 to 133) described in "Extension of Use of Ink Jet—Infinite Possibilities in Patent—" (February, 2005, S.B. Research Co., Ltd.) and methods described in JP2003-262716A, JP2003-185831A, JP2003-261827A, JP2012-126830A, and JP2006-169325A. In addition, as the method of applying the photosensitive composition, methods described in WO2017/030174A and WO2017/018419A can also be used, the contents of which are incorporated herein by reference.

The photosensitive composition may be dried (pre-baked) after being applied to the support. In a case where pre-baking is performed, the pre-baking temperature is preferably 150° C. or lower, more preferably 120° C. or lower, and still more preferably 110° C. or lower. The lower limit is, for example, 50° C. or higher or 80° C. or higher. The pre-baking time is preferably 10 to 3000 seconds, more preferably 40 to 2500 seconds, and still more preferably 80 to 2200 seconds. Drying can be performed using a hot plate, an oven, or the like.

(Exposure Step)

Next, the photosensitive composition layer formed on the support as described above is exposed (pulse exposure) to pulses of light in a pattern shape. By exposing the photosensitive composition layer to pulses of light through a mask having a predetermined mask pattern, the photosensitive composition layer can be exposed to pulses of light in a pattern shape. As a result, the exposed portion of the photosensitive composition layer can be cured.

The light used for pulse exposure may be light having a wavelength of longer than 300 nm or light having a wavelength of 300 nm or shorter. From the viewpoint of easily obtaining more significant effects of the present invention, the light used for pulse exposure is preferably light having a wavelength of 300 nm or shorter, more preferably light having a wavelength of 270 nm or shorter, and still more preferably light having a wavelength of 250 nm or shorter. In addition, the above-described light is preferably light having a wavelength of 180 nm or longer. Specific examples of the light include a KrF ray (wavelength: 248 nm) and an ArF ray (wavelength: 193 nm). From the viewpoint of easily obtaining more significant effects of the present invention, a KrF ray (wavelength: 248 nm) is preferable.

It is preferable that the pulse exposure condition is the following condition. From the viewpoint of instantaneously generating a large amount of an active species such as a radical easily, the pulse duration is preferably 100 nanoseconds (ns) or shorter, more preferably 50 nanoseconds or shorter, and still more preferably 30 nanoseconds or shorter. The lower limit of the pulse duration is not particularly limited and may be 1 femtosecond (fs) or longer or 10 femtoseconds (fs) or longer. From the viewpoint of thermally polymerizing the radically polymerizable compound using exposure heat such that a film having excellent solvent resistance, moisture resistance, thermal diffusivity resistance, and the like can be easily formed, the frequency is preferably 1 kHz or higher, more preferably 2 kHz or higher, and still more preferably 4 kHz or higher. From the viewpoint of easily suppressing deformation of a substrate or the like caused by exposure heat, the upper limit of the frequency is preferably 50 kHz or lower, more preferably 20 kHz or lower, and still more preferably 10 kHz or lower. From the viewpoint of curing properties, the maximum instantaneous illuminance is preferably 50000000 W/m$^2$ or higher, more preferably 100000000 W/m$^2$ or higher, and still more preferably 200000000 W/m$^2$ or higher. In addition, from the viewpoint of high illuminance reciprocity failure, the upper limit of the maximum instantaneous illuminance is preferably 1000000000 W/m$^2$ or lower, more preferably 800000000 W/m$^2$ or lower, and still more preferably 500000000 W/m$^2$ or lower. The exposure dose is preferably 1 to 1000 mJ/cm$^2$. The upper limit is preferably 500 mJ/cm$^2$ or lower and more preferably 200 mJ/cm$^2$ or lower. The lower limit is preferably 10 mJ/cm$^2$ or higher, more preferably 20 mJ/cm$^2$ or higher, and still more preferably 30 mJ/cm$^2$ or higher.

The oxygen concentration during exposure can be appropriately selected. The exposure may be performed not only in air but also in a low-oxygen atmosphere having an oxygen concentration of 19 vol % or lower (for example, 15 vol %, 5 vol %, or substantially 0 vol %) or in a high-oxygen atmosphere having an oxygen concentration of higher than 21 vol % (for example, 22 vol %, 30 vol %, or 50 vol %).

(Development Step)

Next, after the exposure step, a pixel (pattern) is formed by removing a non-exposed portion of the photosensitive composition layer by development. The non-exposed portion of the photosensitive composition layer can be removed by development using a developer. As a result, the non-exposed portion of the photosensitive composition layer in the exposure step is eluted into the developer, and only the portion that is photocured in the above-described exposure step remains on the support. For example, the temperature of the developer is preferably 20° C. to 30° C. The development time is preferably 20 to 180 seconds. In addition, in order to further improve residue removing properties, a step of shaking the developer off per 60 seconds and supplying a new developer may be repeated multiple times.

As the developer, an alkaline aqueous solution in which the above alkaline agent is diluted with pure water is preferable. Examples of the alkaline agent include: an organic alkaline compound such as ammonia, ethylamine, diethylamine, dimethylethanolamine, diglycolamine, diethanolamine, hydroxyamine, ethylenediamine, tetramethylammonium hydroxide, tetraethylammonium hydroxide, tetrapropylammonium hydroxide, tetrabutylammonium hydroxide, ethyltrimethylammonium hydroxide, benzyltrimethylammonium hydroxide, dimethyl bis(2-hydroxyethyl)ammonium hydroxide, choline, pyrrole, piperidine, or 1,8-diazabicyclo[5.4.0]-7-undecene; and an inorganic alkaline compound such as sodium hydroxide, potassium hydroxide, sodium carbonate, sodium bicarbonate, sodium silicate, or sodium metasilicate. From the viewpoints of environment and safety, it is preferable that the alkaline agent is a compound having a high molecular weight. A concentration of the alkaline agent in the alkaline aqueous solution is preferably 0.001 to 10 mass % and more preferably 0.01 to 1 mass %. In addition, the developer may further include a surfactant. Examples of the surfactant include the above-described surfactants. Among these, a nonionic surfactant is preferable. From the viewpoint of easiness of transport, storage, and the like, the developer may be obtained by temporarily preparing a concentrated solution and diluting the concentrated solution to a necessary concentration during use. The dilution factor is not particularly limited and, for example, can be set to be in a range of 1.5 to 100 times. In a case where the alkaline aqueous solution is used as the developer, it is preferable that the layer is rinsed with pure water after development.

After the development and drying, an additional exposure treatment or a heating treatment (post-baking) can also be performed. The additional exposure treatment or the post-baking is a treatment which is performed after development to completely cure the film. In a case where the additional exposure treatment is performed, the light used for exposure is preferably light having a wavelength of 400 nm or shorter.

It is preferable that the thickness of the pixel (pattern) to be formed is appropriately selected depending on the kind of the pixel. For example, the thickness of the pixel is preferably 2.0 μm or less, more preferably 1.0 μm or less, and still more preferably 0.3 to 1.0 μm. The upper limit is preferably 0.8 μm or less and more preferably 0.6 μm or less. The lower limit value is preferably 0.4 μm or more.

In addition, it is preferable that the size (line width) of the pixel (pattern) to be formed is selected depending on the use or the kind of the pixel. For example, the size of the pixel is preferably 2.0 μm or less. The upper limit is preferably 1.0 μm or less and more preferably 0.9 μm or less. The lower limit value is preferably 0.4 μm or more.

In a case where an optical filter including plural kinds of pixels is manufactured, at least one kind of pixel may be formed through the above-described steps, and it is preferable that a pixel to be initially formed (the first kind of pixel) is formed through the above-described steps. A pixel to be secondly or subsequently formed (the second or subsequent kind of pixel) may be formed through the above-described steps or may be formed by exposure using continuous light.

Examples

Hereinafter, the present invention will be described in detail using examples. Materials, used amounts, ratios, treatment details, treatment procedures, and the like shown in the following examples can be appropriately changed within a range not departing from the scope of the present invention. Accordingly, the scope of the present invention is not limited to the following specific examples.

<Measurement of Weight-Average Molecular Weight (Mw)>

The weight-average molecular weight (Mw) of the measurement sample was measured by gel permeation chromatography (GPC) using the following conditions.

Kind of column: a column in which TOSOH TSK gel Super HZM-H, TOSOH TSK gel Super HZ4000, and TOSOH TSK gel Super HZ2000 were linked to each other Developing solvent: tetrahydrofuran Column temperature: 40° C.

Flow rate (sample injection volume): 1.0 μL (sample concentration: 0.1 mass %)

Device name: HLC-8220 GPC (manufactured by Tosoh Corporation)

Detector: refractive index (RI) detector

Calibration curve base resin: a polystyrene resin

<Method of Measuring Acid Value>

A measurement sample was dissolved in a mixed solvent including tetrahydrofuran and water at a ratio (mass ratio; tetrahydrofuran/water) of 9/1, and the obtained solution was neutralized and titrated with a 0.1 mol/L sodium hydroxide aqueous solution at 25° C. using a potentiometric titrator (trade name: AT-510, manufactured by Kyoto Electronics Manufacturing Co., Ltd.). An inflection point of a titration pH curve was set as a titration end point, and the acid value was calculated from the following expression.

$$A = 56.11 \times V_S \times 0.5 \times f/w$$

A: the acid value (mgKOH/g)

Vs: the amount (mL) of the 0.1 mol/L sodium hydroxide aqueous solution used for the titration f: the titer of the 0.1 mol/L sodium hydroxide aqueous solution w: the mass (g) of the measurement sample (expressed in terms of solid contents)

<Preparation of Dispersion Liquid>

Raw materials shown in the following tables were mixed with each other to obtain a mixed solution. The obtained mixed solution was dispersed using ULTRA APEX MILL (manufactured by Kotobuki Industries Co., Ltd.) as a circulation type dispersion apparatus (beads mill) to obtain a dispersion liquid. The solid content of the obtained dispersion liquid was 20.0 mass %.

TABLE 8

| | Pigment | | | | | | | Dispersant |
| --- | --- | --- | --- | --- | --- | --- | --- | --- |
| | PG36 | PG58 | PY150 | PY185 | PB15:6 | PV23 | PR254 | PY139 | 1 |
| Dispersion Liquid G1 | 118.5 | | 29.6 | | | | | | 51.9 |
| Dispersion Liquid G2 | | 118.5 | 29.6 | | | | | | 51.9 |
| Dispersion Liquid G3 | 118.5 | | | 29.6 | | | | | 51.9 |
| Dispersion Liquid G4 | | 118.5 | | 29.6 | | | | | 51.9 |
| Dispersion Liquid G5 | | 118.5 | | 29.6 | | | | | |
| Dispersion Liquid G6 | | 118.5 | | 29.6 | | | | | |
| Dispersion Liquid G7 | | 118.5 | | 29.6 | | | | | |
| Dispersion Liquid G8 | | 118.5 | | 29.6 | | | | | |
| Dispersion Liquid G9 | | 118.5 | | 29.6 | | | | | |
| Dispersion Liquid G10 | | 123.0 | | 30.8 | | | | | |
| Dispersion Liquid G11 | | 118.5 | | 29.6 | | | | | |
| Dispersion Liquid B1 | | | | | 118.5 | 29.6 | | | 51.9 |
| Dispersion Liquid R1 | | | | | | | 118.5 | 29.6 | 51.9 |

| | Dispersant 2 | Dispersant 3 | Dispersant 4 | Dispersant 5 | Dispersant 6 | Dispersant 7 | Solvent 1 |
| --- | --- | --- | --- | --- | --- | --- | --- |
| Dispersion Liquid G1 | | | | | | | 800.0 |
| Dispersion Liquid G2 | | | | | | | 800.0 |
| Dispersion Liquid G3 | | | | | | | 800.0 |
| Dispersion Liquid G4 | | | | | | | 800.0 |
| Dispersion Liquid G5 | 51.9 | | | | | | 800.0 |
| Dispersion Liquid G6 | | 51.9 | | | | | 800.0 |
| Dispersion Liquid G7 | | | 51.9 | | | | 800.0 |
| Dispersion Liquid G8 | | | | 51.9 | | | 800.0 |
| Dispersion Liquid G9 | | | | | 51.9 | | 800.0 |
| Dispersion Liquid G10 | | | | 46.2 | | | 800.0 |
| Dispersion Liquid G11 | | | | | | 51.9 | 800.0 |
| Dispersion Liquid B1 | | | | | | | 800.0 |
| Dispersion Liquid R1 | | | | | | | 800.0 |

TABLE 9

| | Pigment | | | | | | | Dispersant 8 | Dispersant 9 | Dispersant 10 | Dispersant 11 | Dispersant 12 | Dispersant 13 | Solvent 1 |
| --- | --- | --- | --- | --- | --- | --- | --- | --- | --- | --- | --- | --- | --- | --- |
| | PG36 | PG58 | PY150 | PY185 | PB15:6 | PV23 | PR254 | PY139 | | | | | | |
| Dispersion Liquid G12 | | 118.5 | 29.6 | | | | | | 51.9 | | | | | 800.0 |
| Dispersion Liquid G13 | | 118.5 | 29.6 | | | | | | | 51.9 | | | | 800.0 |
| Dispersion Liquid G14 | | 118.5 | 29.6 | | | | | | | | 51.9 | | | 800.0 |
| Dispersion Liquid G15 | | 118.5 | 29.6 | | | | | | | | | 51.9 | | 800.0 |

TABLE 9-continued

| | Pigment | | | | | | | Dispersant 8 | Dispersant 9 | Dispersant 10 | Dispersant 11 | Dispersant 12 | Dispersant 13 | Solvent 1 |
|---|---|---|---|---|---|---|---|---|---|---|---|---|---|---|
| | PG36 | PG58 | PY150 | PY185 | PB15:6 | PV23 | PR254 | PY139 | | | | | | | |
| Dispersion Liquid G16 | 118.5 | | 29.6 | | | | | | | | | | 51.9 | | 800.0 |
| Dispersion Liquid G17 | 118.5 | | 29.6 | | | | | | | | | | | 51.9 | 800.0 |

The raw materials shown above in the table are as follows.
(Pigment)
PG36: C.I. Pigment Green 36
PG58: C.I. Pigment Green 58
PY139: C.I. Pigment Yellow 139
PY150: C.I. Pigment Yellow 150
PY185: C.I. Pigment Yellow 185
PB 15:6: C.I. Pigment Blue 15:6
PV23: C.I. Pigment Violet 23
PR254: C.I. Pigment Red 254
(Dispersant)
Dispersant 1: a compound having the following structure (a radically polymerizable compound having a weight-average molecular weight of 3000 or higher, a numerical value added to a main chain represents a molar ratio, and a numerical value added to a side chain represents the number of repeating units, Mw: 20000, C=C value: 0.7 mmol/g, acid value: 72 mgKOH/g)

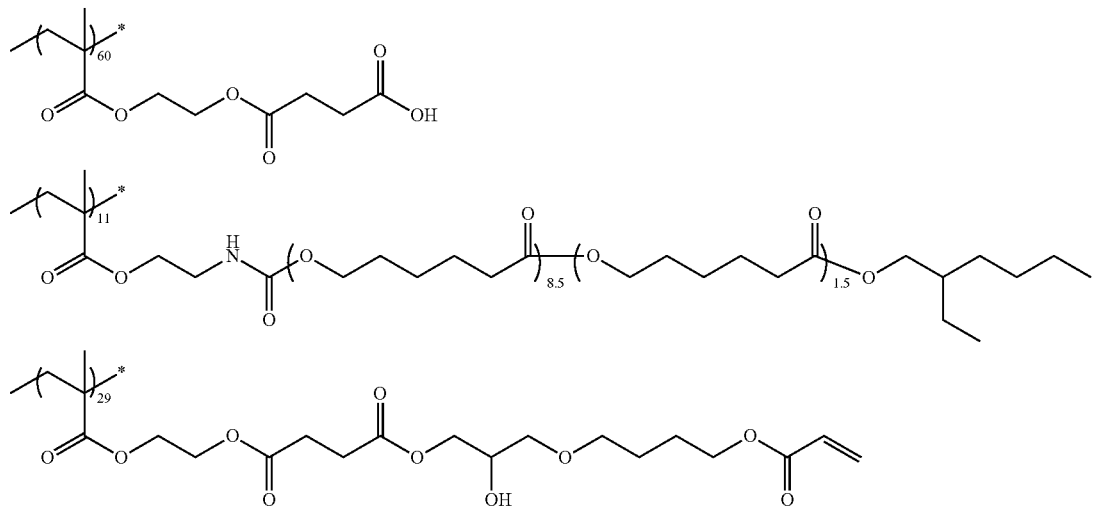

Dispersant 2: a compound having the following structure (a radically polymerizable compound having a weight-average molecular weight of 3000 or higher, a numerical value added to a main chain represents a molar ratio, and a numerical value added to a side chain represents the number of repeating units, Mw: 20000, C=C value: 0.7 mmol/g, acid value: 50 mgKOH/g)

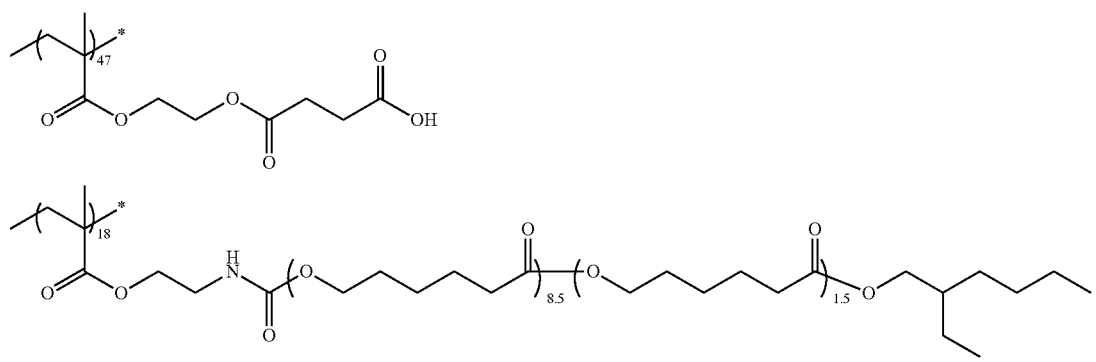

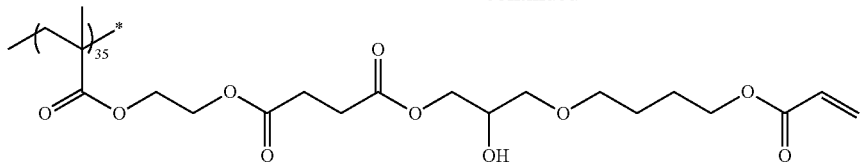

Dispersant 3: a compound having the following structure (a radically polymerizable compound having a weight-average molecular weight of 3000 or higher, a numerical value added to a main chain represents a molar ratio, and a numerical value added to a side chain represents the number of repeating units, Mw: 20000, C═C value: 0.8 mmol/g, acid value: 98 mgKOH/g)

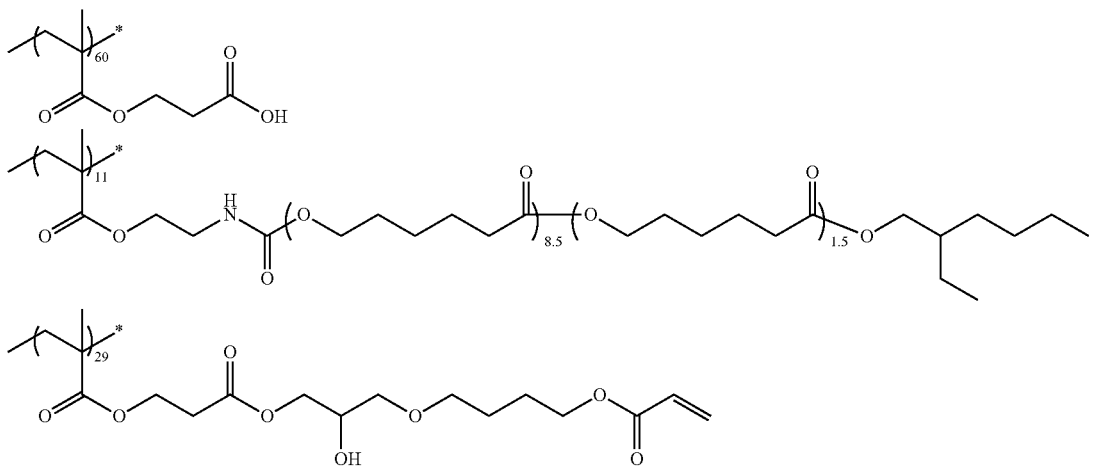

Dispersant 4: a compound having the following structure (a radically polymerizable compound having a weight-average molecular weight of 3000 or higher, a numerical value added to a main chain represents a molar ratio, and a numerical value added to a side chain represents the number of repeating units, Mw: 20000, C═C value: 0.8 mmol/g, acid value: 75 mgKOH/g)

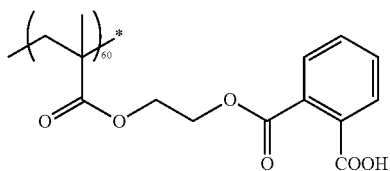

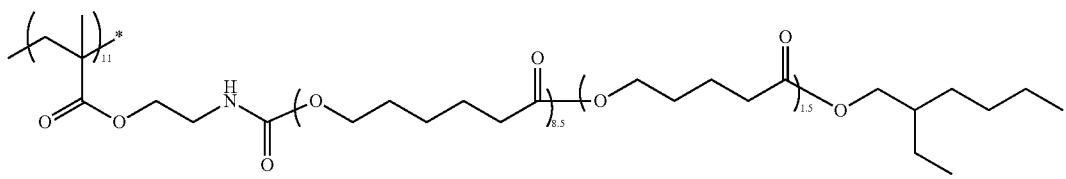

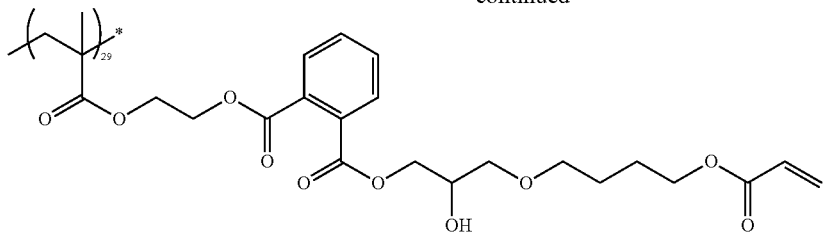

Dispersant 5: a compound having the following structure (a radically polymerizable compound having a weight-average molecular weight of 3000 or higher, a numerical value added to a main chain represents a molar ratio, and a numerical value added to a side chain represents the number of repeating units, Mw: 20000, C=C value: 0.4 mmol/g, acid value: 90 mgKOH/g)

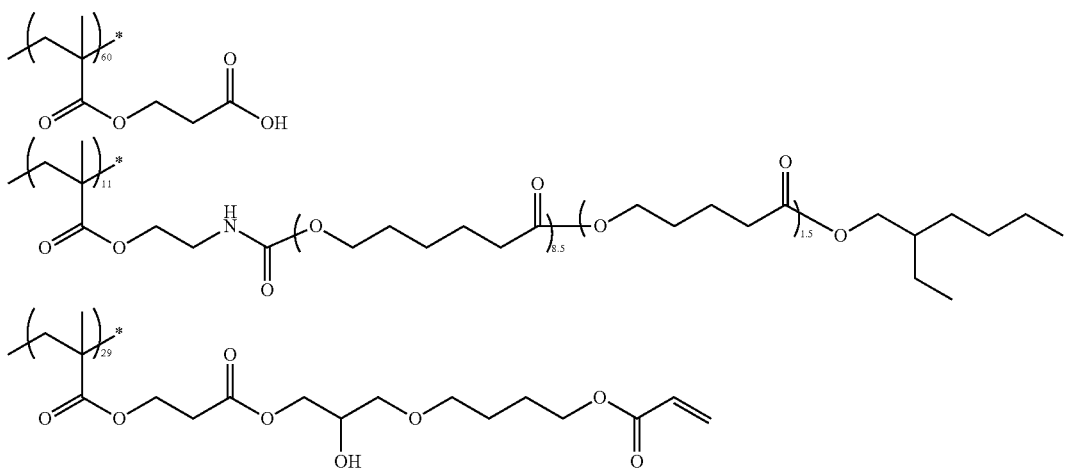

Dispersant 6: a compound having the following structure (a radically polymerizable compound having a weight-average molecular weight of 3000 or higher, a numerical value added to a main chain represents a molar ratio, and a numerical value added to a side chain represents the number of repeating units, Mw: 5000, C=C value: 0.7 mmol/g, acid value: 72 mgKOH/g)

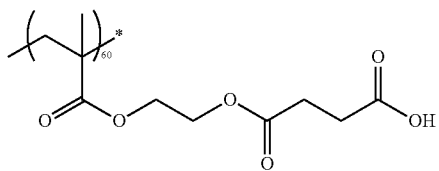

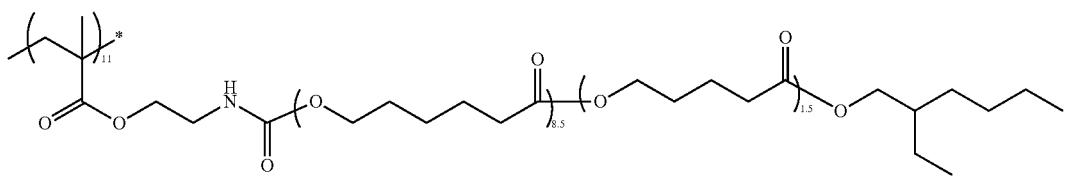

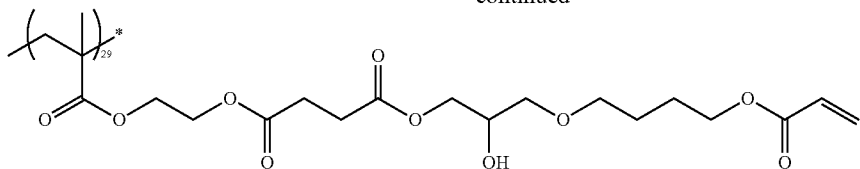

Dispersant 7: a compound having the following structure (a numerical value added to a main chain represents a molar ratio, and a numerical value added to a side chain represents the number of repeating units; Mw=20000, acid value=50 mgKOH/g)

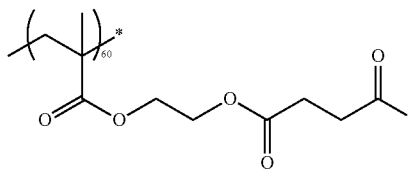

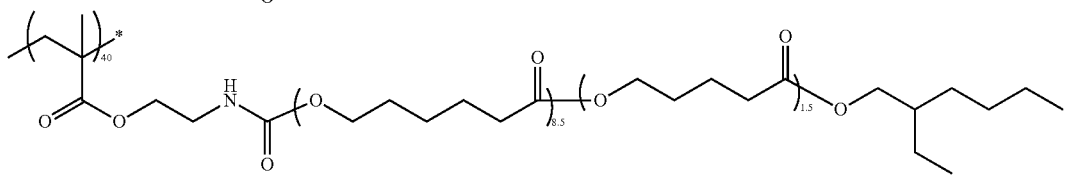

Dispersant 8: a compound having the following structure (a radically polymerizable compound having a weight-average molecular weight of 3000 or higher, a numerical value added to a main chain represents a molar ratio, and a numerical value added to a side chain represents the number of repeating units, Mw: 20000, C=C value: 0.7 mmol/g, acid value: 20 mgKOH/g)

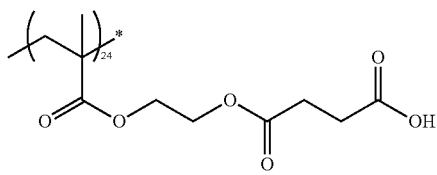

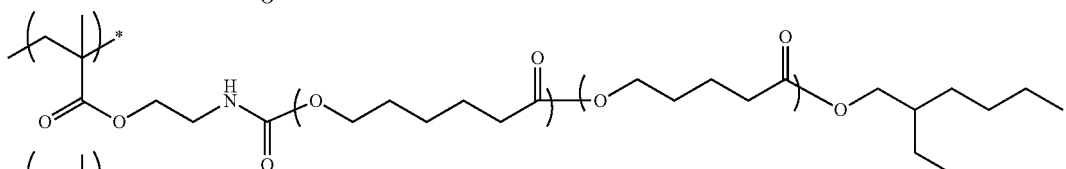

Dispersant 9: a compound having the following structure (a radically polymerizable compound having a weight-average molecular weight of 3000 or higher, a numerical value added to a main chain represents a molar ratio, and a numerical value added to a side chain represents the number of repeating units, Mw: 20000, C=C value: 0.7 mmol/g, acid value: 158 mgKOH/g)

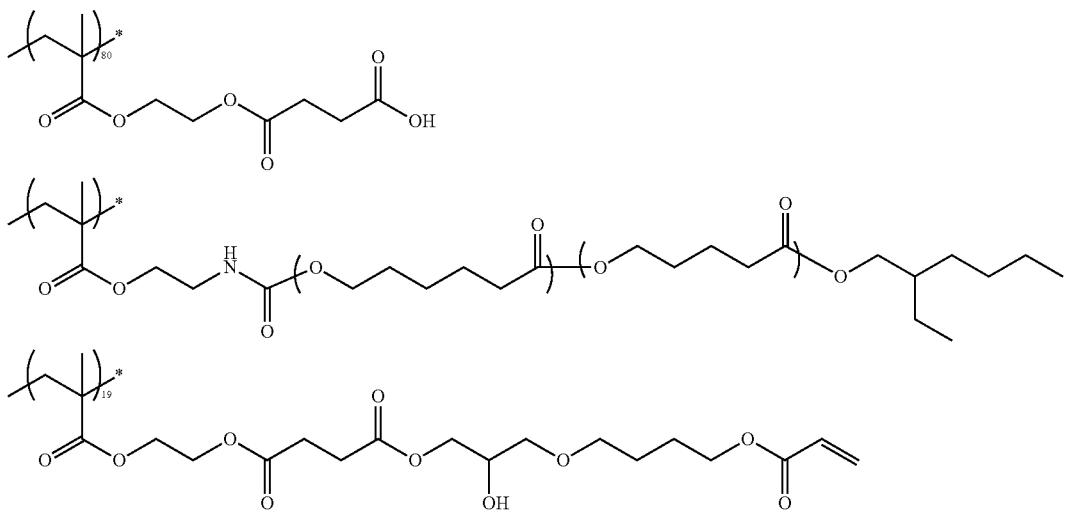

Dispersant 10: a compound having the following structure (a radically polymerizable compound having a weight-average molecular weight of 3000 or higher, a numerical value added to a main chain represents a molar ratio, and a numerical value added to a side chain represents the number of repeating units, Mw: 20000, C=C value: 0.15 mmol/g, acid value: 69 mgKOH/g)

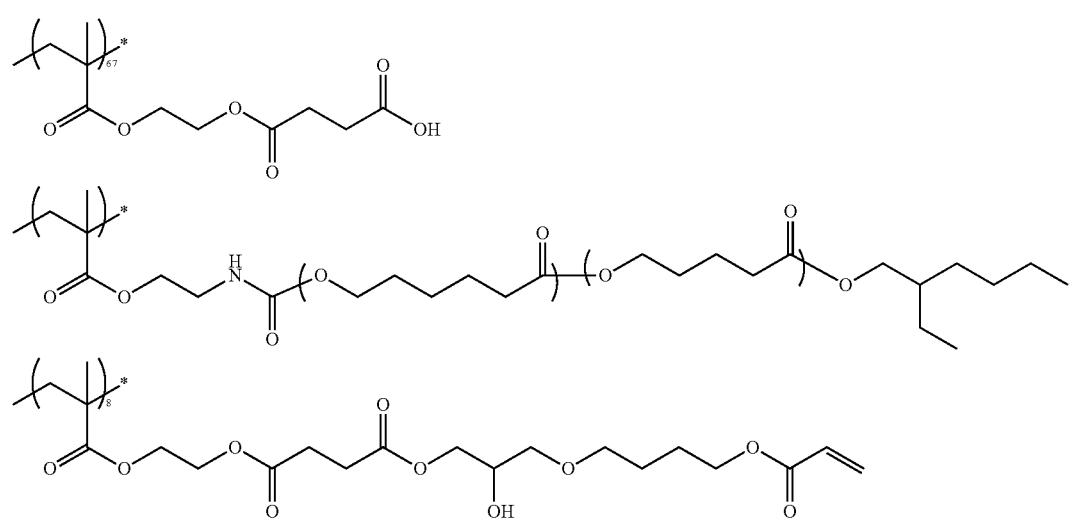

Dispersant 11: a compound having the following structure (a radically polymerizable compound having a weight-average molecular weight of 3000 or higher, a numerical value added to a main chain represents a molar ratio, and a numerical value added to a side chain represents the number of repeating units, Mw: 20000, C=C value: 3.1 mmol/g, acid value: 41 mgKOH/g)

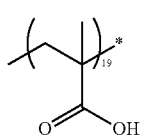

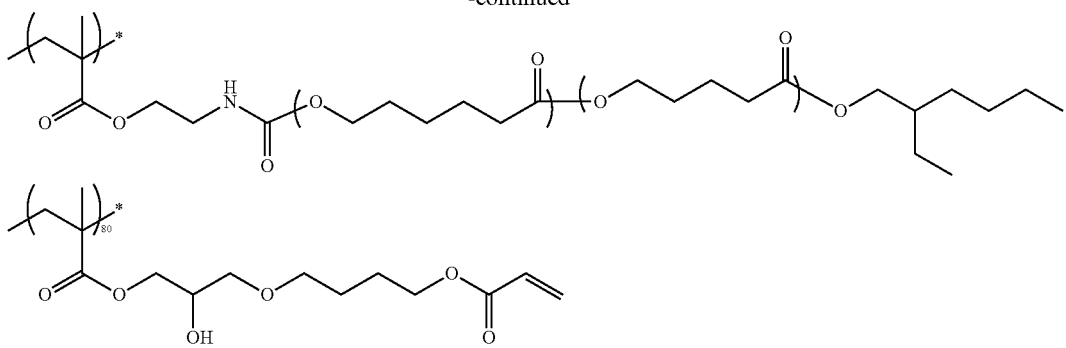

Dispersant 12: a compound having the following structure (a radically polymerizable compound having a weight-average molecular weight of 3000 or higher, a numerical value added to a main chain represents a molar ratio, and a numerical value added to a side chain represents the number of repeating units, Mw: 4000, C═C value: 0.7 mmol/g, acid value: 72 mgKOH/g)

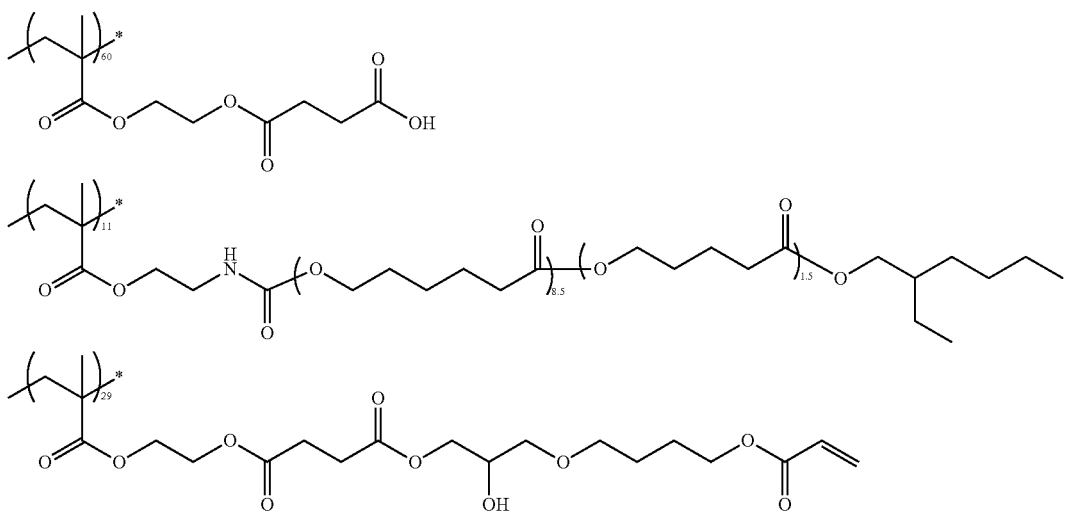

Dispersant 13: a compound having the following structure (a radically polymerizable compound having a weight-average molecular weight of 3000 or higher, a numerical value added to a main chain represents a molar ratio, and a numerical value added to a side chain represents the number of repeating units, Mw: 50000, C═C value: 0.7 mmol/g, acid value: 72 mgKOH/g)

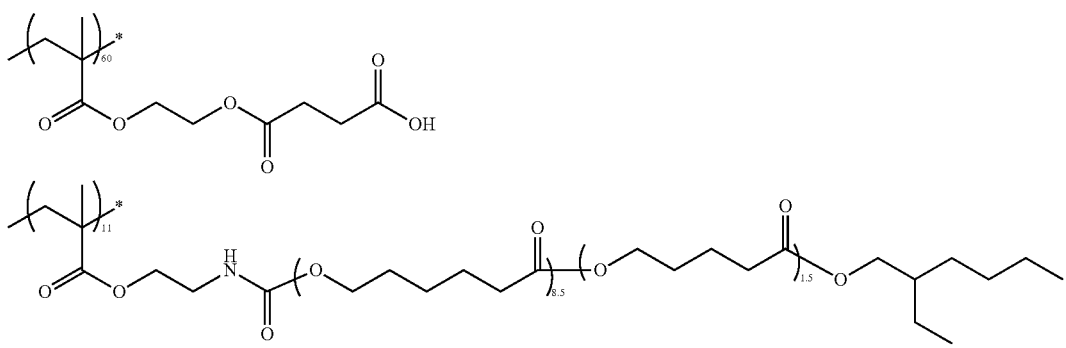

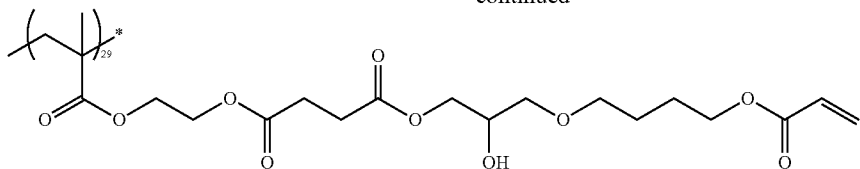

Solvent 1: propylene glycol monomethyl ether acetate (PGMEA)

<Preparation of Photosensitive Composition>
(Green Composition)
Raw materials shown in the following tables were mixed with each other to prepare photosensitive compositions (green compositions 1 to 30, R1)

TABLE 10

|  | Green Composition 1 | Green Composition 2 | Green Composition 3 | Green Composition 4 | Green Composition 5 | Green Composition 6 | Green Composition 7 | Green Composition 8 |
|---|---|---|---|---|---|---|---|---|
| Dispersion Liquid G1 | 85.14 | | | | | | | |
| Dispersion Liquid G2 | | 85.14 | | | | | | |
| Dispersion Liquid G3 | | | 85.14 | | | | | |
| Dispersion Liquid G4 | | | | 85.14 | | | | |
| Dispersion Liquid G5 | | | | | 85.14 | | | |
| Dispersion Liquid G6 | | | | | | 85.14 | | |
| Dispersion Liquid G7 | | | | | | | 85.14 | |
| Dispersion Liquid G8 | | | | | | | | 85.14 |
| Dispersion Liquid G9 | | | | | | | | |
| Dispersion Liquid G10 | | | | | | | | |
| Dispersion Liquid G11 | | | | | | | | |
| Dispersion Liquid G12 | | | | | | | | |
| Dispersion Liquid G13 | | | | | | | | |
| Dispersion Liquid G14 | | | | | | | | |
| Dispersion Liquid G15 | | | | | | | | |
| Dispersion Liquid G16 | | | | | | | | |
| Dispersion Liquid G17 | | | | | | | | |
| Alkali-Soluble Resin 1 | 0.05 | 0.05 | 0.05 | 0.05 | 0.05 | 0.05 | 0.05 | 0.05 |
| Radically Polymerizable Monomer 1 | | | | | | | | |
| Radically Polymerizable Monomer 2 | | | | | | | | |
| Radically Polymerizable Monomer 3 | | | | | | | | |
| Radically Polymerizable Monomer 4 | | | | | | | | |
| Radically Polymerizable Monomer 5 | | | | | | | | |
| Photopolymerization Initiator 1 | 0.90 | 0.90 | 0.90 | 0.90 | 0.90 | 0.90 | 0.90 | 0.90 |
| Polymerization Inhibitor 1 | 0.01 | 0.01 | 0.01 | 0.01 | 0.01 | 0.01 | 0.01 | 0.01 |
| Surfactant 1 | 0.01 | 0.01 | 0.01 | 0.01 | 0.01 | 0.01 | 0.01 | 0.01 |
| Solvent 1 | 13.89 | 13.89 | 13.89 | 13.89 | 13.89 | 13.89 | 13.89 | 13.89 |

TABLE 11

|  | Green Composition 9 | Green Composition 10 | Green Composition 11 | Green Composition 12 | Green Composition 13 | Green Composition 14 | Green Composition 15 | Green Composition 16 |
|---|---|---|---|---|---|---|---|---|
| Dispersion Liquid G1 | | | | | | | | |
| Dispersion Liquid G2 | | | | | | | | |
| Dispersion Liquid G3 | | | | | | | | |
| Dispersion Liquid G4 | | | | | 79.05 | 79.05 | 79.05 | 72.97 |
| Dispersion Liquid G5 | | | | | | | | |

TABLE 11-continued

| | Green Composition 9 | Green Composition 10 | Green Composition 11 | Green Composition 12 | Green Composition 13 | Green Composition 14 | Green Composition 15 | Green Composition 16 |
|---|---|---|---|---|---|---|---|---|
| Dispersion Liquid G6 | | | | | | | | |
| Dispersion Liquid G7 | | | | | | | | |
| Dispersion Liquid G8 | | | | | | | | |
| Dispersion Liquid G9 | 85.14 | | | | | | | |
| Dispersion Liquid G10 | | 81.82 | 81.82 | 81.82 | | | | |
| Dispersion Liquid G11 | | | | | | | | |
| Dispersion Liquid G12 | | | | | | | | |
| Dispersion Liquid G13 | | | | | | | | |
| Dispersion Liquid G14 | | | | | | | | |
| Dispersion Liquid G15 | | | | | | | | |
| Dispersion Liquid G16 | | | | | | | | |
| Dispersion Liquid G17 | | | | | | | | |
| Alkali-Soluble Resin 1 | 0.05 | 0.72 | 0.54 | 0.18 | 1.27 | 1.09 | 0.73 | 2.31 |
| Radically Polymerizable Monomer 1 | | | 0.18 | 0.54 | | 0.18 | 0.54 | 0.18 |
| Radically Polymerizable Monomer 2 | | | | | | | | |
| Radically Polymerizable Monomer 3 | | | | | | | | |
| Radically Polymerizable Monomer 4 | | | | | | | | |
| Radically Polymerizable Monomer 5 | | | | | | | | |
| Photopolymerization Initiator 1 | 0.90 | 0.90 | 0.90 | 0.90 | 0.90 | 0.90 | 0.90 | 0.90 |
| Polymerization Inhibitor 1 | 0.01 | 0.01 | 0.01 | 0.01 | 0.01 | 0.01 | 0.01 | 0.01 |
| Surfactant 1 | 0.01 | 0.01 | 0.01 | 0.01 | 0.01 | 0.01 | 0.01 | 0.01 |
| Solvent 1 | 13.89 | 16.55 | 16.55 | 16.55 | 18.76 | 18.76 | 18.76 | 23.62 |

TABLE 12

| | Green Composition 17 | Green Composition 18 | Green Composition 19 | Green Composition 20 | Green Composition 21 | Green Composition 22 | Green Composition 23 | Green Composition 24 |
|---|---|---|---|---|---|---|---|---|
| Dispersion Liquid G1 | | | | | | | | |
| Dispersion Liquid G2 | | | | | | | | |
| Dispersion Liquid G3 | | | | | | | | |
| Dispersion Liquid G4 | 60.81 | 48.65 | 36.49 | 85.14 | | | | |
| Dispersion Liquid G5 | | | | | | | | |
| Dispersion Liquid G6 | | | | | | | | |
| Dispersion Liquid G7 | | | | | | | | |
| Dispersion Liquid G8 | | | | | | | | |
| Dispersion Liquid G9 | | | | | | | | |
| Dispersion Liquid G10 | | | | | 81.82 | 81.82 | 81.82 | 81.82 |
| Dispersion Liquid G11 | | | | | | | | |
| Dispersion Liquid G12 | | | | | | | | |
| Dispersion Liquid G13 | | | | | | | | |
| Dispersion Liquid G14 | | | | | | | | |
| Dispersion Liquid G15 | | | | | | | | |
| Dispersion Liquid G16 | | | | | | | | |
| Dispersion Liquid G17 | | | | | | | | |
| Alkali-Soluble Resin 1 | 4.74 | 7.17 | 9.60 | 0.41 | 0.54 | 0.54 | 0.54 | 0.54 |
| Radically Polymerizable Monomer 1 | 0.18 | 0.18 | 0.18 | | | | | |
| Radically Polymerizable Monomer 2 | | | | | 0.18 | | | |
| Radically Polymerizable Monomer 3 | | | | | | 0.18 | | |
| Radically Polymerizable Monomer 4 | | | | | | | 0.18 | |
| Radically Polymerizable Monomer 5 | | | | | | | | 0.18 |
| Photopolymerization Initiator 1 | 0.90 | 0.90 | 0.90 | 0.90 | 0.90 | 0.90 | 0.90 | 0.90 |
| Polymerization Inhibitor 1 | 0.01 | 0.01 | 0.01 | 0.01 | 0.01 | 0.01 | 0.01 | 0.01 |
| Surfactant 1 | 0.01 | 0.01 | 0.01 | 0.01 | 0.01 | 0.01 | 0.01 | 0.01 |
| Solvent 1 | 33.35 | 43.08 | 52.81 | 13.89 | 16.55 | 16.55 | 16.55 | 16.55 |

TABLE 13

| | Green Composition 25 | Green Composition 26 | Green Composition 27 | Green Composition 28 | Green Composition 29 | Green Composition 30 | Green Composition R1 |
|---|---|---|---|---|---|---|---|
| Dispersion Liquid G1 | | | | | | | |
| Dispersion Liquid G2 | | | | | | | |
| Dispersion Liquid G3 | | | | | | | |
| Dispersion Liquid G4 | | | | | | | |
| Dispersion Liquid G5 | | | | | | | |
| Dispersion Liquid G6 | | | | | | | |
| Dispersion Liquid G7 | | | | | | | |
| Dispersion Liquid G8 | | | | | | | |
| Dispersion Liquid G9 | | | | | | | |
| Dispersion Liquid G10 | | | | | | | |
| Dispersion Liquid G11 | | | | | | | 85.14 |
| Dispersion Liquid G12 | 85.14 | | | | | | |
| Dispersion Liquid G13 | | 85.14 | | | | | |
| Dispersion Liquid G14 | | | 85.14 | | | | |
| Dispersion Liquid G15 | | | | 85.14 | | | |
| Dispersion Liquid G16 | | | | | 85.14 | | |
| Dispersion Liquid G17 | | | | | | 85.14 | |
| Alkali-Soluble Resin 1 | 0.05 | 0.05 | 0.05 | 0.05 | 0.05 | 0.05 | 0.05 |
| Radically Polymerizable Monomer 1 | | | | | | | |
| Radically Polymerizable Monomer 2 | | | | | | | |
| Radically Polymerizable Monomer 3 | | | | | | | |
| Radically Polymerizable Monomer 4 | | | | | | | |
| Radically Polymerizable Monomer 5 | | | | | | | |
| Photopolymerization Initiator 1 | 0.90 | 0.90 | 0.90 | 0.90 | 0.90 | 0.90 | 0.90 |
| Polymerization Inhibitor 1 | 0.01 | 0.01 | 0.01 | 0.01 | 0.01 | 0.01 | 0.01 |
| Surfactant 1 | 0.01 | 0.01 | 0.01 | 0.01 | 0.01 | 0.01 | 0.01 |
| Solvent 1 | 13.89 | 13.89 | 13.89 | 13.89 | 13.89 | 13.89 | 13.89 |

The raw materials shown above in the table are as follows.

Alkali-soluble resin 1: a resin having the following structure (a numerical value added to a main chain represents a molar ratio; Mw=14000, acid value=40 mgKOH/g)

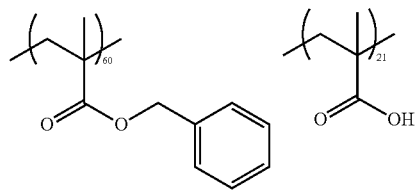

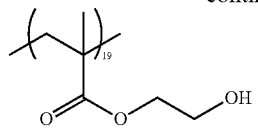

Radically polymerizable monomer 1: pentaerythritol tetraacrylate (molecular weight: 352, C═C value: 11.4 mmol/g)

Radically polymerizable monomer 2: KAYARAD DPHA (manufactured by Nippon Kayaku Co., Ltd., molecular weight: lower than 3000)

Radically polymerizable monomer 3: ARONIX M-350 (manufactured by Toagosei Co., Ltd., molecular weight: lower than 3000)

Radically polymerizable monomer 4: a compound having the following structure (molecular weight: 899)

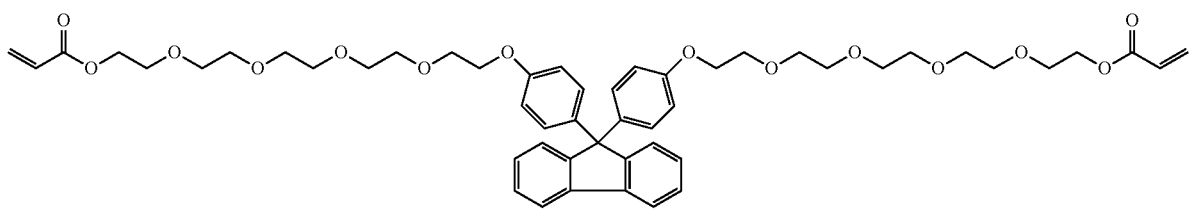 [SMILES: C=CC(=O)OCCOCCOCCOCCOCCOc1ccc(C2(c3ccc(OCCOCCOCCOCCOCCOC(=O)C=C)cc3)c3ccccc3-c3ccccc32)cc1]

Radically polymerizable monomer 5: phenoxyethyl acrylate (molecular weight: 192)

Photoradical polymerization initiator 1: a compound having the following structure (quantum yield (solution: pulse exposure at 355 nm): 0.41, quantum yield (film: pulse exposure at 265 nm): 0.19, amount of radical generated (film: pulse exposure at 265 nm): 0.0000001 mmol/cm$^2$)

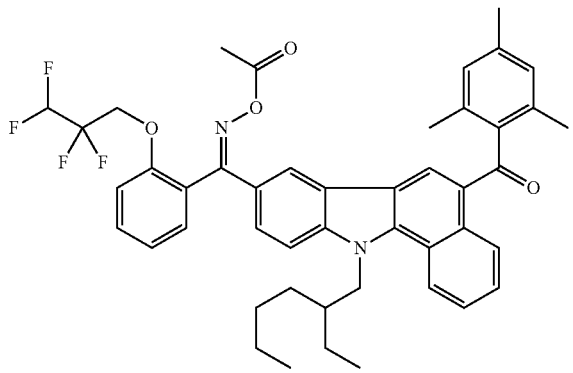 [SMILES: CCCCC(CC)Cn1c2ccc(/C(=N\OC(C)=O)c3ccccc3OCC(F)(F)C(F)F)cc2c2cc(C(=O)c3c(C)cc(C)cc3C)c3ccccc3c21]

The quantum yield (solution: pulse exposure at 355 nm) of the photoradical polymerization initiator was a value calculated using the following method. That is, each of the photoradical polymerization initiators was dissolved in propylene glycol monomethyl ether acetate to prepare a propylene glycol monomethyl ether acetate solution including 0.035 mmol/L of the photoradical polymerization initiator. This solution was put into an optical cell of 1 cm×1 cm×4 cm to measure an absorbance at a wavelength of 355 nm using a spectrophotometer (manufactured by Agilent Technologies Inc., HP8453). Next, after this solution was exposed to pulses of light having a wavelength of 355 nm under conditions of maximum instantaneous illuminance: 375000000 W/m$^2$, pulse duration: 8 nanoseconds, and frequency: 10 Hz, an absorbance of the solution at a wavelength of 355 nm after the pulse exposure was measured. The quantum yield of the photoradical polymerization initiator (solution: pulse exposure at 355 nm) was obtained by dividing the number of decomposed molecules in the photoradical polymerization initiator after the pulse exposure under the above-described condition by the number of absorbed photons in the photoradical polymerization initiator. Regarding the number of absorbed photons, the number of irradiated photons was obtained from the exposure time during the pulse exposure under the above-described condition, an average absorbance at 355 nm before and after exposure was converted into a transmittance, and the number of irradiated photons was multiplied by (1−transmittance) to obtain the number of absorbed photons. Regarding the number of decomposed molecules, a decomposition rate of the photoradical polymerization initiator was obtained from the absorbance of the photoradical polymerization initiators after exposure, and the decomposition rate was multiplied by the number of molecules present in the photoradical polymerization initiator to obtain the number of decomposed molecules.

In addition, the quantum yield (film: pulse exposure at 265 nm) of the photoradical polymerization initiator was a value calculated using the following method. That is, 5 parts by mass of the photoradical polymerization initiator and 95 parts by mass of the resin (A) having the following structure were dissolved in propylene glycol monomethyl ether acetate to prepare a propylene glycol monomethyl ether acetate solution having a solid content concentration of 20 mass %. This solution was applied to a quartz substrate using a spin coating method and was dried at 100° C. for 120 seconds to form a film having a thickness of 1.0 μm. The transmittance of the obtained film at a wavelength of 265 nm was measured using a spectrophotometer (U-4100, manufactured by Hitachi High-Technologies Corporation) (reference: quartz substrate). Next, after this film was exposed to pulses of light having a wavelength of 265 nm under conditions of maximum instantaneous illuminance: 375000000 W/m$^2$, pulse duration: 8 nanoseconds, and frequency: 10 Hz, a transmittance of the film after the pulse exposure was measured. The quantum yield of the photoradical polymerization initiator (film: pulse exposure at 265 nm) was obtained by dividing the number of decomposed molecules in the photoradical polymerization initiator per 1 cm$^2$ of the film after the pulse exposure under the above-described condition by the number of absorbed photons in the photoradical polymerization initiator. Regarding the number of absorbed photons, the number of irradiated photons was obtained from the exposure time during the pulse exposure under the above-described condition, and the number of irradiated photons per 1 cm$^2$ of the film was multiplied by (1−transmittance) to obtain the number of absorbed photons. Regarding the number of decomposed molecules in the photoradical polymerization initiator per 1 cm$^2$ of the film after exposure, a decomposition rate of the photoradical polymerization initiator was obtained from a change in the absorbance of the film before and after exposure was obtained, and the decomposition rate of the photoradical polymerization initiator was multiplied by the number of molecules present in the photoradical polymerization initiator per 1 cm$^2$ of the film. The weight of the film per 1 cm$^2$ of the film area was obtained by setting the film density as 1.2 g/cm$^3$, and the number of molecules present in the photoradical polymerization initiator per 1 cm$^2$ of the film was obtained as "((Weight of Film per 1 cm$^2$ of Film x 5 mass % (Content of Photoradical Polymerization Initiator)/Molecular Weight of Photoradical Polymerization Initiator)×6.02×10$^{23}$ (Avogadro's Number)".

Resin (A): a resin having the following structure. A numerical value added to a repeating unit represents a molar ratio, a weight-average molecular weight is 40000, and a dispersity (Mn/Mw) is 5.0.

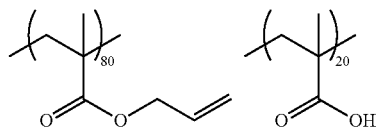

In addition, the amount of a radical generated (film: pulse exposure at 265 nm) in the photoradical polymerization initiator was a value calculated using the following method. That is, 5 parts by mass of the photoradical polymerization initiator and 95 parts by mass of the resin (A) having the above-described structure were dissolved in propylene glycol monomethyl ether acetate to prepare a propylene glycol monomethyl ether acetate solution having a solid content concentration of 20 mass %. This solution was applied to a quartz substrate using a spin coating method and was dried at 100° C. for 120 seconds to form a film having a thickness of 1.0 μm. The transmittance of the obtained film at a wavelength of 265 nm was measured using a spectrophotometer (U-4100, manufactured by Hitachi High-Technologies Corporation) (reference: quartz substrate). Next, after this film was exposed to one pulse of light having a wavelength of 265 nm under conditions of maximum instantaneous illuminance: 625000000 W/m$^2$, pulse duration: 8 nanoseconds, and frequency: 10 Hz, a transmittance of the film after the pulse exposure was measured. The amount of a radical generated (film: pulse exposure at 265 nm) in the photoradical polymerization initiator was obtained by multiplying a quantum yield of the photoradical polymerization initiator b1 at a wavelength of 265 nm by (1−transmittance of film) to calculate a decomposition rate per number of incident photons and calculating the density of the photoradical polymerization initiator decomposed per 1 cm$^2$ of the film from "mol number of photons per one pulse"×"decomposition rate of photoradical polymerization initiator per number of incident photons". The amount of a radical generated was calculated assuming that the entirety of the photoradical polymerization initiator decomposed by light irradiation was a radical (that does not disappear during an intermediate reaction).

Surfactant 1: a compound having the following structure (Mw: 14,000, a numerical value of "%" representing the proportion of a repeating unit is mol %)

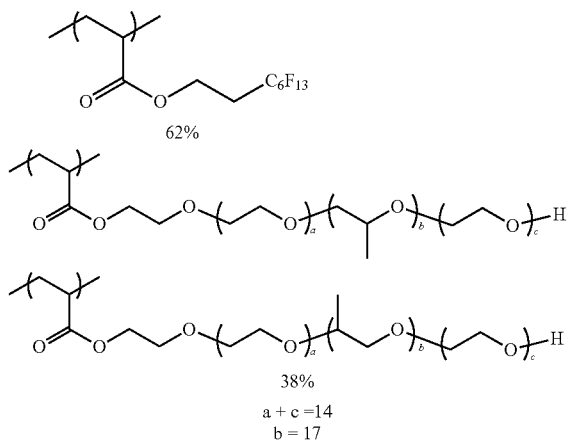

a + c = 14
b = 17

Polymerization inhibitor 1: p-methoxyphenol
Solvent 1: propylene glycol monomethyl ether acetate (PGMEA)

(Blue Composition)

A blue composition 1 was prepared using the same method as that of the green composition 1, except that a dispersion liquid B1 was used instead of the dispersion liquid G1.

(Red Composition)

A red composition 1 was prepared using the same method as that of the green composition 1, except that a dispersion liquid R1 was used instead of the dispersion liquid G1.

<Evaluation Test of Photolithographic Properties>

Each of the green compositions obtained as described above was applied to an 8-inch (203.2 mm) silicon wafer with an undercoat layer with a spin coating method using Act 8 (manufactured by Tokyo Electron Ltd.) such that the thickness of the applied film was 0.5 μm. Next, the applied composition was heated using a hot plate at 100° C. for 2 minutes to form composition layer. Next, using a KrF scanner exposure device, the obtained composition layer was irradiated with light for pulse exposure under the following condition through a mask having a pattern having a size of 1.0 cm×1.0 cm. Next, shower development was performed on the exposed composition layer at 23° C. for 60 seconds by using a tetramethylammonium hydroxide (TMAH) 0.3 mass % aqueous solution as a developer. Next, the coating film was rinsed by spin showering using pure water to form a pattern (green pixel).

The obtained pattern was observed with a scanning electron microscope (S-4800H, manufactured by Hitachi High-Technologies Corporation) at a magnification of 20000-power. Using the observed image, photolithographic properties were evaluated based on the following standards. An evaluation test of photolithographic properties was performed three times for each sample, and the results thereof were collectively taken into consideration for determination. The pulse exposure condition was as follows.

Exposure light: KrF ray (wavelength: 248 nm)
Exposure dose: 100 J/cm$^2$
Maximum instantaneous illuminance: 250000000 W/m$^2$ (average illuminance: 30000 W/m$^2$)
Pulse duration: 30 nanoseconds
Frequency: 4 kHz (Evaluation Standards)

5: the linearity of four sides of the pattern was excellent, and no residues were found between the patterns
4: the linearity of four sides of the pattern was excellent, and a small amount of residues were found between the patterns
3: four sides of the pattern were slightly round, and a small amount of residues were found between the patterns
2: four sides of the pattern were round, and a large amount of residues were found between the patterns
1: no pattern was able to be formed <Evaluation of Solvent Resistance>

Each of the green compositions obtained as described above was applied to soda glass (75 mm×75 mm square, thickness: 1.1 mm) using a spin coater (H-3605, manufactured by Mikasa Co., Ltd.). Next, the applied composition was pre-baked using a hot plate at 100° C. for 2 minutes to obtain a coating film. The obtained coating film was exposed to pulses of light using a KrF scanner exposure device under the above-described condition. Next, the exposed coating film was heated using a hot plate in an air atmosphere at 200° C. for 5 minutes to obtain a film having a thickness of 0.5 μm. Regarding the obtained film, a light transmittance (transmittance) in a wavelength range of 400 nm to 700 nm was measured using "MCPD-3000" (manufactured by Otsuka Electronics Co., Ltd.).

Next, the film prepared as described above was dipped in propylene glycol monomethyl ether acetate for 5 minutes and then was cleaned with pure water (solvent resistance test). After the solvent resistance test, the transmittance of the film was measured, and a maximum value of the amount of change in transmittance was obtained to evaluate solvent resistance based on the following standards.

The measurement of the transmittance was performed five times for each sample, and an average value of three results other than a maximum value and a minimum value was adopted. In addition, the maximum value of the amount of change in transmittance refers to the amount of change at a wavelength at which the amount of change in the transmittance of the film in a wavelength range of 400 to 700 nm before and after the solvent resistance test was the maximum.

(Evaluation Standards)
5: the maximum value of the amount of change in transmittance was 3% or lower
4: the maximum value of the amount of change in transmittance was higher than 3% and 5% or lower
3: the maximum value of the amount of change in transmittance was higher than 5% and 7% or lower
2: the maximum value of the amount of change in transmittance was higher than 7% and 10% or lower
1: the maximum value of the amount of change in transmittance was higher than 10%

<Evaluation of Moisture Resistance>

Each of the green compositions obtained as described above was applied to soda glass (75 mm×75 mm square, thickness: 1.1 mm) using a spin coater (H-3605, manufactured by Mikasa Co., Ltd.). Next, the applied composition was pre-baked using a hot plate at 100° C. for 2 minutes to obtain a coating film. The obtained coating film was exposed to pulses of light using a KrF scanner exposure device under the above-described condition. Next, the exposed coating film was heated using a hot plate in an air atmosphere at 200° C. for 5 minutes to obtain a film having a thickness of 0.5 µm. Regarding the obtained film, a light transmittance (transmittance) in a wavelength range of 400 nm to 700 nm was measured using "MCPD-3000" (manufactured by Otsuka Electronics Co., Ltd.).

Next, the film prepared as described above was left to stand in a high temperature high humidity temperature at 85° C. and 85% for 1000 hours. After the moisture resistance test, the transmittance of the film was measured, and a maximum value of the amount of change in transmittance was obtained to evaluate solvent resistance based on the following standards.

The measurement of the transmittance was performed five times for each sample, and an average value of three results other than a maximum value and a minimum value was adopted. In addition, the maximum value of the amount of change in transmittance refers to the amount of change at a wavelength at which the amount of change in the transmittance of the film in a wavelength range of 400 to 700 nm before and after the moisture resistance test was the maximum.

(Evaluation Standards)
5: the maximum value of the amount of change in transmittance was 3% or lower
4: the maximum value of the amount of change in transmittance was higher than 3% and 5% or lower
3: the maximum value of the amount of change in transmittance was higher than 5% and 7% or lower
2: the maximum value of the amount of change in transmittance was higher than 7% and 10% or lower
1: the maximum value of the amount of change in transmittance was higher than 10%

<Evaluation Test of Thermal Diffusivity Resistance>

A pattern (green pixel) of 5 µm x 5 µm was formed using the same method as that of the evaluation test of photolithographic properties, except that each of the green compositions obtained as described above was exposed through a mask including a pattern of 5.0 µm×5.0 µm on an 8-inch (203.2 mm) glass wafer with an undercoat layer.

Next, on the glass wafer where a green pixel was formed, a blue pattern (blue pixel) and a red pattern (red pixel) were formed with the same method as that of the evaluation test of photolithographic properties using the blue composition 1 and the red composition 1 in portions of the silicon wafer where a green pixel was not formed. Regarding the red pixel and the blue pixel, a transmittance (spectral characteristics 1) in a wavelength range of 400 to 700 nm was measured using a microscopic system (LVmicro V, manufactured by Lambda Vision Inc.).

Next, the glass wafers on which the green pixel, the blue pixel, and the red pixel were formed was heated using a hot plate in an air atmosphere at 260° C. for 5 minutes. Regarding the blue pixel and the red pixel, a transmittance (spectral characteristics 2) in a wavelength range of 400 to 700 nm was measured using a microscopic system (LVmicro V, manufactured by Lambda Vision Inc.).

A maximum value of the amount of change in transmittance was obtained using the spectral characteristics 1 and the spectral characteristics 2 of the blue pixel and the red pixel to evaluate the mixing of colors based on the following standards.

The measurement of the transmittance was performed five times for each sample, and an average value of three results other than a maximum value and a minimum value was adopted. In addition, the maximum value of the amount of change in transmittance refers to the amount of change at a wavelength at which the amount of change in the transmittance of the red pixel or the blue pixel in a wavelength range of 400 to 700 nm before and after the heating was the maximum.

5: the maximum value of the amount of change in transmittance was lower than 2%
4: the maximum value of the amount of change in transmittance was 2% or higher and lower than 3%
3: the maximum value of the amount of change in transmittance was 3% or higher and lower than 4%
2: the maximum value of the amount of change in transmittance was 4% or higher and lower than 5%
1: the maximum value of the amount of change in transmittance was 5% or lower

TABLE 14

| | Green Composition Used | Photolithographic Properties | Solvent Resistance | Moisture Resistance | Thermal Diffusivity Resistance |
|---|---|---|---|---|---|
| Test Example 1 | Green Composition 1 | 4 | 5 | 5 | 4 |
| Test Example 2 | Green Composition 2 | 4 | 5 | 4 | 4 |
| Test Example 3 | Green Composition 3 | 4 | 5 | 5 | 4 |
| Test Example 4 | Green Composition 4 | 4 | 5 | 4 | 4 |
| Test Example 5 | Green Composition 5 | 4 | 5 | 4 | 4 |
| Test Example 6 | Green Composition 6 | 4 | 5 | 4 | 4 |
| Test Example 7 | Green Composition 7 | 4 | 5 | 4 | 4 |
| Test Example 8 | Green Composition 8 | 3 | 4 | 4 | 4 |
| Test Example 9 | Green Composition 9 | 4 | 4 | 4 | 4 |
| Test Example 10 | Green Composition 10 | 4 | 5 | 4 | 4 |
| Test Example 11 | Green Composition 11 | 5 | 5 | 5 | 4 |

TABLE 14-continued

| Green Composition Used | Photolithographic Properties | Solvent Resistance | Moisture Resistance | Thermal Diffusivity Resistance |
|---|---|---|---|---|
| Test Example 12 | Green Composition 12 | 4 | 5 | 5 | 4 |
| Test Example 13 | Green Composition 13 | 4 | 5 | 4 | 4 |
| Test Example 14 | Green Composition 14 | 5 | 5 | 5 | 5 |
| Test Example 15 | Green Composition 15 | 4 | 5 | 5 | 4 |
| Test Example 16 | Green Composition 16 | 5 | 5 | 5 | 5 |
| Test Example 17 | Green Composition 17 | 5 | 4 | 5 | 5 |
| Test Example 18 | Green Composition 18 | 5 | 4 | 5 | 5 |
| Test Example 19 | Green Composition 19 | 5 | 4 | 5 | 5 |
| Test Example 20 | Green Composition 20 | 3 | 4 | 4 | 4 |
| Test Example 21 | Green Composition 21 | 5 | 5 | 5 | 4 |
| Test Example 22 | Green Composition 22 | 5 | 5 | 5 | 4 |
| Test Example 23 | Green Composition 23 | 5 | 5 | 5 | 4 |
| Test Example 24 | Green Composition 24 | 4 | 5 | 4 | 4 |
| Test Example 25 | Green Composition 25 | 3 | 5 | 4 | 4 |
| Test Example 26 | Green Composition 26 | 4 | 4 | 3 | 3 |
| Test Example 27 | Green Composition 27 | 3 | 3 | 3 | 3 |
| Test Example 28 | Green Composition 28 | 3 | 5 | 4 | 3 |
| Test Example 29 | Green Composition 29 | 4 | 4 | 3 | 3 |
| Test Example 30 | Green Composition 30 | 3 | 5 | 4 | 4 |
| Test Example R1 | Green Composition R1 | 1 | 1 | 1 | 1 |

As shown in the tables, photolithographic properties, solvent resistance, moisture resistance, and thermal diffusivity resistance were excellent in Test Examples 1 to 30 in which a film was formed by performing pulse exposure using the photosensitive composition (green compositions 1 to 20) including a coloring material, a photoradical polymerization initiator, and a radically polymerizable compound, in which a content of a radically polymerizable compound having a weight-average molecular weight of 3000 or higher was 70 mass % or higher with respect to a total mass of the radically polymerizable compound.

In a case where photolithographic properties, solvent resistance, moisture resistance, and thermal diffusivity resistance of the blue composition 1 and the red composition 1 were evaluated after performing pulse exposure under the above-described condition, excellent results were obtained.

What is claimed is:

1. A photosensitive composition for pulse exposure comprising:
    a coloring material A;
    a photoradical polymerization initiator B; and
    a radically polymerizable compound C,
    wherein a content of a radically polymerizable compound C1 having a weight-average molecular weight of 3000 or higher is 70 mass % or higher with respect to a total mass of the radically polymerizable compound C, and
    the radically polymerizable compound C1 includes a repeating unit having an ethylenically unsaturated bond group at a side chain and a repeating unit having a graft chain.

2. The photosensitive composition according to claim 1, wherein the coloring material A is a pigment.

3. The photosensitive composition according to claim 1, wherein a content of the coloring material A is 50 mass % or higher with respect to a total solid content of the photosensitive composition.

4. The photosensitive composition according to claim 1, wherein a content of the photoradical polymerization initiator B is 2% to 10 mass % with respect to a total solid content of the photosensitive composition.

5. The photosensitive composition according to claim 1, wherein a total content of the coloring material A and the radically polymerizable compound C1 is 80 mass % or higher with respect to a total solid content of the photosensitive composition.

6. The photosensitive composition according to claim 1, wherein a content of the radically polymerizable compound C1 is 60 mass % or higher with respect to a total mass of compounds having a weight-average molecular weight of 3000 or higher in the photosensitive composition, the compounds excluding the coloring material A and the photoradical polymerization initiator B.

7. The photosensitive composition according to claim 1, wherein the radically polymerizable compound C1 has an acid group.

8. The photosensitive composition according to claim 7, wherein an acid value of the radically polymerizable compound C1 is 30 to 150 mgKOH/g.

9. The photosensitive composition according to claim 1, wherein an amount of an ethylenically unsaturated bond group in the radically polymerizable compound C1 is 0.2 to 3.0 mmol/g.

10. The photosensitive composition according to claim 1, wherein a weight-average molecular weight of the radically polymerizable compound C1 is 5000 to 40000.

11. The photosensitive composition according to claim 1, wherein the radically polymerizable compound C1 is a dispersant.

12. The photosensitive composition according to claim 1, wherein the radically polymerizable compound C includes the radically polymerizable compound C1 and a radically polymerizable compound C2 having a molecular weight of lower than 3000, and
    a content of the radically polymerizable compound C1 is 93% to 99.5 mass % with respect to a total content of the radically polymerizable compound C1 and the radically polymerizable compound C2.

13. The photosensitive composition according to claim 1, which is a photosensitive composition for pulse exposure to light having a wavelength of 300 nm or shorter.

14. The photosensitive composition according to claim 1, which is a photosensitive composition for pulse exposure under a condition of a maximum instantaneous illuminance of 50000000 W/m$^2$ or higher.

15. The photosensitive composition according to claim 1, which is a photosensitive composition for a solid-state imaging element.

16. The photosensitive composition according to claim 1, which is a photosensitive composition for a color filter.

\* \* \* \* \*